United States Patent
Kulandai Samy et al.

(10) Patent No.: US 12,013,823 B2
(45) Date of Patent: Jun. 18, 2024

(54) GATEWAY SYSTEM THAT MAPS POINTS INTO A GRAPH SCHEMA

(71) Applicant: Johnson Controls Tyco IP Holdings LLP, Milwaukee, WI (US)

(72) Inventors: Santle Camilus Kulandai Samy, Sunnyvale, CA (US); Chenlu Zhang, Milwaukee, WI (US); Young M. Lee, Old Westbury, NY (US)

(73) Assignee: TYCO FIRE & SECURITY GMBH, Neuhausen am Rheinfall (CH)

( * ) Notice: Subject to any disclaimer, the term of this patent is extended or adjusted under 35 U.S.C. 154(b) by 0 days.

(21) Appl. No.: 17/940,411

(22) Filed: Sep. 8, 2022

(65) Prior Publication Data
US 2024/0095221 A1 Mar. 21, 2024

(51) Int. Cl.
*G06F 16/21* (2019.01)
*G06F 16/901* (2019.01)
*G06F 30/13* (2020.01)

(52) U.S. Cl.
CPC ........ *G06F 16/211* (2019.01); *G06F 16/9027* (2019.01); *G06F 30/13* (2020.01)

(58) Field of Classification Search
CPC ......... G06F 16/21; G06F 16/901; G06F 30/13
See application file for complete search history.

(56) References Cited

U.S. PATENT DOCUMENTS

| | | |
|---|---|---|
| 5,301,109 A | 4/1994 | Landauer et al. |
| 5,446,677 A | 8/1995 | Jensen et al. |
| 5,581,478 A | 12/1996 | Cruse et al. |
| 5,812,962 A | 9/1998 | Kovac |
| 5,960,381 A | 9/1999 | Singers et al. |
| 5,973,662 A | 10/1999 | Singers et al. |
| 6,014,612 A | 1/2000 | Larson et al. |
| 6,031,547 A | 2/2000 | Kennedy |
| 6,134,511 A | 10/2000 | Subbarao |

(Continued)

FOREIGN PATENT DOCUMENTS

| | | |
|---|---|---|
| AU | 2019226217 A1 | 11/2020 |
| AU | 2019226264 A1 | 11/2020 |

(Continued)

OTHER PUBLICATIONS

Oracle® Assets User Guide Release 12 Part No. B31177-Oct. 2, 2007 (Year: 2007).*

(Continued)

*Primary Examiner* — Kuen S Lu
(74) *Attorney, Agent, or Firm* — Foley & Lardner LLP

(57) ABSTRACT

A system located in a building. The system including a processing circuit configured to receive tags describing points of a piece of building equipment, the piece of building equipment connected to the system. The processing circuit configured to map the tags to classes of a schema of a graph data structure. The processing circuit configured to perform clustering to generate clusters of the points. The processing circuit configured to identify, based on the clusters, relationships in the schema of the graph data structure between the tags mapped to the classes of the schema of the graph data structure. The processing circuit configured to communicate data to a second system based at least in part on the tags mapped to the classes and the relationships.

20 Claims, 16 Drawing Sheets

(56) References Cited

U.S. PATENT DOCUMENTS

| | | | |
|---|---|---|---|
| 6,157,943 A | 12/2000 | Meyer | |
| 6,285,966 B1 | 9/2001 | Brown et al. | |
| 6,363,422 B1 | 3/2002 | Hunter et al. | |
| 6,385,510 B1 | 5/2002 | Hoog et al. | |
| 6,389,331 B1 | 5/2002 | Jensen et al. | |
| 6,401,027 B1 | 6/2002 | Xu et al. | |
| 6,437,691 B1 | 8/2002 | Sandelman et al. | |
| 6,477,518 B1 | 11/2002 | Li et al. | |
| 6,487,457 B1 | 11/2002 | Hull et al. | |
| 6,493,755 B1 | 12/2002 | Hansen et al. | |
| 6,577,323 B1 | 6/2003 | Jamieson et al. | |
| 6,626,366 B2 | 9/2003 | Kayahara et al. | |
| 6,646,660 B1 | 11/2003 | Patty | |
| 6,704,016 B1 | 3/2004 | Oliver et al. | |
| 6,732,540 B2 | 5/2004 | Sugihara et al. | |
| 6,764,019 B1 | 7/2004 | Kayahara et al. | |
| 6,782,385 B2 | 8/2004 | Natsumeda et al. | |
| 6,813,532 B2 | 11/2004 | Eryurek et al. | |
| 6,816,811 B2 | 11/2004 | Seem | |
| 6,823,680 B2 | 11/2004 | Jayanth | |
| 6,826,454 B2 | 11/2004 | Sulfstede | |
| 6,865,511 B2 | 3/2005 | Frerichs et al. | |
| 6,925,338 B2 | 8/2005 | Eryurek et al. | |
| 6,986,138 B1 | 1/2006 | Sakaguchi et al. | |
| 7,031,880 B1 | 4/2006 | Seem et al. | |
| 7,401,057 B2 | 7/2008 | Eder | |
| 7,552,467 B2 | 6/2009 | Lindsay | |
| 7,627,544 B2 | 12/2009 | Chkodrov et al. | |
| 7,818,249 B2 | 10/2010 | Lovejoy et al. | |
| 7,889,051 B1 | 2/2011 | Billig et al. | |
| 7,996,488 B1 | 8/2011 | Casabella et al. | |
| 8,078,330 B2 | 12/2011 | Brickfield et al. | |
| 8,104,044 B1 | 1/2012 | Scofield et al. | |
| 8,229,470 B1 | 7/2012 | Ranjan et al. | |
| 8,401,991 B2 | 3/2013 | Wu et al. | |
| 8,495,745 B1 | 7/2013 | Schrecker et al. | |
| 8,516,016 B2 | 8/2013 | Park et al. | |
| 8,532,808 B2 | 9/2013 | Drees et al. | |
| 8,532,839 B2 | 9/2013 | Drees et al. | |
| 8,600,556 B2 | 12/2013 | Nesler et al. | |
| 8,620,909 B1 * | 12/2013 | Rennison | G06F 16/3332 707/723 |
| 8,635,182 B2 | 1/2014 | Mackay | |
| 8,682,921 B2 | 3/2014 | Park et al. | |
| 8,731,724 B2 | 5/2014 | Drees et al. | |
| 8,737,334 B2 | 5/2014 | Ahn et al. | |
| 8,738,334 B2 | 5/2014 | Jiang et al. | |
| 8,751,487 B2 | 6/2014 | Byrne et al. | |
| 8,788,097 B2 | 7/2014 | Drees et al. | |
| 8,805,995 B1 | 8/2014 | Oliver | |
| 8,843,238 B2 | 9/2014 | Wenzel et al. | |
| 8,874,071 B2 | 10/2014 | Sherman et al. | |
| 8,941,465 B2 | 1/2015 | Pineau et al. | |
| 8,990,127 B2 | 3/2015 | Taylor | |
| 9,070,113 B2 | 6/2015 | Shafiee et al. | |
| 9,116,978 B2 | 8/2015 | Park et al. | |
| 9,185,095 B1 | 11/2015 | Moritz et al. | |
| 9,189,527 B2 | 11/2015 | Park et al. | |
| 9,196,009 B2 | 11/2015 | Drees et al. | |
| 9,229,966 B2 | 1/2016 | Aymeloglu et al. | |
| 9,286,582 B2 | 3/2016 | Drees et al. | |
| 9,311,807 B2 | 4/2016 | Schultz et al. | |
| 9,344,751 B1 | 5/2016 | Ream et al. | |
| 9,354,968 B2 | 5/2016 | Wenzel et al. | |
| 9,507,686 B2 | 11/2016 | Horn et al. | |
| 9,524,594 B2 | 12/2016 | Ouyang et al. | |
| 9,558,196 B2 | 1/2017 | Johnston et al. | |
| 9,652,813 B2 | 5/2017 | Gifford et al. | |
| 9,753,455 B2 | 9/2017 | Drees | |
| 9,811,249 B2 | 11/2017 | Chen et al. | |
| 9,838,844 B2 | 12/2017 | Emeis et al. | |
| 9,886,478 B2 | 2/2018 | Mukherjee | |
| 9,948,359 B2 | 4/2018 | Horton | |
| 10,055,114 B2 | 8/2018 | Shah et al. | |
| 10,055,206 B2 | 8/2018 | Park et al. | |
| 10,116,461 B2 | 10/2018 | Fairweather et al. | |
| 10,169,454 B2 | 1/2019 | Ait-Mokhtar et al. | |
| 10,171,297 B2 | 1/2019 | Stewart et al. | |
| 10,171,586 B2 | 1/2019 | Shaashua et al. | |
| 10,187,258 B2 | 1/2019 | Nagesh et al. | |
| 10,514,963 B2 | 12/2019 | Shrivastava et al. | |
| 10,515,098 B2 | 12/2019 | Park et al. | |
| 10,534,326 B2 | 1/2020 | Sridharan et al. | |
| 10,536,295 B2 | 1/2020 | Fairweather et al. | |
| 10,564,993 B2 | 2/2020 | Deutsch et al. | |
| 10,705,492 B2 | 7/2020 | Harvey | |
| 10,708,078 B2 | 7/2020 | Harvey | |
| 10,760,815 B2 | 9/2020 | Janakiraman et al. | |
| 10,762,475 B2 | 9/2020 | Song et al. | |
| 10,824,120 B2 | 11/2020 | Ahmed | |
| 10,831,163 B2 | 11/2020 | Park | |
| 10,845,771 B2 | 11/2020 | Harvey | |
| 10,854,194 B2 | 12/2020 | Park et al. | |
| 10,862,928 B1 | 12/2020 | Badawy et al. | |
| 10,921,760 B2 | 2/2021 | Harvey | |
| 10,921,972 B2 | 2/2021 | Park et al. | |
| 10,969,133 B2 | 4/2021 | Harvey | |
| 10,976,068 B2 | 4/2021 | Hallendy et al. | |
| 10,986,121 B2 | 4/2021 | Stockdale et al. | |
| 11,016,998 B2 | 5/2021 | Park et al. | |
| 11,024,292 B2 | 6/2021 | Park et al. | |
| 11,038,709 B2 | 6/2021 | Park et al. | |
| 11,041,650 B2 | 6/2021 | Li et al. | |
| 11,054,796 B2 | 7/2021 | Holaso | |
| 11,070,390 B2 | 7/2021 | Park et al. | |
| 11,073,976 B2 | 7/2021 | Park et al. | |
| 11,108,587 B2 | 8/2021 | Park et al. | |
| 11,113,295 B2 | 9/2021 | Park et al. | |
| 11,229,138 B1 | 1/2022 | Harvey et al. | |
| 11,314,726 B2 | 4/2022 | Park et al. | |
| 11,314,788 B2 | 4/2022 | Park et al. | |
| 11,556,105 B2 | 1/2023 | Cooley et al. | |
| 11,561,522 B2 | 1/2023 | Cooley et al. | |
| 11,561,523 B2 | 1/2023 | Cooley et al. | |
| 11,573,551 B2 | 2/2023 | Cooley et al. | |
| 11,586,167 B2 | 2/2023 | Cooley et al. | |
| 2002/0010562 A1 | 1/2002 | Schleiss et al. | |
| 2002/0016639 A1 | 2/2002 | Smith et al. | |
| 2002/0059229 A1 | 5/2002 | Natsumeda et al. | |
| 2002/0123864 A1 | 9/2002 | Eryurek et al. | |
| 2002/0147506 A1 | 10/2002 | Eryurek et al. | |
| 2002/0177909 A1 | 11/2002 | Fu et al. | |
| 2003/0005486 A1 | 1/2003 | Ridolfo et al. | |
| 2003/0014130 A1 | 1/2003 | Grumelart | |
| 2003/0073432 A1 | 4/2003 | Meade, II | |
| 2003/0158704 A1 | 8/2003 | Triginai et al. | |
| 2003/0171851 A1 | 9/2003 | Brickfield et al. | |
| 2003/0200059 A1 | 10/2003 | Ignatowski et al. | |
| 2004/0068390 A1 | 4/2004 | Saunders | |
| 2004/0128314 A1 | 7/2004 | Katibah et al. | |
| 2004/0133314 A1 | 7/2004 | Ehlers et al. | |
| 2004/0199360 A1 | 10/2004 | Friman et al. | |
| 2005/0055308 A1 | 3/2005 | Meyer et al. | |
| 2005/0108262 A1 | 5/2005 | Fawcett et al. | |
| 2005/0154494 A1 | 7/2005 | Ahmed | |
| 2005/0278703 A1 | 12/2005 | Lo et al. | |
| 2005/0283337 A1 | 12/2005 | Sayal | |
| 2006/0095521 A1 | 5/2006 | Patinkin | |
| 2006/0140207 A1 | 6/2006 | Eschbach et al. | |
| 2006/0184479 A1 | 8/2006 | Levine | |
| 2006/0200476 A1 | 9/2006 | Gottumukkala et al. | |
| 2006/0265751 A1 | 11/2006 | Cosquer et al. | |
| 2006/0271589 A1 | 11/2006 | Horowitz et al. | |
| 2007/0028179 A1 | 2/2007 | Levin et al. | |
| 2007/0203693 A1 | 8/2007 | Estes | |
| 2007/0261062 A1 | 11/2007 | Bansal et al. | |
| 2007/0273497 A1 | 11/2007 | Kuroda et al. | |
| 2007/0273610 A1 | 11/2007 | Baillot | |
| 2008/0034425 A1 | 2/2008 | Overcash et al. | |
| 2008/0094230 A1 | 4/2008 | Mock et al. | |
| 2008/0097816 A1 | 4/2008 | Freire et al. | |
| 2008/0186160 A1 | 8/2008 | Kim et al. | |
| 2008/0249756 A1 | 10/2008 | Chaisuparasmikul | |
| 2008/0252723 A1 | 10/2008 | Park | |

(56) References Cited

U.S. PATENT DOCUMENTS

| | | |
|---|---|---|
| 2008/0281472 A1 | 11/2008 | Podgorny et al. |
| 2009/0195349 A1 | 8/2009 | Frader-Thompson et al. |
| 2010/0045439 A1 | 2/2010 | Tak et al. |
| 2010/0058248 A1 | 3/2010 | Park |
| 2010/0131533 A1 | 5/2010 | Ortiz |
| 2010/0274366 A1 | 10/2010 | Fata et al. |
| 2010/0281387 A1 | 11/2010 | Holland et al. |
| 2010/0286937 A1 | 11/2010 | Hedley et al. |
| 2010/0324962 A1 | 12/2010 | Nesler et al. |
| 2011/0015802 A1 | 1/2011 | Imes |
| 2011/0047418 A1 | 2/2011 | Drees et al. |
| 2011/0061015 A1 | 3/2011 | Drees et al. |
| 2011/0071685 A1 | 3/2011 | Huneycutt et al. |
| 2011/0077950 A1 | 3/2011 | Hughston |
| 2011/0087650 A1 | 4/2011 | Mackay et al. |
| 2011/0087988 A1 | 4/2011 | Ray et al. |
| 2011/0088000 A1 | 4/2011 | Mackay |
| 2011/0099142 A1* | 4/2011 | Karjalainen ...... H04M 1/72448 707/600 |
| 2011/0125737 A1 | 5/2011 | Pothering et al. |
| 2011/0137853 A1 | 6/2011 | Mackay |
| 2011/0153603 A1 | 6/2011 | Adiba et al. |
| 2011/0154363 A1 | 6/2011 | Karmarkar |
| 2011/0157357 A1 | 6/2011 | Weisensale et al. |
| 2011/0178977 A1 | 7/2011 | Drees |
| 2011/0191343 A1 | 8/2011 | Heaton et al. |
| 2011/0205022 A1 | 8/2011 | Cavallaro et al. |
| 2011/0218777 A1 | 9/2011 | Chen et al. |
| 2012/0011126 A1 | 1/2012 | Park et al. |
| 2012/0011141 A1 | 1/2012 | Park et al. |
| 2012/0022698 A1 | 1/2012 | Mackay |
| 2012/0062577 A1 | 3/2012 | Nixon |
| 2012/0064923 A1 | 3/2012 | Imes et al. |
| 2012/0083930 A1 | 4/2012 | Ilic et al. |
| 2012/0100825 A1 | 4/2012 | Sherman et al. |
| 2012/0101637 A1 | 4/2012 | Imes et al. |
| 2012/0135759 A1 | 5/2012 | Imes et al. |
| 2012/0136485 A1 | 5/2012 | Weber et al. |
| 2012/0158633 A1 | 6/2012 | Eder |
| 2012/0259583 A1 | 10/2012 | Noboa et al. |
| 2012/0272228 A1 | 10/2012 | Marndi et al. |
| 2012/0278051 A1 | 11/2012 | Jiang et al. |
| 2013/0007063 A1 | 1/2013 | Kalra et al. |
| 2013/0038430 A1 | 2/2013 | Blower et al. |
| 2013/0038707 A1 | 2/2013 | Cunningham et al. |
| 2013/0060820 A1 | 3/2013 | Bulusu et al. |
| 2013/0080457 A1* | 3/2013 | Narayanan ........... H04W 4/021 707/758 |
| 2013/0086497 A1 | 4/2013 | Ambuhl et al. |
| 2013/0097706 A1 | 4/2013 | Titonis et al. |
| 2013/0103221 A1 | 4/2013 | Raman et al. |
| 2013/0167035 A1 | 6/2013 | Imes et al. |
| 2013/0170710 A1 | 7/2013 | Kuoch et al. |
| 2013/0204836 A1 | 8/2013 | Choi et al. |
| 2013/0246916 A1 | 9/2013 | Reimann et al. |
| 2013/0247205 A1 | 9/2013 | Schrecker et al. |
| 2013/0262035 A1 | 10/2013 | Mills |
| 2013/0275174 A1 | 10/2013 | Bennett et al. |
| 2013/0275908 A1 | 10/2013 | Reichard |
| 2013/0297050 A1 | 11/2013 | Reichard et al. |
| 2013/0298244 A1 | 11/2013 | Kumar et al. |
| 2013/0331995 A1 | 12/2013 | Rosen |
| 2013/0338970 A1 | 12/2013 | Reghetti |
| 2013/0339404 A1 | 12/2013 | Chao et al. |
| 2014/0032506 A1 | 1/2014 | Hoey et al. |
| 2014/0059483 A1 | 2/2014 | Mairs et al. |
| 2014/0081652 A1 | 3/2014 | Klindworth |
| 2014/0135952 A1 | 5/2014 | Maehara |
| 2014/0152651 A1 | 6/2014 | Chen et al. |
| 2014/0172184 A1 | 6/2014 | Schmidt et al. |
| 2014/0189861 A1 | 7/2014 | Gupta et al. |
| 2014/0207282 A1 | 7/2014 | Angle et al. |
| 2014/0214801 A1* | 7/2014 | Ciliberti, III ......... G06F 16/284 707/738 |
| 2014/0258052 A1 | 9/2014 | Khuti et al. |
| 2014/0269614 A1 | 9/2014 | Maguire et al. |
| 2014/0277765 A1 | 9/2014 | Karimi et al. |
| 2014/0278461 A1 | 9/2014 | Artz |
| 2014/0327555 A1 | 11/2014 | Sager et al. |
| 2015/0019174 A1 | 1/2015 | Kiff et al. |
| 2015/0042240 A1 | 2/2015 | Aggarwal et al. |
| 2015/0105917 A1 | 4/2015 | Sasaki et al. |
| 2015/0145468 A1 | 5/2015 | Ma et al. |
| 2015/0156031 A1 | 6/2015 | Fadell et al. |
| 2015/0168931 A1 | 6/2015 | Jin |
| 2015/0172300 A1 | 6/2015 | Cochenour |
| 2015/0178421 A1 | 6/2015 | Borrelli et al. |
| 2015/0185261 A1 | 7/2015 | Frader-Thompson et al. |
| 2015/0186777 A1 | 7/2015 | Lecue et al. |
| 2015/0202962 A1 | 7/2015 | Habashima et al. |
| 2015/0204563 A1 | 7/2015 | Imes et al. |
| 2015/0235267 A1 | 8/2015 | Steube et al. |
| 2015/0241895 A1 | 8/2015 | Lu et al. |
| 2015/0244730 A1 | 8/2015 | Vu et al. |
| 2015/0244732 A1 | 8/2015 | Golshan et al. |
| 2015/0261863 A1 | 9/2015 | Dey et al. |
| 2015/0263900 A1 | 9/2015 | Polyakov et al. |
| 2015/0286969 A1 | 10/2015 | Warner et al. |
| 2015/0295796 A1 | 10/2015 | Hsiao et al. |
| 2015/0304193 A1 | 10/2015 | Ishii et al. |
| 2015/0316918 A1 | 11/2015 | Schleiss et al. |
| 2015/0324422 A1 | 11/2015 | Elder |
| 2015/0341212 A1 | 11/2015 | Hsiao et al. |
| 2015/0348417 A1 | 12/2015 | Ignaczak et al. |
| 2015/0379080 A1 | 12/2015 | Jochimski |
| 2016/0011753 A1 | 1/2016 | McFarland et al. |
| 2016/0033946 A1 | 2/2016 | Zhu et al. |
| 2016/0035246 A1 | 2/2016 | Curtis |
| 2016/0065601 A1 | 3/2016 | Gong et al. |
| 2016/0070736 A1 | 3/2016 | Swan et al. |
| 2016/0078229 A1 | 3/2016 | Gong et al. |
| 2016/0090839 A1 | 3/2016 | Stolarczyk |
| 2016/0119434 A1 | 4/2016 | Dong et al. |
| 2016/0127712 A1 | 5/2016 | Alfredsson et al. |
| 2016/0139752 A1 | 5/2016 | Shim et al. |
| 2016/0163186 A1 | 6/2016 | Davidson et al. |
| 2016/0170390 A1 | 6/2016 | Xie et al. |
| 2016/0171862 A1 | 6/2016 | Das et al. |
| 2016/0173816 A1 | 6/2016 | Huenerfauth et al. |
| 2016/0179315 A1 | 6/2016 | Sarao et al. |
| 2016/0179342 A1 | 6/2016 | Sarao et al. |
| 2016/0179990 A1 | 6/2016 | Sarao et al. |
| 2016/0195856 A1 | 7/2016 | Spero |
| 2016/0212165 A1 | 7/2016 | Singla et al. |
| 2016/0239660 A1 | 8/2016 | Azvine et al. |
| 2016/0239756 A1 | 8/2016 | Aggour et al. |
| 2016/0247129 A1 | 8/2016 | Song et al. |
| 2016/0260063 A1 | 9/2016 | Harris et al. |
| 2016/0313751 A1 | 10/2016 | Risbeck et al. |
| 2016/0313752 A1 | 10/2016 | Przybylski |
| 2016/0313902 A1 | 10/2016 | Hill et al. |
| 2016/0350364 A1 | 12/2016 | Anicic et al. |
| 2016/0357521 A1 | 12/2016 | Zhang et al. |
| 2016/0357828 A1 | 12/2016 | Tobin et al. |
| 2016/0358432 A1 | 12/2016 | Branscomb et al. |
| 2016/0363336 A1 | 12/2016 | Roth et al. |
| 2016/0370258 A1 | 12/2016 | Perez |
| 2016/0378306 A1 | 12/2016 | Kresl et al. |
| 2016/0379326 A1 | 12/2016 | Chan-Gove et al. |
| 2017/0006135 A1 | 1/2017 | Siebel |
| 2017/0011318 A1 | 1/2017 | Vigano et al. |
| 2017/0017221 A1 | 1/2017 | Lamparter et al. |
| 2017/0039255 A1 | 2/2017 | Raj et al. |
| 2017/0052536 A1 | 2/2017 | Warner et al. |
| 2017/0053441 A1 | 2/2017 | Nadumane et al. |
| 2017/0063894 A1 | 3/2017 | Muddu et al. |
| 2017/0068409 A1 | 3/2017 | Nair |
| 2017/0070775 A1 | 3/2017 | Taxier et al. |
| 2017/0075984 A1 | 3/2017 | Deshpande et al. |
| 2017/0084168 A1 | 3/2017 | Janchookiat |
| 2017/0090437 A1 | 3/2017 | Veeramani et al. |
| 2017/0093700 A1 | 3/2017 | Gilley et al. |
| 2017/0098086 A1 | 4/2017 | Hoernecke et al. |
| 2017/0103327 A1 | 4/2017 | Penilla et al. |

(56) References Cited

U.S. PATENT DOCUMENTS

| | | |
|---|---|---|
| 2017/0103403 A1 | 4/2017 | Chu et al. |
| 2017/0123389 A1 | 5/2017 | Baez et al. |
| 2017/0134415 A1 | 5/2017 | Muddu et al. |
| 2017/0177715 A1 | 6/2017 | Chang et al. |
| 2017/0180147 A1 | 6/2017 | Brandman et al. |
| 2017/0188216 A1 | 6/2017 | Koskas et al. |
| 2017/0212482 A1 | 7/2017 | Boettcher et al. |
| 2017/0212668 A1 | 7/2017 | Shah et al. |
| 2017/0220641 A1 | 8/2017 | Chi et al. |
| 2017/0230930 A1 | 8/2017 | Frey |
| 2017/0235817 A1 | 8/2017 | Deodhar et al. |
| 2017/0251182 A1 | 8/2017 | Siminoff et al. |
| 2017/0270124 A1 | 9/2017 | Nagano et al. |
| 2017/0277769 A1 | 9/2017 | Pasupathy et al. |
| 2017/0278003 A1 | 9/2017 | Liu |
| 2017/0294132 A1 | 10/2017 | Colmenares |
| 2017/0315522 A1 | 11/2017 | Kwon et al. |
| 2017/0315697 A1 | 11/2017 | Jacobson et al. |
| 2017/0322534 A1 | 11/2017 | Sinha et al. |
| 2017/0323389 A1 | 11/2017 | Vavrasek |
| 2017/0329289 A1 | 11/2017 | Kohn et al. |
| 2017/0336770 A1 | 11/2017 | MacMillan |
| 2017/0345287 A1 | 11/2017 | Fuller et al. |
| 2017/0351957 A1 | 12/2017 | Lecue et al. |
| 2017/0357225 A1 | 12/2017 | Asp et al. |
| 2017/0357490 A1 | 12/2017 | Park et al. |
| 2017/0357908 A1 | 12/2017 | Cabadi et al. |
| 2018/0005309 A1 | 1/2018 | Croy et al. |
| 2018/0012159 A1 | 1/2018 | Kozloski et al. |
| 2018/0013579 A1 | 1/2018 | Fairweather et al. |
| 2018/0024520 A1 | 1/2018 | Sinha et al. |
| 2018/0039238 A1 | 2/2018 | Gaertner et al. |
| 2018/0048485 A1 | 2/2018 | Pelton et al. |
| 2018/0069932 A1 | 3/2018 | Tiwari et al. |
| 2018/0084012 A1* | 3/2018 | Joseph ................. H04L 63/108 |
| 2018/0114140 A1 | 4/2018 | Chen et al. |
| 2018/0137288 A1 | 5/2018 | Polyakov |
| 2018/0157930 A1 | 6/2018 | Rutschman et al. |
| 2018/0162400 A1 | 6/2018 | Abdar |
| 2018/0176241 A1 | 6/2018 | Manadhata et al. |
| 2018/0198627 A1 | 7/2018 | Mullins |
| 2018/0203961 A1 | 7/2018 | Aisu et al. |
| 2018/0239982 A1 | 8/2018 | Rutschman et al. |
| 2018/0275625 A1 | 9/2018 | Park et al. |
| 2018/0276962 A1 | 9/2018 | Butler et al. |
| 2018/0292797 A1 | 10/2018 | Lamparter et al. |
| 2018/0336785 A1 | 11/2018 | Ghannam et al. |
| 2018/0356775 A1 | 12/2018 | Harvey |
| 2018/0359111 A1 | 12/2018 | Harvey |
| 2018/0364654 A1 | 12/2018 | Locke et al. |
| 2019/0005025 A1 | 1/2019 | Malabarba |
| 2019/0013023 A1 | 1/2019 | Pourmohammad et al. |
| 2019/0025771 A1 | 1/2019 | Park et al. |
| 2019/0037135 A1 | 1/2019 | Hedge |
| 2019/0042988 A1 | 2/2019 | Brown et al. |
| 2019/0088106 A1 | 3/2019 | Grundstrom |
| 2019/0094824 A1 | 3/2019 | Xie et al. |
| 2019/0096217 A1 | 3/2019 | Pourmohammad et al. |
| 2019/0102840 A1 | 4/2019 | Perl et al. |
| 2019/0121801 A1 | 4/2019 | Jethwa et al. |
| 2019/0138512 A1 | 5/2019 | Pourmohammad et al. |
| 2019/0147883 A1 | 5/2019 | Mellenthin et al. |
| 2019/0158309 A1 | 5/2019 | Park et al. |
| 2019/0163152 A1 | 5/2019 | Worrall et al. |
| 2019/0197759 A1* | 6/2019 | Huang ................. G06T 15/005 |
| 2019/0268178 A1 | 8/2019 | Fairweather et al. |
| 2019/0294673 A1 | 9/2019 | Sapugay et al. |
| 2019/0310979 A1 | 10/2019 | Masuzaki et al. |
| 2019/0377306 A1 | 12/2019 | Harvey |
| 2020/0125043 A1 | 4/2020 | Park |
| 2020/0133978 A1* | 4/2020 | Ramamurti ................. G06F 8/38 |
| 2020/0226156 A1 | 7/2020 | Borra et al. |
| 2020/0285203 A1 | 9/2020 | Thakur et al. |
| 2020/0336328 A1 | 10/2020 | Harvey |
| 2020/0348632 A1 | 11/2020 | Harvey |
| 2020/0387576 A1 | 12/2020 | Brett et al. |
| 2020/0396208 A1 | 12/2020 | Brett et al. |
| 2021/0042299 A1 | 2/2021 | Migliori |
| 2021/0043221 A1 | 2/2021 | Yelchuru et al. |
| 2021/0191826 A1 | 6/2021 | Duraisingh et al. |
| 2021/0200807 A1 | 7/2021 | Ploegert et al. |
| 2021/0325070 A1 | 10/2021 | Endel et al. |
| 2021/0342961 A1 | 11/2021 | Winter et al. |
| 2021/0373509 A1 | 12/2021 | Borah et al. |
| 2021/0373510 A1 | 12/2021 | Borah et al. |
| 2021/0381711 A1 | 12/2021 | Harvey et al. |
| 2021/0381712 A1 | 12/2021 | Harvey et al. |
| 2021/0382445 A1 | 12/2021 | Harvey et al. |
| 2021/0382861 A1 | 12/2021 | Jin et al. |
| 2021/0383041 A1 | 12/2021 | Harvey et al. |
| 2021/0383042 A1 | 12/2021 | Harvey et al. |
| 2021/0383200 A1 | 12/2021 | Harvey et al. |
| 2021/0383219 A1 | 12/2021 | Harvey et al. |
| 2021/0383235 A1 | 12/2021 | Harvey et al. |
| 2021/0383236 A1 | 12/2021 | Harvey et al. |
| 2022/0066402 A1 | 3/2022 | Harvey et al. |
| 2022/0066405 A1 | 3/2022 | Harvey |
| 2022/0066432 A1 | 3/2022 | Harvey et al. |
| 2022/0066434 A1 | 3/2022 | Harvey et al. |
| 2022/0066528 A1 | 3/2022 | Harvey et al. |
| 2022/0066722 A1 | 3/2022 | Harvey et al. |
| 2022/0066754 A1 | 3/2022 | Harvey et al. |
| 2022/0066761 A1 | 3/2022 | Harvey et al. |
| 2022/0067226 A1 | 3/2022 | Harvey et al. |
| 2022/0067227 A1 | 3/2022 | Harvey et al. |
| 2022/0067230 A1 | 3/2022 | Harvey et al. |
| 2022/0069863 A1 | 3/2022 | Harvey et al. |
| 2022/0070293 A1 | 3/2022 | Harvey et al. |
| 2022/0092500 A1 | 3/2022 | Drees et al. |
| 2022/0121965 A1 | 4/2022 | Chatterji et al. |
| 2022/0138684 A1 | 5/2022 | Harvey |
| 2022/0147000 A1 | 5/2022 | Cooley et al. |
| 2022/0150124 A1 | 5/2022 | Cooley et al. |
| 2022/0198095 A1* | 6/2022 | Bandara ................. G06F 30/20 |
| 2022/0215264 A1 | 7/2022 | Harvey et al. |
| 2023/0010757 A1 | 1/2023 | Preciado |
| 2023/0071312 A1 | 3/2023 | Preciado et al. |
| 2023/0076011 A1 | 3/2023 | Preciado et al. |
| 2023/0083703 A1 | 3/2023 | Meiners |
| 2023/0283987 A1 | 9/2023 | Cheng et al. |

FOREIGN PATENT DOCUMENTS

| | | |
|---|---|---|
| CN | 101415011 A | 4/2009 |
| CN | 102136099 A | 7/2011 |
| CN | 102136100 A | 7/2011 |
| CN | 102650876 A | 8/2012 |
| CN | 104040583 A | 9/2014 |
| CN | 104603832 A | 5/2015 |
| CN | 104919484 A | 9/2015 |
| CN | 106204392 A | 12/2016 |
| CN | 106406806 A | 2/2017 |
| CN | 106960269 A | 7/2017 |
| CN | 107147639 A1 | 9/2017 |
| CN | 107598928 A | 1/2018 |
| EP | 2 528 033 A1 | 11/2012 |
| EP | 3 268 821 B1 | 1/2018 |
| EP | 3 324 306 A1 | 5/2018 |
| EP | 4 226 263 A1 | 8/2023 |
| JP | H10-049552 A | 2/1998 |
| JP | 2003-162573 A | 6/2003 |
| JP | 2007-018322 A | 1/2007 |
| JP | 4073946 B1 | 4/2008 |
| JP | 2008-107930 A | 5/2008 |
| JP | 2013-152618 A | 8/2013 |
| JP | 2014-044457 A | 3/2014 |
| KR | 2016/0102923 A | 8/2016 |
| WO | WO-2009/020158 A1 | 2/2009 |
| WO | WO-2011/100255 A2 | 8/2011 |
| WO | WO-2013/050333 A1 | 4/2013 |
| WO | WO-2015/106702 A1 | 7/2015 |
| WO | WO-2015/145648 A1 | 10/2015 |
| WO | WO-2017/035536 A1 | 3/2017 |
| WO | WO-2017/192422 A1 | 11/2017 |

(56) References Cited

FOREIGN PATENT DOCUMENTS

| | | | |
|---|---|---|---|
| WO | WO-2017/194244 A1 | 11/2017 | |
| WO | WO-2017/205330 A1 | 11/2017 | |
| WO | WO-2017/213918 A1 | 12/2017 | |
| WO | WO-2018/132112 A1 | 7/2018 | |
| WO | WO-2020/061621 A1 | 4/2020 | |
| WO | WO-2022/042925 A1 | 3/2022 | |
| WO | WO-2022/103812 A1 | 5/2022 | |
| WO | WO-2022/103813 A1 | 5/2022 | |
| WO | WO-2022/103820 A1 | 5/2022 | |
| WO | WO-2022/103822 A1 | 5/2022 | |
| WO | WO-2022/103824 A1 | 5/2022 | |
| WO | WO-2022/103829 A1 | 5/2022 | |
| WO | WO-2022/103831 A1 | 5/2022 | |

OTHER PUBLICATIONS

U.S. Appl. No. 17/566,029, Passivelogic, Inc.
U.S. Appl. No. 17/567,275, Passivelogic, Inc.
U.S. Appl. No. 17/722,115, Passivelogic, Inc.
Balaji et al, "Brick: Metadata schema for portable smart building applications," Applied Energy, 2018 (20 pages).
Balaji et al, "Brick: Metadata schema for portable smart building applications," Applied Energy, Sep. 15, 2018, 3 pages, (Abstract).
Balaji et al, "Demo Abstract: Portable Queries Using the Brick Schema for Building Applications," BuildSys '16, Palo Alto, CA, USA, Nov. 16-17, 2016 (2 pages).
Balaji, B et al., "Brick: Towards a Unified Metadata Schema For Buildings." BuildSys '16, Palo Alto, CA, USA, Nov. 16-17, 2016 (10 pages).
Bhattacharya et al., "Short Paper: Analyzing Metadata Schemas for Buildings—The Good, The Bad and The Ugly," BuildSys '15, Seoul, South Korea, Nov. 4-5, 2015 (4 pages).
Bhattacharya, A., "Enabling Scalable Smart-Building Analytics," Electrical Engineering and Computer Sciences, University of California at Berkeley, Technical Report No. UCB/EECS-2016-201, Dec. 15, 2016 (121 pages).
Brick, "Brick Schema: Building Blocks for Smart Buildings," URL: chrome-extension://efaidnbmnnnibpcajpcglclefindmkaj/https://www.memoori.com/wp-content/uploads/2016/06/Brick_Schema_Whitepaper.pdf, Mar. 2019 (17 pages).
Brick, "Brick: Towards a Unified Metadata Schema For Buildings," URL: chrome-extension://efaidnbmnnnibpcajpcglclefindmkaj/https://brickschema.org/papers/Brick_BuildSys_Presentation.pdf, Presented at BuildSys '16, Nov. 2016 (46 pages).
Brick, "Metadata Schema for Buildings," URL: https://brickschema.org/docs/Brick-Leaflet.pdf, retrieved from internet Dec. 24, 2019 (3 pages).
Chinese Office Action on CN Appl. No. 201780003995.9 dated Apr. 8, 2021 (21 pages with English language translation).
Chinese Office action on CN Appl. No. 201780043400.2 dated Apr. 25, 2021 (15 pages with English language translation).
Curry, E. et al., "Linking building data in the cloud: Integrating cross-domain building data using linked data." Advanced Engineering Informatics, 2013, 27 (pp. 206-219).
Digital Platform Litigation Documents Part 1, includes cover letter, dismissal of case DDE-1-21-cv-01796, IPR2023-00022 (documents filed Jan. 26, 2023-Oct. 7, 2022), and IPR2023-00085 (documents filed Jan. 26, 2023-Oct. 20, 2022) (748 pages total).
Digital Platform Litigation Documents Part 10, includes DDE-1-21-cv-01796 (documents filed Nov. 1, 2022-Dec. 22, 2021 (1795 pages total).
Digital Platform Litigation Documents Part 2, includes IPR2023-00085 (documents filed Oct. 20, 2022) (172 pages total).
Digital Platform Litigation Documents Part 3, includes IPR2023-00085 (documents filed Oct. 20, 2022) and IPR2023-00170 (documents filed Nov. 28, 2022-Nov. 7, 2022) (397 pages total).
Digital Platform Litigation Documents Part 4, includes IPR2023-00170 (documents filed Nov. 7, 2022) and IPR2023-00217 (documents filed Jan. 18, 2023-Nov. 15, 2022) (434 pages total).
Digital Platform Litigation Documents Part 5, includes IPR2023-00217 (documents filed Nov. 15, 2022) and IPR2023-00257 (documents filed Jan. 25, 2023-Nov. 23, 2022) (316 pages total).
Digital Platform Litigation Documents Part 6, includes IPR2023-00257 (documents filed Nov. 23, 2022) and IPR 2023-00346 (documents filed Jan. 3, 2022-Dec. 13, 2022) (295 pages total).
Digital Platform Litigation Documents Part 7, includes IPR 2023-00346 (documents filed Dec. 13, 2022) and IPR2023-00347 (documents filed Jan. 3, 2023-Dec. 13, 2022) (217 pages total).
Digital Platform Litigation Documents Part 8, includes IPR2023-00347 (documents filed Dec. 13, 2022), EDTX-2-22-cv-00243 (documents filed Sep. 20, 2022-Jun. 29, 2022), and DDE-1-21-cv-01796 (documents filed Feb. 3, 2023-Jan. 10, 2023 (480 pages total).
Digital Platform Litigation Documents Part 9, includes DDE-1-21-cv-01796 (documents filed Jan. 10, 2023-Nov. 1, 2022 (203 pages total).
El Kaed, C. et al., "Building management insights driven by a multi-system semantic representation approach," 2016 IEEE 3rd World Forum on Internet of Things (WF-IoT), Dec. 12-14, 2016, (pp. 520-525).
Ellis, C. et al., "Creating a room connectivity graph of a building from per-room sensor units." BuildSys '12, Toronto, ON, Canada, Nov. 6, 2012 (7 pages).
Extended European Search Report on EP Application No. 18196948.6 dated Apr. 10, 2019 (9 pages).
Fierro et al., "Beyond a House of Sticks: Formalizing Metadata Tags with Brick," BuildSys '19, New York, NY, USA, Nov. 13-14, 2019 (10 pages).
Fierro et al., "Dataset: An Open Dataset and Collection Tool for BMS Point Labels," DATA'19, New York, NY, USA, Nov. 10, 2019 (3 pages).
Fierro et al., "Design and Analysis of a Query Processor for Brick," ACM Transactions on Sensor Networks, Jan. 2018, vol. 1, No. 1, art. 1 (25 pages).
Fierro et al., "Design and Analysis of a Query Processor for Brick," BuildSys '17, Delft, Netherlands, Nov. 8-9, 2017 (10 pages).
Fierro et al., "Mortar: An Open Testbed for Portable Building Analytics," BuildSys '18, Shenzhen, China, Nov. 7-8, 2018 (10 pages).
Fierro et al., "Why Brick is a Game Changer for Smart Buildings," URL: https://brickschema.org/papers/Brick_Memoori_Webinar_Presentation.pdf, Memoori Webinar, 2019 (67 pages).
Fierro, "Writing Portable Building Analytics with the Brick Metadata Schema," UC Berkeley, ACM E-Energy, 2019 (39 pages).
Fierro, G., "Design of an Effective Ontology and Query Processor Enabling Portable Building Applications," Electrical Engineering and Computer Sciences, University of California at Berkeley, Technical Report No. UCB/EECS-2019-106, Jun. 27, 2019 (118 pages).
File History for U.S. Appl. No. 12/776,159, filed May 7, 2010 (722 pages).
Final Conference Program, ACM BuildSys 2016, Stanford, CA, USA, Nov. 15-17, 2016 (7 pages).
Gao et al., "A large-scale evaluation of automated metadata inference approaches on sensors from air handling units," Advanced Engineering Informatics, 2018, 37 (pp. 14-30).
Harvey, T., "Quantum Part 3: The Tools of Autonomy, How PassiveLogic's Quantum Creator and Autonomy Studio software works," URL: https://www.automatedbuildings.com/news/jan22/articles/passive/211224010000passive.html, Jan. 2022 (7 pages).
Harvey, T., "Quantum: The Digital Twin Standard for Buildings," URL: https://www.automatedbuildings.com/news/feb21/articles/passivelogic/210127124501passivelogic.html, Feb. 2021 (6 pages).
Hu, S. et al., "Building performance optimisation: A hybrid architecture for the integration of contextual information and time-series data," Automation in Construction, 2016, 70 (pp. 51-61).
International Search Report and Written Opinion for PCT Appl. Ser. No. PCT/US2017/013831 dated Mar. 31, 2017 (14 pages).
International Search Report and Written Opinion for PCT Appl. Ser. No. PCT/US2017/035524 dated Jul. 24, 2017 (14 pages).
International Search Report and Written Opinion on PCT/US2017/052060, dated Oct. 5, 2017, 11 pages.

(56) References Cited

OTHER PUBLICATIONS

International Search Report and Written Opinion on PCT/US2017/052633, dated Oct. 23, 2017, 9 pages.
International Search Report and Written Opinion on PCT/US2017/052829, dated Nov. 27, 2017, 24 pages.
International Search Report and Written Opinion on PCT/US2018/024068, dated Jun. 15, 2018, 22 pages.
International Search Report and Written Opinion on PCT/US2018/052971, dated Mar. 1, 2019, 19 pages.
International Search Report and Written Opinion on PCT/US2018/052974, dated Dec. 19, 2018, 13 pages.
International Search Report and Written Opinion on PCT/US2018/052975, dated Jan. 2, 2019, 13 pages.
International Search Report and Written Opinion on PCT/US2018/052994, dated Jan. 7, 2019, 15 pages.
International Search Report and Written Opinion on PCT/US2019/015481, dated May 17, 2019, 78 pages.
International Search Report and Written Opinion on PCT/US2020/058381, dated Jan. 27, 2021, 30 pages.
Japanese Office Action on JP Appl. No. 2018-534963 dated May 11, 2021 (16 pages with English language translation).
Koh et al., "Plaster: An Integration, Benchmark, and Development Framework for Metadata Normalization Methods," BuildSys '18, Shenzhen, China, Nov. 7-8, 2018 (10 pages).
Koh et al., "Who can Access What, and When?" BuildSys '19, New York, NY, USA, Nov. 13-14, 2019 (4 pages).
Li et al., "Event Stream Processing with Out-of-Order Data Arrival," International Conferences on Distributed Computing Systems, 2007, (8 pages).
Nissin Electric Co., Ltd., "Smart power supply system (SPSS)," Outline of the scale verification plan, Nissin Electric Technical Report, Japan, Apr. 23, 2014, vol. 59, No. 1 (23 pages).
Passivelogic, "Explorer: Digital Twin Standard for Autonomous Systems. Made interactive." URL: https://passivelogic.com/software/quantum-explorer/, retrieved from internet Jan. 4, 2023 (13 pages).
Passivelogic, "Quantum: The Digital Twin Standard for Autonomous Systems, A physics-based ontology for next-generation control and AI." URL: https://passivelogic.com/software/quantum-standard/, retrieved from internet Jan. 4, 2023 (20 pages).
Quantum Alliance, "Quantum Explorer Walkthrough," 2022, (7 pages) (screenshots from video).
Results of the Partial International Search for PCT/US2018/052971, dated Jan. 3, 2019, 3 pages.
Sinha, Sudhi and Al Huraimel, Khaled, "Reimagining Businesses with AI" John Wiley & Sons, Inc., Hoboken, NJ, USA, 2021 (156 pages).
Sinha, Sudhi R. and Park, Youngchoon, "Building an Effective IoT Ecosystem for Your Business," Johnson Controls International, Springer International Publishing, 2017 (286 pages).
Sinha, Sudhi, "Making Big Data Work For Your Business: A guide to effective Big Data analytics," Impackt Publishing LTD., Birmingham, UK, Oct. 2014 (170 pages).
The Virtual Nuclear Tourist, "Calvert Cliffs Nuclear Power Plant," URL: http://www.nucleartourist.com/us/calvert.htm, Jan. 11, 2006 (2 pages).
University of California At Berkeley, EECS Department, "Enabling Scalable Smart- Building Analytics," URL: https://www2.eecs.berkeley.edu/Pubs/TechRpts/2016/EECS-2016-201.html, retrieved from internet Feb. 15, 2022 (7 pages).
Van Hoof, Bert, "Announcing Azure Digital Twins: Create digital replicas of spaces and infrastructure using cloud, AI and IoT," URL: https://azure.microsoft.com/en-us/blog/announcing-azure-digital-twins-create-digital-replicas-of-spaces-and-infrastructure-using-cloud-ai-and-iot/, Sep. 24, 2018 (11 pages).
W3c, "SPARQL: Query Language for RDF," located on The Wayback Machine, URL: https://web.archive.org/web/20161230061728/http://www.w3.org/TR/rdf-sparql-query/), retrieved from internet Nov. 15, 2022 (89 pages).
Wei et al., "Development and Implementation of Software Gateways of Fire Fighting Subsystem Running on EBI," Control, Automation and Systems Engineering, IITA International Conference on, IEEE, Jul. 2009 (pp. 9-12).
White et al., "Reduce building maintenance costs with AWS IoT TwinMaker Knowledge Graph," The Internet of Things on AWS—Official Blog, URL: https://aws.amazon.com/blogs/iot/reduce-building-maintenance-costs-with-aws-iot-twinmaker-knowledge-graph/, Nov. 18, 2022 (10 pages).
Zhou, Q. et al., "Knowledge-infused and Consistent Complex Event Processing over Real-time and Persistent Streams," Further Generation Computer Systems, 2017, 76 (pp. 391-406).
U.S. Appl. No. 17/710,458, filed Mar. 31, 2022, Johnson Controls Tyco IP Holdings LLP.
Koh et al., "Scrabble: Transferrable Semi-Automated Semantic Metadata Normalization using Intermediate Representation," BuildSys '18, Nov. 7-8, 2018 (10 pages).

\* cited by examiner

GATEWAY SYSTEM THAT MAPS POINTS INTO A GRAPH SCHEMA

BACKGROUND

The present disclosure relates generally to the management of building systems of a building.

A building system can manage or control building subsystems and equipment of a building. A building can include various types of building subsystems, e.g., heating, ventilation, and air conditioning (HVAC) systems, security systems, fire response systems, etc. The building subsystems can produce data in a particular language or format. However, the language or format may not be compatible with various building applications. For example, the language or format may be specific to the piece of equipment, type of equipment, manufacturer of the equipment, etc.

SUMMARY

One implementation of the present disclosure includes a building system of a building including one or more memory devices having instructions stored thereon, that, when executed by one or more processors, cause the one or more processors to receive tags describing points of the building. The instructions cause the one or more processors to map the tags to classes of a schema of a graph data structure. The instructions cause the one or more processors to perform clustering to generate clusters of the points. The instructions cause the one or more processors to identify, based on the clusters, relationships in the schema of the graph data structure between the tags mapped to the classes of the schema of the graph data structure. The instructions cause the one or more processors to construct the graph data structure in the schema based on the tags mapped to the classes and the relationships in the schema of the graph data structure.

In some embodiments, the instructions cause the one or more processors to receive a building layout of at least one building and identify spaces of the at least one building based on the building layout. In some embodiments, the instructions cause the one or more processors to perform the clustering by setting centroids based on the spaces, clustering the points based on the centroids, and identifying spatial relationships of the relationships in the schema of the graph data structure based on the clustering of the points.

In some embodiments, the instructions cause the one or more processors to receive timeseries data for the points, analyze the timeseries data to identify a behavior between a first point of the points and a second point of the points, and identify a functional relationship of the relationships between a first tag representing the first point and a second tag representing the second point responsive to identifying the behavior between the first point and the second point.

In some embodiments, the instructions cause the one or more processors to perform a first clustering to cluster the points based on characteristics of the points, perform a second clustering to cluster the points based on at least one building layout of at least one building, merge a result of the first clustering and the second clustering, and identify the relationships of the schema of the graph data structure based on the result.

In some embodiments, the instructions cause the one or more processors to generate an embedding of a tag of the tags, generate embeddings of the classes of the schema of the graph data structure, generate similarities between the embedding of the tag of the tags and the embeddings of the classes of the schema of the graph data structure, select a class of the classes based on the similarities, and map the tag to the class responsive to the selection of the class.

In some embodiments, the instructions cause the one or more processors to generate an embedding vector of a tag of the tags, generate embedding vectors of the classes of the schema of the graph data structure, and generate similarity levels based on angles formed between the embedding vector of the tag and the embedding vectors of the classes of the schema of the graph data structure. The instructions cause the one or more processors to select a class of the classes based on the similarity levels and map the tag to the class responsive to the selection of the class.

In some embodiments, the instructions cause the one or more processors to receive an indication that similarities between an embedding of a tag of the tags and embeddings of the classes of the schema of the graph data structure are less than a threshold and receive timeseries data for a point represented by the tag of the tags. In some embodiments, the instructions cause the one or more processors to determine an order to process the timeseries data with a first model and a second model, the first model outputting a first probability of the point being mapped to a first class of the classes and the second model outputting a second probability of the point being mapped to a second class of the classes, the order indicating to process the timeseries data with the first model and then the second model responsive to an identification of a first similarity between the embedding of the tag of the tags and a first embedding of the first class being greater than the embedding of the tag of the tags and a second embedding of the second class. The instructions cause the one or more processors to process the timeseries data with the first model and then the second model.

In some embodiments, the instructions cause the one or more processors to receive point data describing the points, execute models to map the points to the tags, map the tags to the classes of the schema of the graph data structure, and identify the relationships responsive to mapping the points to the tags.

In some embodiments, the instructions cause the one or more processors to construct the graph data structure by generating, based on mappings between the tags and the classes, nodes for the graph data structure. In some embodiments, a first node of the nodes is generated in a first class of the classes to represent a first tag of the tags mapped to the first class and a second node of the nodes is generated in a second class of the classes to represent a second tag of the tags mapped to the second class. In some embodiments, constructing the graph data structure includes generating an edge between the first node and the second node to represent a relationship of the relationships.

In some embodiments, the instructions cause the one or more processors to execute a control application to receive at least a portion of the graph data structure and generate a control decision based on at least the portion of the graph data structure. In some embodiments, the instructions cause the one or more processors to operate a piece of building equipment of the building based on the control decision.

Another implementation of the present disclosure includes a method. The method includes receiving, by one or more processing circuits, tags describing points of the building, mapping, by the one or more processing circuits, the tags to classes of a schema of a graph data structure, and performing, by the one or more processing circuits, clustering to generate clusters of the points. The method includes identifying, by the one or more processing circuits, based on the clusters, relationships in the schema of the graph data structure between the tags mapped to the classes of the schema of the graph data structure and constructing, by the one or more processing circuits, the graph data structure in the schema based on the tags mapped to the classes and the relationships in the schema of the graph data structure.

In some embodiments, the method includes receiving, by the one or more processing circuits, a building layout of at least one building, identifying, by the one or more processing circuits, spaces of the at least one building based on the building layout, and performing, by the one or more processing circuits, the clustering. In some embodiments, performing the clustering includes setting centroids based on the spaces, clustering the points based on the centroids, and identifying spatial relationships of the relationships in the schema of the graph data structure based on the clustering of the points.

In some embodiments, the method includes receiving, by the one or more processing circuits, timeseries data for the points, analyzing, by the one or more processing circuits, the timeseries data to identify a behavior between a first point of the points and a second point of the points, and identifying, by the one or more processing circuits, a functional relationship of the relationships between a first tag representing the first point and a second tag representing the second point responsive to identifying the behavior between the first point and the second point.

In some embodiments, the method includes performing, by the one or more processing circuits, a first clustering to cluster the points based on characteristics of the points, performing, by the one or more processing circuits, a second clustering to cluster the points based on at least one building layout of at least one building, merging, by the one or more processing circuits, a result of the first clustering and the second clustering, and identifying, by the one or more processing circuits, the relationships of the schema of the graph data structure based on the result.

In some embodiments, the method includes generating, by the one or more processing circuits, an embedding of a tag of the tags, generating, by the one or more processing circuits, embeddings of the classes of the schema of the graph data structure, generating, by the one or more processing circuits, similarities between the embedding of the tag of the tags and the embeddings of the classes of the schema of the graph data structure, selecting, by the one or more processing circuits, a class of the classes based on the similarities, and mapping, by the one or more processing circuits, the tag to the class responsive to the selection of the class.

In some embodiments, the method includes generating, by the one or more processing circuits, an embedding vector of a tag of the tags, generating, by the one or more processing circuits, embedding vectors of the classes of the schema of the graph data structure, generating, by the one or more processing circuits, similarity levels based on angles formed between the embedding vector of the tag and the embedding vectors of the classes of the schema of the graph data structure, selecting, by the one or more processing circuits, a class of the classes based on the similarity levels, and mapping, by the one or more processing circuits, the tag to the class responsive to the selection of the class.

In some embodiments, the method includes receiving, by the one or more processing circuits, an indication that similarities between an embedding of a tag of the tags and embeddings of the classes of the schema of the graph data structure are less than a threshold, receiving, by the one or more processing circuits, timeseries data for a point represented by the tag of the tags, and determining, by the one or more processing circuits, an order to process the timeseries data with a first model and a second model. In some embodiments, the first model outputs a first probability of the point being mapped to a first class of the classes. In some embodiments, the second model outputs a second probability of the point being mapped to a second class of the classes. In some embodiments, the order indicating to process the timeseries data with the first model and then the second model responsive to an identification of a first similarity between the embedding of the tag of the tags and a first embedding of the first class being greater than the embedding of the tag of the tags and a second embedding of the second class. In some embodiments, the method includes processing, by the one or more processing circuits, the timeseries data with the first model and then the second model.

In some embodiments, the method includes receiving, by the one or more processing circuits, point data describing the points, executing, by the one or more processing circuits, models to map the points to the tags, mapping, by the one or more processing circuits, the tags to the classes of the schema of the graph data structure, and identifying, by the one or more processing circuits, the relationships responsive to mapping the points to the tags.

In some embodiments, constructing, by the one or more processing circuits, the graph data structure include generating, based on mappings between the tags and the classes, nodes for the graph data structure. In some embodiments, a first node of the nodes is generated in a first class of the classes to represent a first tag of the tags mapped to the first class. In some embodiments, a second node of the nodes is generated in a second class of the classes to represent a second tag of the tags mapped to the second class. In some embodiments, the method includes generating an edge between the first node and the second node to represent a relationship of the relationships.

Another implementation of the present disclosure is one or more computer readable media having instructions thereon, that, when executed by one or more processors, cause the one or more processors to receive tags describing points of the building. The instructions cause the one or more processors to map the tags to classes of a schema of a graph data structure, perform clustering to generate clusters of the points, identify, based on the clusters, relationships in the schema of the graph data structure between the tags mapped to the classes of the schema of the graph data structure and construct the graph data structure in the schema based on the tags mapped to the classes and the relationships in the schema of the graph data structure.

Another implementation of the present disclosure is a system located in a building. The system including a processing circuit configured to receive tags describing points of a piece of building equipment, the piece of building equipment connected to the system. The processing circuit is configured to map the tags to classes of a schema of a graph data structure. The processing circuit is configured to perform clustering to generate clusters of the points. The processing circuit is configured to identify, based on the clusters, relationships in the schema of the graph data structure between the tags mapped to the classes of the schema of the graph data structure. The processing circuit is configured to communicate data to a second system based at least in part on the tags mapped to the classes and the relationships.

In some embodiments, the processing circuit is configured to construct the graph data structure in the schema based on the tags mapped to the classes and the relationships in the schema of the graph data structure and communicate at least a portion of the graph data structure to the second system.

In some embodiments, the processing circuit is configured to communicate indications of the classes that the tags are mapped to and indications of the relationships to the second system.

In some embodiments, the processing circuit is configured to receive telemetry data from the piece of building equipment and transmit the telemetry data to the system based at least in part on the on the tags mapped to the classes and the relationships.

In some embodiments, the processing circuit is configured to receive one or more software components from the system, the one or more software components configured to cause the system to operate as a gateway for the piece of building equipment and cause the system to receive and execute a service, the service configured to map the tags to the classes identify, based on the clusters, the relationships. In some embodiments, the one or more software components cause the system to receive telemetry data from the piece of building equipment and communicate the telemetry data to the system based at least in part on the tags mapped to the classes and the relationships.

In some embodiments, the processing circuit is configured to receive a building layout of the building. In some embodiments, the processing circuit is configured to identify spaces of the building based on the building layout. In some embodiments, the processing circuit is configured to perform the clustering by setting centroids based on the spaces, clustering the points based on the centroids, and identifying spatial relationships of the relationships in the schema of the graph data structure based on the clustering of the points.

In some embodiments, the processing circuit is configured to receive timeseries data for the points. In some embodiments, the processing circuit is configured to analyze the timeseries data to identify a behavior between a first point of the points and a second point of the points and identify a functional relationship of the relationships between a first tag representing the first point and a second tag representing the second point responsive to identifying the behavior between the first point and the second point.

In some embodiments, the processing circuit is configured to perform a first clustering to cluster the points based on characteristics of the points. In some embodiments, the processing circuit is configured to perform a second clustering to cluster the points based on at least one building layout of at least one building, merge a result of the first clustering and the second clustering, and identify the relationships of the schema of the graph data structure based on the result.

In some embodiments, the processing circuit is configured to generate an embedding of a tag of the tags. In some embodiments, the processing circuit is configured to generate embeddings of the classes of the schema of the graph data structure, generate similarities between the embedding of the tag of the tags and the embeddings of the classes of the schema of the graph data structure, select a class of the classes based on the similarities, and map the tag to the class responsive to the selection of the class.

In some embodiments, the processing circuit is configured to generate an embedding vector of a tag of the tags, generate embedding vectors of the classes of the schema of the graph data structure, generate similarity levels based on angles formed between the embedding vector of the tag and the embedding vectors of the classes of the schema of the graph data structure, select a class of the classes based on the similarity levels, and map the tag to the class responsive to the selection of the class.

In some embodiments, the processing circuit is configured to receive an indication that similarities between an embedding of a tag of the tags and embeddings of the classes of the schema of the graph data structure are less than a threshold, receive timeseries data for a point represented by the tag of the tags, and determine an order to process the timeseries data with a first model and a second model, the first model outputting a first probability of the point being mapped to a first class of the classes and the second model outputting a second probability of the point being mapped to a second class of the classes, and the order indicating to process the timeseries data with the first model and then the second model responsive to an identification of a first similarity between the embedding of the tag of the tags and a first embedding of the first class being greater than the embedding of the tag of the tags and a second embedding of the second class. In some embodiments, the processing circuit is configured to process the timeseries data with the first model and then the second model.

In some embodiments, the processing circuit is configured to receive point data describing the points, execute models to map the points to the tags, map the tags to the classes of the schema of the graph data structure, and identify the relationships responsive to mapping the points to the tags.

In some embodiments, the processing circuit is configured to construct the graph data structure by generating, based on mappings between the tags and the classes, nodes for the graph data structure. In some embodiments, a first node of the nodes is generated in a first class of the classes to represent a first tag of the tags mapped to the first class and a second node of the nodes is generated in a second class of the classes to represent a second tag of the tags mapped to the second class. In some embodiments, the processing circuit is configured to construct the graph data structure by generating an edge between the first node and the second node to represent a relationship of the relationships.

Another implementation of the present disclosure a method including receiving, by one or more processing circuits of a system located in a building, tags describing points of a piece of building equipment, the piece of building equipment connected to the system. The method includes mapping, by the one or more processing circuits, the tags to classes of a schema of a graph data structure. The method includes performing, by the one or more processing circuits, clustering to generate clusters of the points. The method includes identifying, by the one or more processing circuits, based on the clusters, relationships in the schema of the graph data structure between the tags mapped to the classes of the schema of the graph data structure. The method includes communicating, by the one or more processing circuits, data to a second system based at least in part on the tags mapped to the classes and the relationships.

In some embodiments, the method includes constructing, by the one or more processing circuits, the graph data structure in the schema based on the tags mapped to the plurality of classes and the relationships in the schema of the graph data structure and communicating, by the one or more processing circuits, at least a portion of the graph data structure to the second system.

In some embodiments, the method includes communicating, by the one or more processing circuits, indications of the classes that the tags are mapped to and indications of the relationships to the second system.

In some embodiments, the method includes receiving, by the one or more processing circuits, telemetry data from the piece of building equipment and transmitting, by the one or more processing circuits, the telemetry data to the second system based at least in part on the on the tags mapped to the classes and the relationships.

In some embodiments, the method includes receiving, by the one or more processing circuits, one or more software components from the system, the one or more software components configured to cause the system to operate as a gateway for the piece of building equipment and cause the system to receive and execute a service, the service configured to map the tags to the classes and identify, based on the clusters, the relationships. The method includes receiving, by the one or more processing circuits, telemetry data from the piece of building equipment and communicating, by the one or more processing circuits, the telemetry data to the system based at least in part on the tags mapped to the classes and the relationships.

In some embodiments, the method includes receiving, by the one or more processing circuits, an indication that similarities between an embedding of a tag of the tags and embeddings of the classes of the schema of the graph data structure are less than a threshold, receiving, by the one or more processing circuits, timeseries data for a point represented by the tag of the tags, and determining, by the one or more processing circuits, an order to process the timeseries data with a first model and a second model. The first model can output a first probability of the point being mapped to a first class of the classes. The second model can output a second probability of the point being mapped to a second class of the classes. In some embodiments, the order indicates to process the timeseries data with the first model and then the second model responsive to an identification of a first similarity between the embedding of the tag of the tags and a first embedding of the first class being greater than the embedding of the tag of the tags and a second embedding of the second class. In some embodiments, the method includes processing, by the one or more processing circuits, the timeseries data with the first model and then the second model.

Another implementation of the present disclosure is a gateway of a building, the gateway including a processing circuit. The processing circuit is configured to receive tags describing points of a piece of building equipment, the piece of building equipment connected to the gateway, map the tags to classes of a schema of a graph data structure, and perform clustering to generate clusters of the points. The processing circuit is configured to identify, based on the clusters, relationships in the schema of the graph data structure between the tags mapped to the classes of the schema of the graph data structure and communicate data to a system based at least in part on the tags mapped to the classes and the relationships.

In some embodiments, the processing circuit is configured to receive telemetry data from the piece of building equipment and transmit the telemetry data to the system based at least in part on the on the tags mapped to the classes and the relationships.

BRIEF DESCRIPTION OF THE DRAWINGS

Various objects, aspects, features, and advantages of the disclosure will become more apparent and better understood by referring to the detailed description taken in conjunction with the accompanying drawings, in which like reference characters identify corresponding elements throughout. In the drawings, like reference numbers generally indicate identical, functionally similar, and/or structurally similar elements.

DETAILED DESCRIPTION

Figure 1:
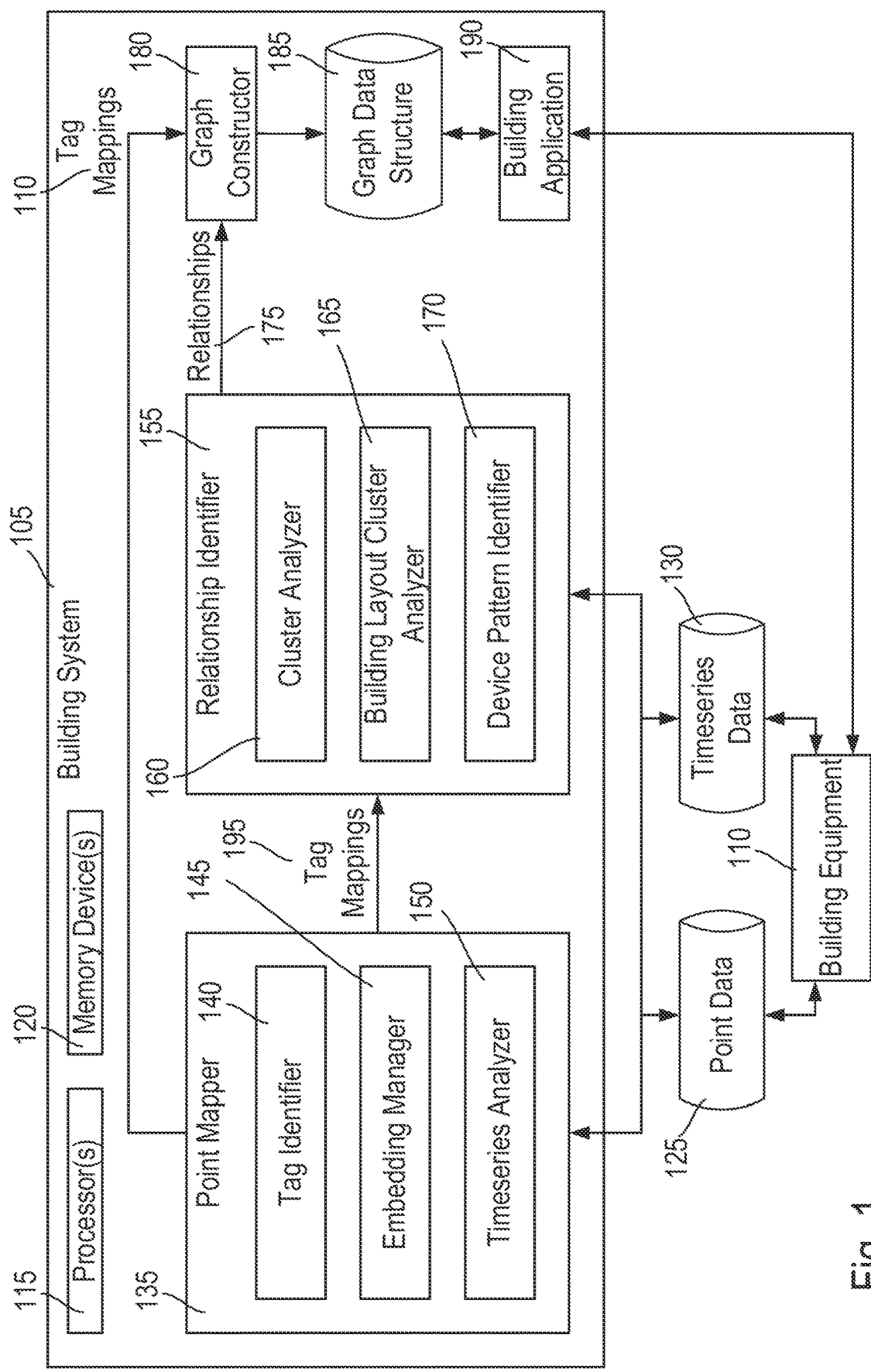
FIG. 1 is a building system that maps points of building equipment into a graph schema, according to an exemplary embodiment.

Referring generally to the FIGURES, a building system that maps points of building equipment into a graph schema is shown, according to various exemplary embodiments. The building system can receive data describing points of a building. The points can indicate spaces, people, pieces of equipment, components, data objects, sensor readings, control settings (e.g., settings or setpoints to control temperature, humidity, air quality, acoustic level), etc. The building system can receive data from the data points, e.g., timeseries data or event data. The building system can send data to the data points, e.g., setpoints or commands. The data points can indicate fault indicators, flags, equipment data, etc. The formatting or language of metadata describing the points may not be in a form consumable by building applications that implement building control or building analytics.

For example, building applications may need to appropriately identify which points to read data from or write data to. For example, a fault detection and diagnostics (FDD) application may need to identify and consume timeseries data of specific equipment points. An energy prediction management (EPM) application may need to identify and consume energy meter readings. Applications such as clean air optimization (CAO) may need to identify and consume zone level carbon dioxide ($CO_2$) sensor readings. However, from the formatting of the point data, the applications may not be able identify which data points to consume data from unless the applications are built specifically for the format of metadata of the point data. This may lead to many design and deployment inefficiencies because the formatting or language for point data may change from building to building, space to space, equipment manufacturer to equipment manufacturer, etc. Various other building applications such as occupant comfort, self-healing, monitoring, or tracking solutions may have similar difficulties and require significant amounts of configuration time to install or implement building applications in a building.

A rule-based converter can convert the formatting of the point data into a schema for a graph data structure. Examples of graph schemas can include BRICK, HAYSTACK, custom schemas, modified or extended versions of a BRICK schema, a custom graph schema, etc. However, the rule-based converter can be an inefficient technique. For example, the number of rules needed to implement the rule-based converter may be larger, e.g., hundreds, thousands, tens of thousands, hundreds of thousands. This large amount of rules can use considerable amounts of memory or storage resources. As the size of the rule base increases, the ability to review, edit, and maintain the rules can be difficult. Furthermore, the rule-based converter may be unable to adapt to new formats of the point data without receiving an update of new rules to handle the new formats. In some cases, the formats are subjective to the operator that provided the point names or point metadata. The operator may not follow any standardized point naming or tagging convention. The naming used for points can be inconsistent across spaces of buildings, buildings, or campuses. The rule-based implementation may have difficulty in identifying point types and functions, characteristics, or relationships between points or entities of a building. The rule-based system may have difficulty identifying point types, point functions, point characteristics, or relationships between points from point metadata.

To solve these and other technical problems, the building system described herein can map points into a graph schema according to machine learning and artificial intelligence techniques, e.g., embedding techniques and point clustering techniques. The building system can map points into classes of the graph schema that describe specific building entities, e.g., the building system can identify equipment such as sensors or actuators, spaces, points, or people from the point metadata. The building system can identify relationships in the graph schema between entities or points of the building indicated by the point data. The building system can construct a graph data structure based on the points mapped to the classes of the graph schema and the identified relationships in the graph schema. The building system can handle translation for a variety of different formats or languages for describing the metadata of the points, even new formats or languages that the building system has not encountered before. In contrast to rule-based implementations, the building system can adapt, using the machine learning and artificial intelligence techniques, embedding techniques, and clustering techniques to a variety of different data point formats or languages with high accuracy.

By generating the graph data structure in the graph schema, the configuration and deployment time of building applications can be reduced. For example, the building applications can be designed to expect data in the graph schema. Therefore, no significant configuration or modification to the building applications is needed before the building applications are deployed against the graph data structure.

The building system can map the points into tags or tag-sets. The building system can implement one or more AI/ML algorithms such as long-short term memory (LSTM) neural networks or conditional random fields (CRF) techniques to map metadata such as point names into predefined tags or tag-sets. The tags or tag-sets can be embedded with an embedding technique. A resulting embedding vector can be compared against embedding vectors generated for each class of a graph schema. The building system can select a class associated with an embedding with a highest similarity to the embedding of the tag representing the point. If the similarity is greater than a threshold, the building system can map the point to the class. However, if the similarity is less than the threshold, the building system can perform a classification with timeseries data for the point.

The building system can store multiple different models that process timeseries data for the point, each model determining whether timeseries data indicates that the point should be classified into a class of the graph schema. The building system can utilize the similarities learned from the embedding comparison to identify an order in which to test the models. This allows the models that are most likely to classify the point into a class to be tested first and the models that are least likely to classify the point into a class to be tested last. This can reduce a total length of time to classify the points into the classes, making the classification significantly faster. Furthermore, by efficiently applying the models based on the similarities, processing resources can be utilized in a more efficient manner since fewer models may need to be tested. Furthermore, if fewer models are tested, less memory resources need to be consumed, e.g., fewer models need to be loaded from storage into memory.

The building system can use embeddings to map the tags to the classes before the building system attempts to use the timeseries data to map the tags to the classes. In some cases, it may require less processing resources, memory resources, or power consumption to map the tags with embeddings although the timeseries analysis may be highly accurate (e.g., more accurate than the embedding technique). To conserve computing resources and still operate with a high degree of accuracy, the building system can first start with mapping tags with the embedding technique and only use the timeseries analysis when the embedding technique is not able to map the tags to the classes with a high enough degree of accuracy.

The building system can identify relationships between the points. The rule-based system may not be able to identify relationships between or the points or may not be able to identify the relationships with an acceptable level of accuracy. The building system can perform clustering techniques to cluster the points into spatially similar buckets. For example, the building system can perform a space hierarchy based similarity clustering. Furthermore, the building system can perform clustering based on floor maps in two dimensional or three dimensional geometry. From the clustering, the building system can identify which points belong to which spaces. Furthermore, the building system can identify the relationships between the spaces themselves based on the clustering.

While the building system can use the clustering to identify spatial relationships, the building system can implement multi-device pattern identification to identify functional relationships. For example, operational characteristics between points can indicate that one piece of equipment controls another piece of equipment. The building system can store multiple patterns and search timeseries data of the points to identify whether patterns exist between the points. The building system can generate relationships in the graph schema that correspond with the type of pattern identified between the points.

Referring now to FIG. 1, a building system 105 that maps points of building equipment 110 into a graph schema is shown, according to an exemplary embodiment. The building system 105 can be a cloud computing platform, a web-services platform, a server system, an Internet of Things (IoT) platform, an on-premises system within a building, an off-premises system outside a building, a building controller, a computing system, a desktop computer, a laptop computer, a smartphone, a console, or any other type of computing system. The building system 105 can include one or more processors 115 and one or more memory devices 120. The memory devices 120 can store instructions that the one or more processors 115 execute to perform the various operations, functions, storage techniques, data manipulation techniques, etc. as described with reference to the building system 105.

The processing circuits or processors 115 can be or include general purpose or specific purpose processors. The processing circuits or processors 115 can be or include application specific integrated circuits (ASICs), one or more field programmable gate arrays (FPGAs), a group of processing components, or other suitable processing components. The processors may be configured to execute computer code and/or instructions stored in the memory devices 120 or received from other computer readable media (e.g., compact disc read-only memory (CDROM), network storage, a remote server, etc.).

The memory devices 120 can include one or more devices (e.g., memory units, memory devices, storage devices, etc.) for storing data and/or computer code for completing and/or facilitating the various processes described in the present disclosure. The memory devices 120 can include random access memory (RAM), read-only memory (ROM), hard drive storage, temporary storage, non-volatile memory, flash memory, optical memory, or any other suitable memory for storing software objects and/or computer instructions. The memory devices 120 can include database components, object code components, script components, or any other type of information structure for supporting the various activities and information structures described in the present disclosure. The memory devices 120 can be communicably connected to the processors and can include computer code for executing (e.g., by the processors 115) one or more processes described herein.

The building system 105 can receive point data 125 and/or timeseries data 130 from the building equipment 110. The building equipment 110 can be or include humidity sensors, temperature sensors, acoustic sensors, air quality sensors, thermostats, controllers, Internet of Things (IoT) devices, smart home devices, variable air volume (VAV) boxes, air handling units (AHUs), chillers, boilers, security systems or devices, fire suppression systems or devices, etc. The equipment 110 can be non-building equipment. For example, the equipment 110 can be computer systems of vehicles, trains, planes, product manufacturing systems, chemical or biological testing or manufacturing systems, laboratory equipment, etc. The building system 105 can be a non-building specific system, e.g., a system for an environment other than a building. The environment could be a transit environment, a manufacturing environment, a laboratory environment, a virtual environment, etc.

The building equipment 110 can be points or include points. The points can be associated with point data 125. The point data 125 can be metadata that includes a point name, a point identifier, units for a point, etc. The point data 125 can include characters, character strings, character sequences, etc. The point data 125 can include text based descriptions of the points. The text based descriptions can be acronyms, short-hand descriptions of points, etc. The text based descriptions could be in a first format, e.g., "421_U14_TEMP_SPT," "421_U22_FCU_FAULT," "SDH.S1-17:CTL FLOW MAX:PRIORITY," "SDH.HWP2_VFD:POWER," "SODA1R465D_VAV," and "SODA4R465H_ART." The text based descriptions could be in a second format, e.g., "CLGUNOCC-MINFLOW," "CLGUNOCC-SP," "DATHTGMAX-SP," "DATSATIS-FIED-SP," "DMPTM," "EA-AREA," "EAD-CLOSED-FLOWRATIO," and "EAD-OPEN-FLOWRATIO."

The timeseries data 130 can be or include data collected or monitored for a point. For example, if the point is a temperature measurement point, the timeseries data 130 can include a series of temperature measurements. If the point is a temperature setpoint, the timeseries data 130 can include a history of values for the temperature setpoint. The data 130 can be any type of time correlated data stream, e.g., events, a series, a trend, a history, a table, a vector, or any other data type.

The building system 105 can include a point mapper 135. The point mapper 135 can map the points indicated by the point data 125 into classes of the graph schema. The point mapper 135 can include a tag identifier 140. The tag identifier 140 can identify tags or tag-sets (e.g., sequences of tags) that represent acronyms or sequences of acronyms that represent names of the various points. The tag identifier 140 can implement a variety of AI and/or ML techniques to map the point data 125 into tags. For example, the tag identifier 140 can apply a neural network such as a sequence-to-sequence neural network as described in U.S. application Ser. No. 16/885,968 filed May 28, 2020, the entirety of which is incorporated by reference herein. For example, the tag identifier 140 can apply a statistical model as described in U.S. application Ser. No. 16/885,959 filed May 28, 2020, the entirety of which is incorporated by reference herein. Furthermore, the tag identifier 140 can implement the translation techniques described in U.S. patent application Ser. No. 16/663,623 filed Oct. 25, 2019, the entirety of which is incorporated by reference herein.

The point mapper 135 can include an embedding manager 145. The embedding manager 145 can receive the tags from the tag identifier 140. The embedding manager 145 can generate an embedding for the tags. The embedding manager 145 can apply FastText, WordPiece, Word2Vec, GloVe, or any other embedding technique to the tags. The result of the embedding can be a vector. The embedding manager 145 can embed each tag to generate an embedding vector for each tag. The embedding manager 145 can further generate embeddings for classes of the graph schema. Instead of generating the embeddings for the classes, the embedding manager 145 can be deployed with the embeddings for the classes of the graph schema already generated. The embedding manager 145 can compare, with a comparison technique, the embedding vector for each tag against the embedding vectors of the classes of the graph schema to generate a similarity or similarity level. The comparison technique can be or include a cosine, a Euclidean distance, a dot product. The comparison technique can generate a value that is based, at least in part, on an angle formed between the two vectors.

The embedding manager 145 can select a class associated with a highest or maximum similarity or a similarity between an embedding of a tag and the embeddings of the classes or a class associated with a similarity greater than a particular level. The similarity of the selected class as compared to the tag can be compared to a threshold. If the similarity level is greater than the threshold, the embedding manager 145 can generate data that maps the tag to the class. For example, the embedding manager 145 can generate a tag mapping 195 for the tag to indicate that the tag is mapped, related, or otherwise tied to the class. If the similarity level is less than the threshold, the embedding manager 145 can generate data that causes the timeseries analyzer 150 to identify the tag mapping 195.

The timeseries analyzer 150 can receive the timeseries data 130 for a point to determine a class of the graph schema to map the point and/or a tag representing the point to. The timeseries analyzer 150 can perform preprocessing on the timeseries data 130. For example, the timeseries analyzer 150 can perform data selection, data pruning, value normalization, interpolation, extrapolation, etc. Furthermore, the timeseries analyzer 150 can extract features from the timeseries data 130. A feature can be a characteristic that a machine learning model can consume to generate a result, e.g., determine a value for a target. Extracting the features from the timeseries data 130 can convert or reduce the timeseries data 130 to a lower dimensional space that the machine learning model can consume. For example, the features can indicate seasonal indices for a trend of data, data groupings, averages, frequency components, maximas, minimas, gradients, etc. The timeseries analyzer 150 can apply feature extraction techniques such as principal component analysis (PCA) or a neural network such as an LSTM neural network or convolutional neural network (CNN).

The timeseries analyzer 150 can apply pre-trained classification models to the features to determine a classification level or probability of the point or tag being mapped to a particular class of the graph schema. Each classification model can output a probability of the point or tag being mapped to one class. The timeseries analyzer 150 can apply multiple classification models for a class and combine the results of the classifications together. For example, the timeseries analyzer 150 can generate an ensemble of the outputs of the models. For example, the timeseries analyzer 150 can combine the levels into a single level through selecting a maximum, performing an average, performing a weighted average, or processing the levels through a neural network. The ensemble level can be compared to a threshold, if the ensemble level is greater than a threshold, the timeseries analyzer 150 can map the point or tag to the class and generate the tag mapping 195. If the threshold is not met, the timeseries analyzer 150 can apply a different model or set of models to the timeseries data 130 for a different class to generate another ensemble level and compare the ensemble level to a threshold. The timeseries analyzer 150 can execute multiple iterations until a model or set of models, linked to a particular class, are found that produce a level based on the timeseries data 130 that is greater than the threshold.

To efficiently apply the models, the timeseries analyzer 150 can identify an order to apply the models. The order can be in decreasing likeliness that the model will produce a level greater than the threshold. The timeseries analyzer 150 can receive the similarity levels between the tag and the classes identified by the tag identifier 140 by comparing the embedding vectors. The timeseries analyzer 150 can generate an order to apply the models based on the similarity levels. The timeseries analyzer 150 can sort the classes, based on the similarity levels, into decreasing level of similarity for the classes. The timeseries analyzer 150 can apply the models corresponding to the classes in the order that the classes are sorted.

The building system 105 can include a relationship identifier 155. The relationship identifier 155 can identify relationships 175 between the points and/or tags mapped to the points. The relationship identifier 155 can process the point data 125 and/or the timeseries data 130 to generate the relationships 175. The relationships 175 can be relationships in a class of the graph schema. The relationships can include semantic relationships that include one or more words or phrases, e.g., including a predicate or predicate phrase. The relationships 175 can form triples between instances of classes that tags are mapped into. For example, a triple can include a subject, an object, and a predicate. The subject and object can be instances (e.g., objects, entities, nodes) of the classes of the graph schema. The predicate can be a relationship between the two instances. The relationship can be an edge between the two instances. The relationship can be a spatial relationship, e.g., indicating whether a piece of equipment, point, person, or other entity belong or are located in a space. The relationship could indicate "isLocatedIn," "isAssociatedWith," "controls," "includes," etc. The relationship can indicate relationships between spaces, e.g., a room being part of a zone, a zone being part of a floor, a floor being part of a building, a building being part of a campus. These space to space relationships can include, "isAPartOf," "belongsTo," "includes," etc. The relationship identifier 155 can further identify functional relationships 175. The functional relationships 175 can indicate that one or more pieces of equipment, points, or spaces are related in a behavioral or operational manner. For example, a functional relationship could indicate that an AHU "feeds" air to a VAV where "feeds" is the relationship 175. The functional relationship can indicate that a thermostat "controls" a VAV box where "controls" is the relationship 175. The schema of the graph data structure 185 can indicate a set of available relationship types. The relationship identifier 155 can generate the relationships 175 by causing each generated relationship 175 to be a relationship of a particular type of the set of available relationship types.

The relationship identifier 155 can include a cluster analyzer 160. The cluster analyzer 160 can generate clusters of points or tags. The cluster analyzer 160 can perform partitioning clustering. The cluster analyzer 160 can perform hierarchical clustering. The cluster analyzer 160 can perform hierarchical clustering with multiple iterations of clustering. In each iteration of the clustering, the cluster analyzer 160 can match clusters together based on a cluster distance. The cluster distance can be based on feature distance between the points. The features can be features included within the point data 125 and/or the timeseries data 130 such as point names, associated tags or tag sets, point text, descriptions of point types, units of measure for the point, etc.

At a first iteration of the clustering, the cluster analyzer 160 can treat each individual point as a cluster at a first level of a hierarchy. At each subsequent iteration, the clusters can be paired to form new clusters at a new higher level of the hierarchy. The clustering can continue until a highest level clustering is formed at a highest level of the hierarchy, e.g., a level that connects all of the clusters. Each level of the hierarchy formed by the hierarchical clustering can represent a space of a hierarchy of spaces. The hierarchy of spaces can indicate a campus, building, floor, zone, or room. Points clustered under a level representing the room can all be related by a relationship to the room. The cluster analyzer 160 can identify a relationship between the points and the room. Furthermore, the cluster analyzer 160 can identify relationships 175 between the spaces. For example, a level above the room can represent a zone and a relationship 175 between the zone and the room can be generated by the cluster analyzer 160. Furthermore, a level above the zone can represent a floor and a relationship 175 between the zone and the floor can be generated. Furthermore, a level above the floor can represent a building and a relationship 175 between the floor and the building can be generated. Furthermore, a level above the building can represent a campus and a relationship 175 between the building and the campus can be generated.

The relationship identifier 155 can include a building layout cluster analyzer 165. The building layout cluster analyzer 165 can perform clustering of points based on building layout data. The building layout data can be or include data of a building floor plan. The building floor plan can indicate a two dimensional or three dimensional plan of a building. The building layout data can be or include a building information model (BIM). The building layout data can be or include a blueprint. The building layout cluster analyzer 165 can receive the building layout data from a client device, a server, from a storage location, etc. The building layout cluster analyzer 165 can identify spaces within the building layout data. The spaces can be labeled within the building layout data and the building layout cluster analyzer 165 can identify the labels. The building layout cluster analyzer 165 can discover the spaces within the building layout data. The building layout cluster analyzer 165 can perform clustering based on the identified spaces within the building layout data.

The building layout cluster analyzer 165 can perform a clustering process such as K-means clustering. The building layout cluster analyzer 165 can instantiate centroids for the clustering to represent the spaces identified from the building layout data. The building layout cluster analyzer 165 can perform clustering based on features of the points, e.g., point names, associated tags or tag-sets, point text description fields such as point types, unit of measure, etc. The building layout cluster analyzer 165 can cluster the points around the centroids and iteratively adjust the locations of the centroids until there are no more changes or no more significant changes between the clusters. The building layout cluster analyzer 165 can generate a relationship between the points or tags assigned to a centroid cluster as belonging to the space represented by the centroid cluster.

The relationship identifier 155 can merge, converge, and/or join the results of the hierarchical clustering performed by the cluster analyzer 160 and the clustering performed by the building layout cluster analyzer 165. For example, the relationship identifier 155 can identify relationships identified with one technique but not the other and create a set of relationships that include the relationships specific to the hierarchical clustering of the cluster analyzer 160, specific to the clustering of the building layout cluster analyzer 165, and relationships common to the hierarchical clustering of the cluster analyzer 160 and the building layout cluster analyzer 165.

The relationship identifier 155 can include a device pattern identifier 170. The device pattern identifier 170 can identify functional relationships between the points. For example, the device pattern identifier 170 can store sets of patterns between different types of points that indicate that the points are related according to a particular functional relationship defined by the graph schema. The patterns can indicate that a behavior of one point affects another point. For example, a light switch turning on or off could create a condition sensed by a motion sensor. An AHU running a fan could affect a pressure sensed by a VAV. If the device pattern identifier 170 identifies that the AHU feeds air to the VAV, the device pattern identifier 170 can generate a "feeds" relationship.

The building system 105 can include a graph constructor 180. The graph constructor 180 can generate a graph data structure 185. The graph data structure 185 can be a model that indicates spatial and functional relationships between the points. The graph data structure 185 can include multiple nodes that represent instances of the classes of the graph schema identified by the point mapper 135 through the tag mappings 195. The graph constructor 180 can generate a node, entity, digital twin, object, or data element to represent each tag mapped to a class. The generated element can be generated in the class or linked to the class. For example, for a first tag, the graph constructor 180 can generate a first node in a class mapped to the first tag. For a second tag, the graph constructor 180 can generate a second node in a class mapped to the second tag. Based on the identified relationship 175, the graph constructor 180 can generate edges between the nodes. For example, the relationship identifier 155 can identify a relationship 175 between the first tag and the second tag or a point mapped to the first tag and another point mapped to the second tag. The graph constructor 180 can generate an edge between the node generated in the class mapped to the first tag and the node generated in the class mapped to the second tag.

The graph constructor 180 can generate the graph data structure 185 in a Resource Description Framework (RDF) data format or a Terse RDF Triple Language (TTL) file format. The graph constructor 180 can serialize the graph data structure 185. A building application 190 can be or include a visualization application that can generate a graphic representation of the graph data structure 185. For example, nodes or edges of the graph data structure 185 can be represented with graphic components in a graphical user interface displayed on a user device of a user. The user device can be or include a laptop, a desktop computer, a tablet, a smartphone, a console, etc.

The building system 105 can deploy the graph data structure 185 to another computing system or platform to run building applications 190 on. The building applications 190 can be software components, software modules, or sequences of instructions. The building applications 190 can be included in the building system 105. The building applications 190 can be control algorithms, analytics, predictive models, or any other kind of application. The building applications 190 can generate analytic data, e.g., predicted building or equipment loads, predicted equipment faults, detected equipment faults, or other information and generate data causing a display device of a user device to display the analytics. The building applications 190 can generate control data such as signals, parameters, settings, setpoints, commands, or other information for controlling the building equipment 110 and environmental conditions of a building such as temperature, humidity, air quality, air flow, air pressure, etc. The building applications 190 can generate temperature setpoints, fan speeds, air pressure setpoints, etc.

The building applications 190 can execute on at least a portion of the nodes and edges of the graph data structure 185 to generate analytics or generate control data. The building applications 190 can read the graph data structure 185, e.g., retrieve at least a portion of the graph data structure 185 for operation. For example, the building application 190 could identify relationships between spaces and control points. The building application 190 can determine to control temperature for a particular space. Responsive to determining to control the temperature for the particular space, the building application 190 can identify, based on the graph data structure 185, the associated control point to send data to in order to adjust the temperature of the particular space. The building application 190 could collect temperature data from the space by identifying a sensor or sensor point that measures the temperature.

Figure 2:
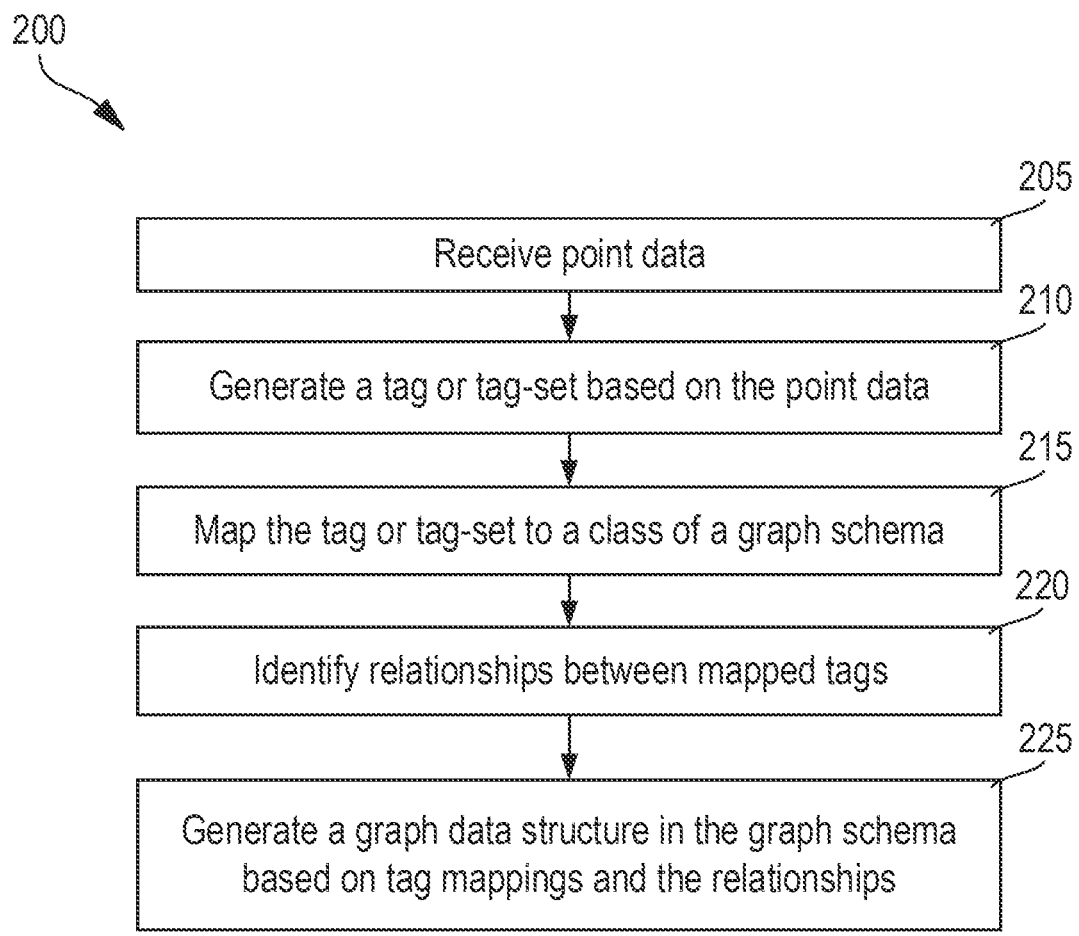
FIG. 2 is a flow diagram of a process of mapping points of building equipment into a graph schema, according to an exemplary embodiment.

Referring now to FIG. 2, a flow diagram of a process 200 of mapping points of building equipment into a graph schema is shown, according to an exemplary embodiment. The process 200 can include a step 205 of receiving a point data. The process 200 can include a step 210 of generating a tag or tag-set based on the point data. The process 200 can include a step 215 of mapping a tag or tag-set to a class of a graph schema. The process 200 can include a step 220 of identifying relationships between mapped tags. The process 200 can include a step 225 of generating a graph data structure in a graph schema based on the mapped tags and the relationships. At least one step of the process 200 can be performed by the building system 105, a computing system, a computing platform, a cloud platform, a server system, etc. At least one step of the process 200 can be performed by the point mapper 135, the relationship identifier 155 and/or the graph constructor 180 or the various components of the point mapper 135, the relationship identifier 155 and/or the graph constructor 180. The steps of the process 200 can be performed by a single computing system or distributed across multiple computing systems.

In the step 205, the process 200 can include receiving, by the building system 105, the point data 125. The building system 105 can receive the point data 125 directly or indirectly from the building equipment 110. For example, the building system 105 can communicate directly with the building equipment 110 via one or more networks. The building system 105 can communicate with a building management system (BMS) or building automation system (BAS) system or controller that collects the point data 125. The building system 105 can receive the point data 125 from a database, database system, or other storage system.

In the step 210, the process 200 can include generating, by the building system 105, a tag or tag-set based on the point data 125. The point data 125 can include acronyms, shorthand descriptions, point names, or other alphanumeric characters or character sets. The tag identifier 140 of the point mapper 135 of the building system 105 can generate a tag or tag-set to represent the point. The tag identifier 140 can apply a statistical mapping technique or a neural network mapping technique to the point data 125 to generate the tag or tag-set.

In the step 215, the process 200 can include mapping, by the building system 105, the tag or tag-set to the class of the graph schema. For example, the graph schema can include classes that represent points, equipment, people, spaces, or other entities of a building. The building system 105 can apply an embedding based mapping of the tags to the classes. For example, the embedding manager 145 of the point mapper 135 of the building system 105 can compare an embedding of a tag or tag-set to an embedding of the classes. Based on a similarity of the embedding of the tag to the embedding of the classes, the embedding manager 145 can generate tag mappings 195 between the tag and a class. For example, the embedding manager 145 can select a class associated with a highest similarity to the tag. The embedding manager 145 can select a class associated with a highest similarity that is greater than a threshold. If the, similarity does not meet the threshold, the timeseries analyzer 150 can analyze timeseries data 130 for the point to map the tag of the point to a class. The timeseries analyzer 150 can apply multiple different models and select an order in which to apply the models based on the similarities determined by the embeddings.

The step 220 can include identifying, by the building system 105, the relationships 175 between mapped tags. The relationship identifier 155 of the building system 105 can generate the relationships 175 based on the point data 125 and/or the timeseries data 130. For example, the cluster analyzer 160 or the building layout cluster analyzer 165 can generate the relationships 175 by generating clusters of points based on features extracted from the point data 125. The building layout cluster analyzer 165 can generate the clusters based on building layout data. Based on the clusters, the cluster analyzer 160 or the building layout cluster analyzer 165 can identify spatial relationships between spaces and points. The relationship identifier 155 can include a device pattern identifier 170 that processes the timeseries data 130 to identify functional relationships, e.g., control relationships, sensing relationships, etc. between the points.

The step 225 can include generating, by the building system 105, the graph data structure 185 in a graph schema based on the tag mappings 195 and the relationships 175. The graph constructor 180 of the building system 105 can generate a node of the graph data structure 185 for each mapped tag. The node can be generated in, or linked to, a class identified in the tag mappings 195. The graph constructor 180 can generate edges between the nodes based on the relationships 175. For example, for a relationship 175 identified between two points or tags representing the points, the graph constructor 180 can generate an edge between the nodes corresponding to the two points or tags.

Figure 3:
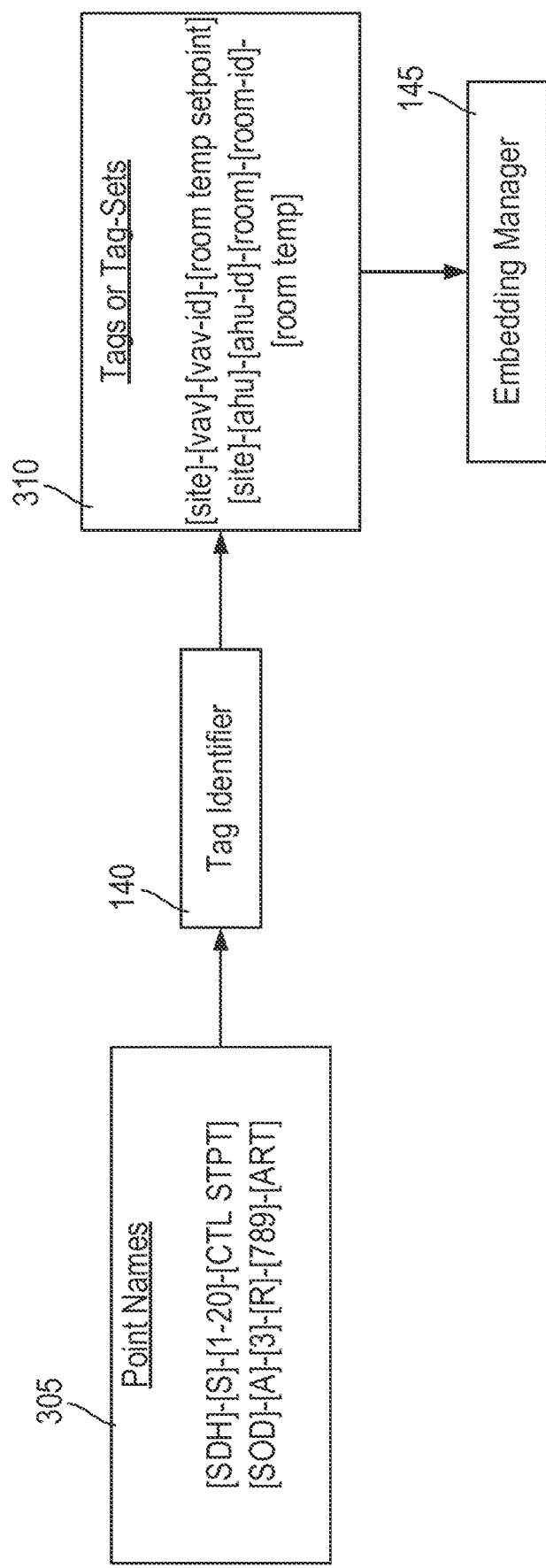
FIG. 3 is a block diagram illustrating points of building equipment mapped into tags or tag-sets, according to an exemplary embodiment.

Referring now to FIG. 3, a block diagram illustrating point names 305 of building equipment 110 mapped into tags or tag-sets 310, according to an exemplary embodiment. The point names 305 can be or can be included within the point data 125. The point names 305 can be received in a character sequence, string, or other data structure. The point names 305 can be provided in a single data structure, e.g., a string, vector, matrix. The point names 305 can be provided in separate data structures, e.g., each character segment can be provided in its own data element. The tag identifier 140 can generate the tag or tag-sets 310 from the point names 305. For example, the tag identifier 140 can map segments of characters of the point names 305. The tag identifier 140 can identify groups of characters in the point names 305 if the groupings are not present in the point names 305. The groups of characters in FIG. 3 are represented as brackets, e.g., [SDH] or [ART]. The tag identifier 140 can apply a neural network, such a sequence to sequence neural network (e.g., a LSTM sequence to sequence neural network) to map the point names 305 to a library of available tags to form the tags or tag-sets 310. The neural network can automatically generate tags or tag-sets 310 but may need a large dataset for model training. The tag identifier 140 can apply a statistical methodology, such CRF to map the point names 305 to a library of available tags to form the tags or tag-sets 310. CRF can use active learning to intelligently select lesser than 1-5% point names based on naming complexity for manual labeling. The trained CRF model can automatically generate remaining 99-95% of tag sets.

The tag identifier 140 can generate the tags or tag-sets by generating a data structure including the tags identified by the tag identifier 140 that are mapped to the point names 305. For example, the characters, "SDH" can be mapped to a "site." The characters "S" can be mapped to a "vav" and the characters "1-20" can be mapped to an identifier for the vav. Furthermore, the characters, "CTL STPT" can be mapped to the tag "room temperature setpoint." The tag identifier 140 can provide the tags or tag-sets 310 to the embedding manager 145 for the embedding manager 145 to map the tags or tag-sets 310 to classes of the graph schema.

Figure 4:
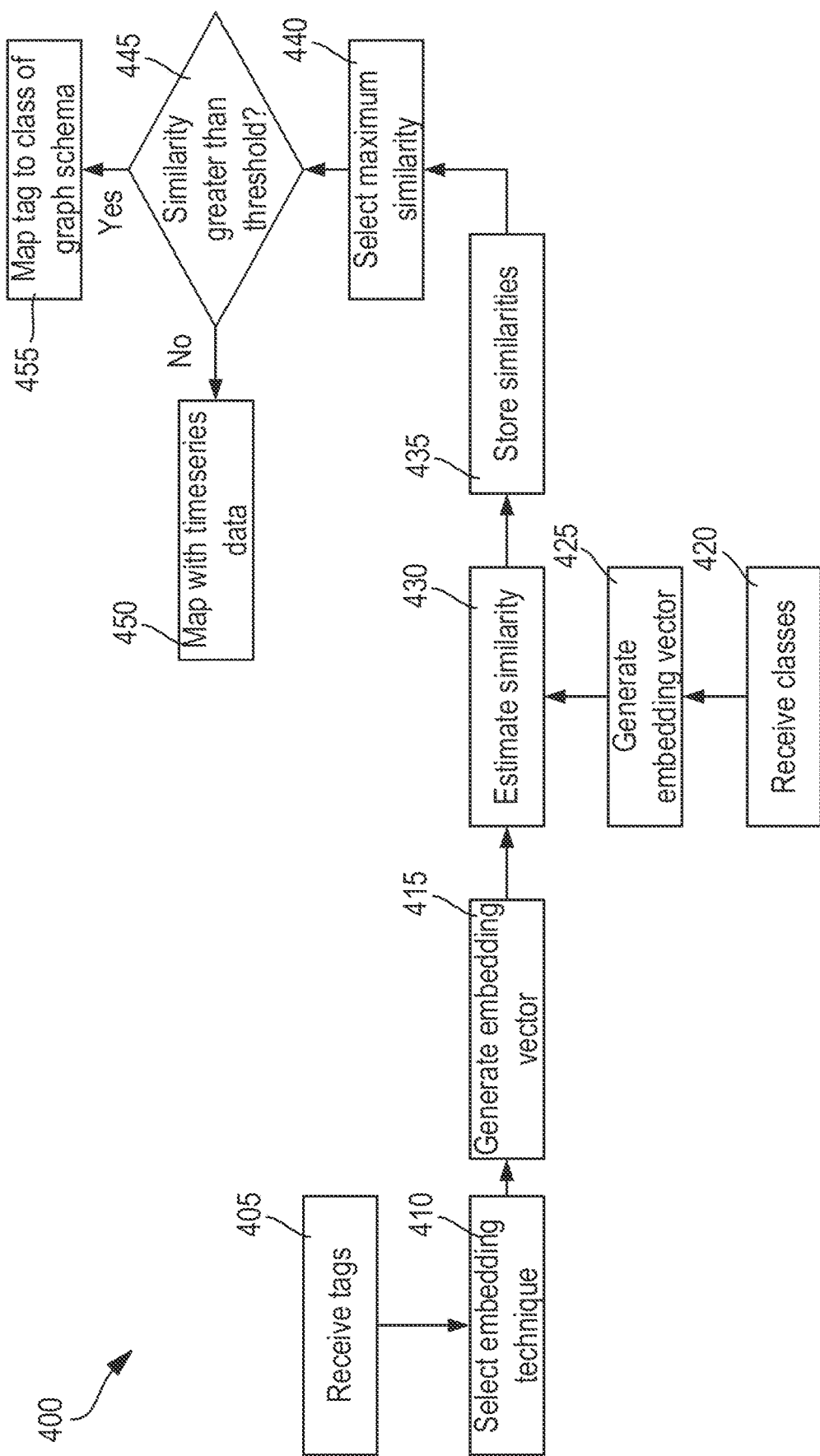
FIG. 4 is a flow diagram of a process of mapping tags or tag-sets into classes of a graph schema, according to an exemplary embodiment.

Referring now to FIG. 4, a flow diagram of a process 400 of mapping tags or tag-sets 310 into classes of a graph schema is shown, according to an exemplary embodiment. The process 400 can include a step 405 of receiving tags. The process 400 can include a step 410 of selecting an embedding technique. The process 400 can include a step 415 of generating an embedding vector. The process 400 can include a step of receiving classes. The process 400 can include a step 425 of generating an embedding vector. The process 400 can include a step 430 of estimating a similarity. The process 400 can include a step 435 of storing similarities. The process 400 can include a step 440 of selecting a maximum similarity. The process 400 can include a step 445 of determining whether a similarity is greater than a threshold. The process 400 can include a step 450 of mapping with timeseries data. The process 400 can include a step 455 of mapping a point to a class of the graph schema. At least one step of the process 400 can be performed by the building system 105, a computing system, a computing platform, a cloud platform, a server system, etc. At least one step of the process 400 can be performed by a single computing system or distributed across multiple computing systems. At least one step of the process 400 can be performed by the embedding manager 145 or the timeseries analyzer 150.

In step 405, the process 400 can include receiving, by the building system 105, tags. The embedding manager 145 can receive the tags from the tag identifier 140 that the tag identifier 140 generates based on the point data 125. The tags received by the embedding manager 145 can be tags or tag-set. In step 410, the process 400 can include selecting, by the building system 105, an embedding technique. The embedding manager 145 can select between one or multiple embedding techniques or computer processes stored by the embedding manager 145. The embedding manager 145 can receive a command or signal from another system, e.g., a client device or user interface, causing the embedding manager 145 to select a particular embedding technique. The embedding techniques can include FastText, WordPiece (BERT), Word2Vec, and GloVe.

In step 415, the process 400 can include generating, by the building system 105, an embedding vector. The embedding manager 145 can generate the embedding vector from the tags or tag-sets received in the step 405. The embedding manager 145 can apply the embedding technique selected in the step 410 to the tags or tag-sets. For example, the tags received by the embedding manager 145 include "site," "vav," "vav-id," and "room temp setpoint." The embedding manager 145 can generate a vector for each tag, [0.56, −0.95, 0.98], [−0.67, −0.90, −0.44], [−0.67, −0.80, 0.66], and [0.30, 0.67, 0.90] respectively.

In step 420, the process 400 can include receiving, by the building system 105, classes. The embedding manager 145 can receive classes of the graph schema. The classes can indicate points such a buildings, spaces, equipment, sensor points, control points, or other data. In step 425, the process 400 can include generating, by the building system 105, an embedding vector. The embedding manager 145 can process the classes with the embedding technique selected in the step 410. The classes can include names that are be text based, word based, or acronym based. The embedding manager 145 can generate the embedding vector from the names of the classes. For example, for classes, "AHU," "VAV," and "Condenser," the embedding manager 145 can generate vectors [0.30, −0.43, 0.67], [−0.67, −0.90, −0.44], and [−0.10, 0.25, 0.90] respectively.

In step 430, the process 400 can include estimating, by the building system 105, a similarity. The embedding manager 145 can determine a similarity level, similarity score, or other similarity indicator between the embedding vector of the tag or tag-set and the embedding vector of the class. The embedding manager 145 can generate a similarity for each tag between the embedding of the tag and the embedding of each of the classes or a group of the classes. The similarity can indicate an angle between the embedding vector of the tag and each embedding vector of the classes. The similarity can indicate a cosine of an angle between the embedding vector of the tag and each embedding vector of the classes. The similarity can indicate a result of a dot product computed based on the embedding vector of the tag and each embedding vector of the classes. The similarity can indicate a Euclidean distance between the embedding vector of the tag and each embedding vector of the classes.

In step 435, the process 400 can include storing, by the building system 105, similarities. The embedding manager 145 can store, for each tag received at step 405, a similarity between the embedding of the tag and the embedding of each of the classes (or a group of the classes). In step 440, the process 400 can include selecting, by the building system 105, a maximum similarity. The embedding manager 145 can, for each tag, compare the similarities of the tag to each class and select one class based on the comparison. For example, the embedding manager 145 can select a class associated with a similarity to the tag greater than or equal to a threshold. The embedding manager 145 can select a class associated with a similarity to the tag that is a greatest value or is a maximum or most similar value.

In step 445, the process 400 can include determining, by the building system 105, whether the similarity is greater than a threshold. For example, the embedding manager 145 can compare the maximum similarity between the tag and a particular class selected in step 440 to a threshold. If the similarity between the tag and the particular class is greater than the threshold, the embedding manager 145 can proceed to step 455. If the similarity between the tag and the particular class is less than the threshold, the embedding manager 145 can proceed to the step 450.

In step 455, the process 400 can include mapping, by the building system 105, the tag to the class of the graph schema. For example, the embedding manager 145 can generate a tag mapping 195 indicating a relationship between a tag and one particular class of the classes of the graph schema, e.g., the class associated with the embedding with the maximum similarity that satisfied the threshold. In step 450, the process 400 can include mapping, by the building system 105, with timeseries data. For example, the timeseries analyzer 150 can map a tag or tag-set to a class by analyzing the timeseries data 130 associated with the points represented by the tag or tag-set. The timeseries analyzer 150 can perform the processes described at FIGS. 6 and 7.

Figure 5:
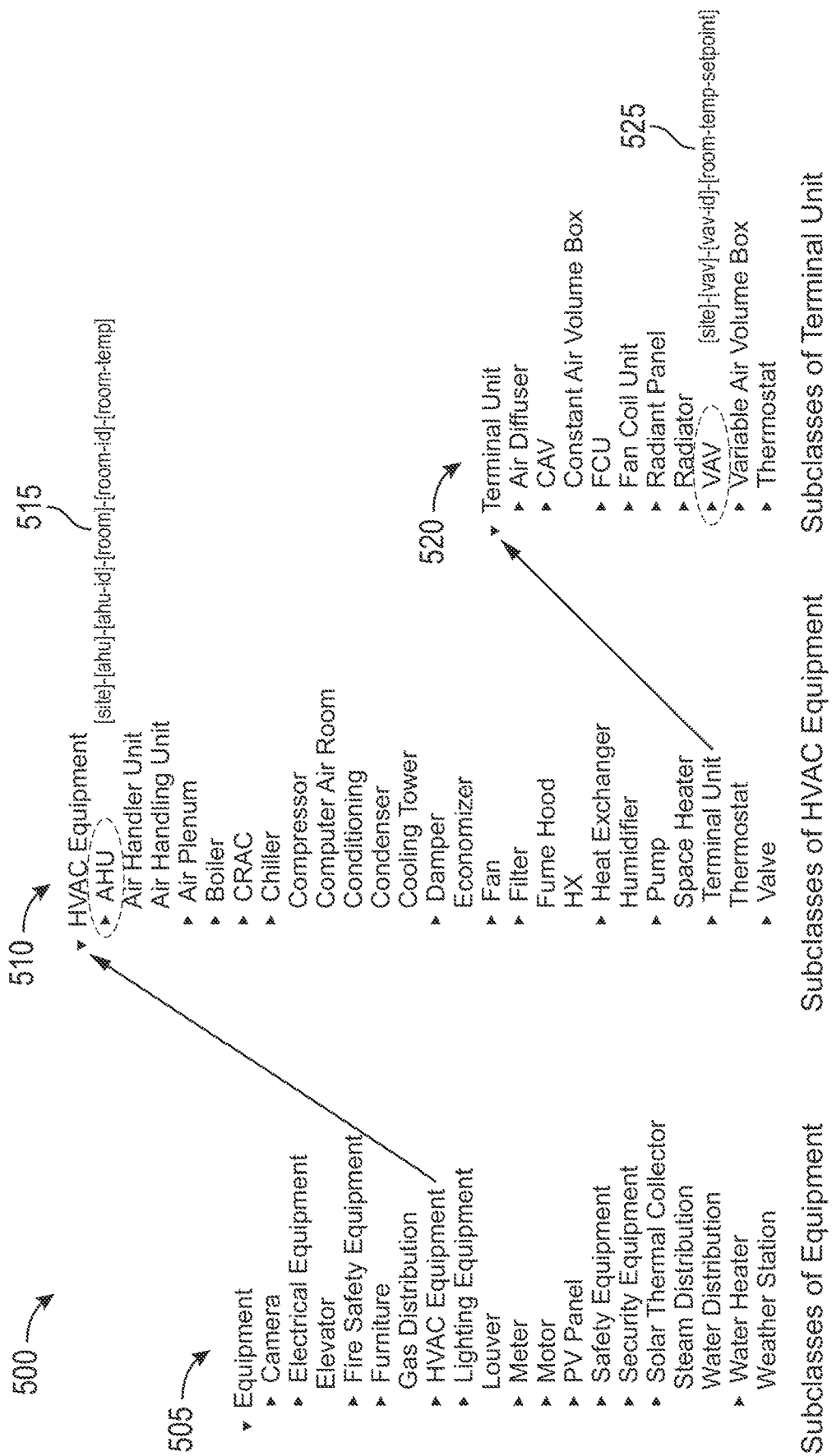
FIG. 5 is a schematic diagram of classes of a graph schema, according to an exemplary embodiment.

FIG. 5 is a schematic diagram of classes of a graph schema 500, according to an exemplary embodiment. The graph schema 500 can include various classes such as building classes, space classes, equipment classes, people classes, point classes, or a variety of other categories of classes. The graph schema 500 can include subclasses of particular categories of class. For example, the equipment class can include subclasses 505. The subclasses of the equipment class can indicate specific types of classes, e.g., cameras, electrical equipment, elevators, fire safety equipment, HVAC equipment, etc. Furthermore, the specific subclasses 505 can include further subclasses 510. For example, the HVAC equipment can include AHUs, boilers, chillers, terminal units, etc. Furthermore, the specific types of equipment of the subclasses 510 can include further subclasses 520. For example, the terminal unit subclass can include air diffusers, radiant panels, radiators, VAVs, etc. In FIG. 5, a tag-set 515 is shown mapped to an AHU class by the embedding manager 145 or the timeseries analyzer 150. Furthermore, a tag-set 525 is shown mapped to a VAV class by the embedding manager 145 or the timeseries analyzer 150.

Figure 6:
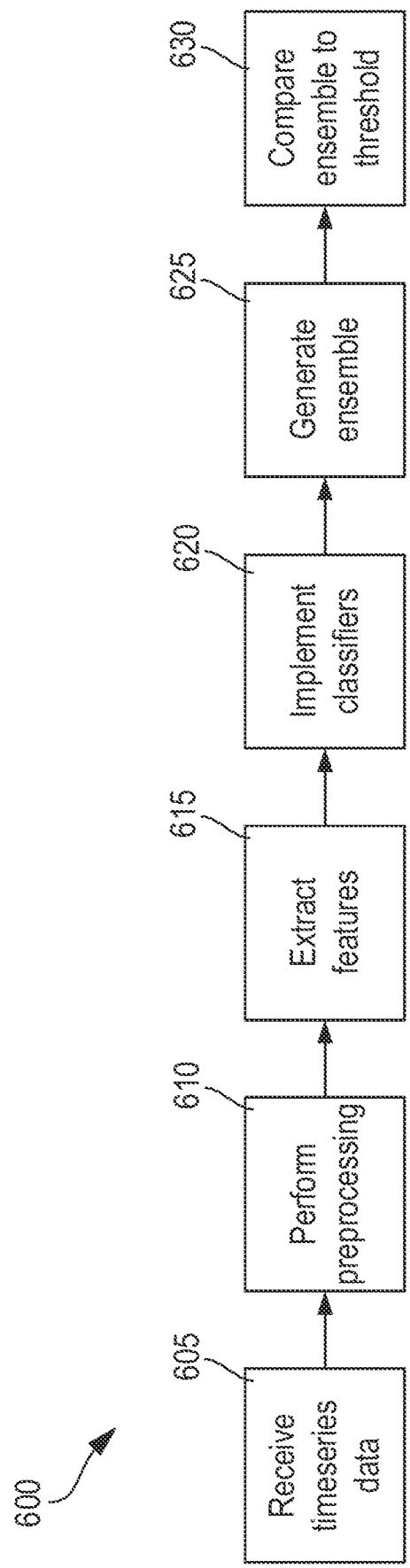
FIG. 6 is a flow diagram of a process of mapping points to classes of a graph schema based on timeseries data for the points, according to an exemplary embodiment.

Referring now to FIG. 6, a process 600 of mapping points to classes of a graph schema based on timeseries data for the points is shown, according to an exemplary embodiment. The process 600 can include receiving timeseries data. The process 600 can include performing preprocessing. The process 600 can include extracting features. The process 600 can include implementing classifiers. The process 600 can include generating an ensemble. The process 600 can include comparing the ensemble to the threshold. At least one step of the process 600 can be performed by the building system 105, a computing system, a computing platform, a cloud platform, a server system, etc. At least one step of the process 600 can be performed by a single computing system or distributed across multiple computing systems. At least one step of the process 600 can be performed by the timeseries analyzer 150.

In the step 605, the process 600 can include receiving, by the building system 105, timeseries data 130. For example, the timeseries analyzer 150 can receive the timeseries data 130 from the building equipment 110 or from another database or data storage system (e.g., the memory devices 120) that store the timeseries data 130. The timeseries analyzer 150 can receive data (e.g., a command, an indication, a flag, a signal, etc.) to classify a point (or a tag mapped to the point) to a class of the graph schema responsive to the process 400 reaching the step 450, e.g., a maximum similarity between an embedding of a tag being and a class being less than a threshold. Furthermore, the timeseries analyzer 150 can receive the data to classify the point if two factor validation of the point mapping is needed. The timeseries analyzer 150 can check the accuracy or correctness of the tag mappings 195 generated by the embedding manager 145.

In the step 610, the process 600 can include performing, by the building system 105, preprocessing. The timeseries analyzer 150 can apply one or multiple preprocessing operations to the timeseries data 130. The preprocessing operations can include data selection, pruning, normalization, interpolation, extrapolation, noise reduction, outlier detection and removal, or any other preprocessing operation. In the step 615, the process 600 can include extracting, by the building system 105, features. The timeseries analyzer 150 can extract features from the timeseries data 130. For example, the timeseries analyzer 150 can extract features from the preprocessed timeseries data 130. The timeseries analyzer 150 can apply a computer process to extract the features from the timeseries data 130 such as a principal component analysis (PCA) or a neural network such as a LSTM or a convolutional neural network (CNN). The features can be or include seasonal indices, data groupings, averages, frequency components, etc.

In the step 620, the process 600 can include implementing, by the building system 105, classifiers. The timeseries analyzer 150 can apply pre-trained point type models. The pre-trained models can map the timeseries for a point to a point type or a class of the graph schema. The models can include feedforward classifiers, XGBoost classifiers, support vector machines (SVMs), neural networks, or any other type of classifier. The timeseries analyzer 150 can implement models in an order based on similarities for each tag and each class determined by the embedding manager 145 and the class that the particular models predict. Models that predict one or more classes associated with a high level of similarity to tag can be applied to the timeseries data 130 first. Models that predict one or more classes associated with a low level of similarity to the tag can be applied to the timeseries data 130 later.

In the step 625, the process 600 can include generating, by the building system 105, an ensemble. The ensemble can be a value or set of values that is based can combine the output of one or multiple classifiers, the output indicating whether a tag or point should be mapped to a particular class. The outputs may all indicate a probability, likelihood, or classification level to a single class of the graph schema. The timeseries analyzer 150 can generate an ensemble by selecting a maximum level from all of the levels, the timeseries analyzer 150 can generate a value that combines the levels of the classifiers, for example, an average, a weighted average, etc. Furthermore, the timeseries analyzer 150 can process the levels through another model to generate an ensemble, e.g., process the levels through a neural network or another classifier.

Figure 7:
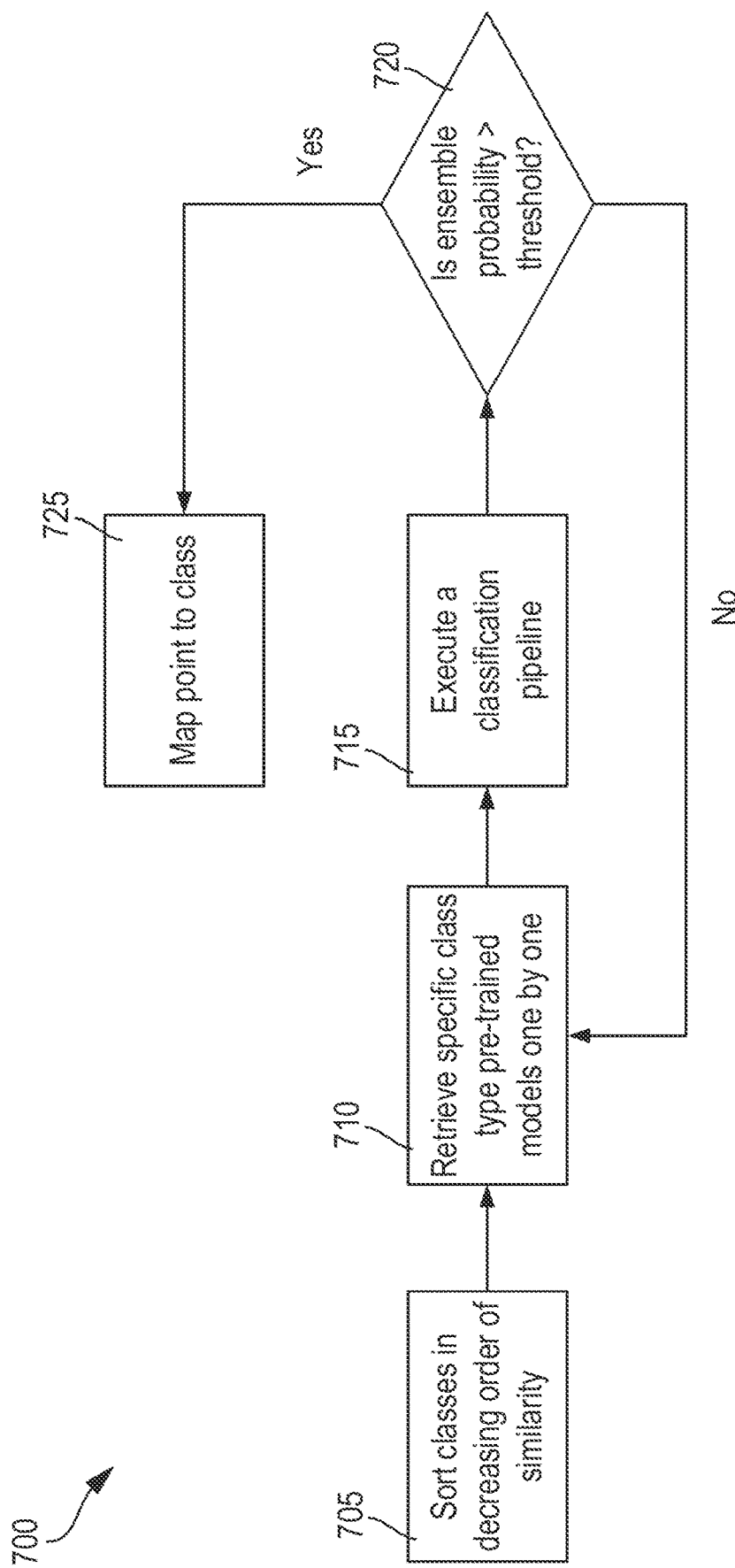
FIG. 7 is a flow diagram of a process of mapping points to classes of a graph schema based on a similarity between tags and classes, according to an exemplary embodiment.

Referring now to FIG. 7, a process 700 of mapping points to classes of a graph schema based on a similarity threshold between tags and classes is shown, according to an exemplary embodiment. The process 700 can include a step 705 of sorting classes in decreasing order of similarity. The process 700 can include a step 710 of retrieving specific class type pre-trained models one by one. The process 700 can include a step 715 of executing a classification pipeline. The process 700 can include a step 720 of determining if an ensemble probability is greater than a threshold. The process 700 can include a step 725 of mapping points to classes. At least one step of the process 700 can be performed by the building system 105, a computing system, a computing platform, a cloud platform, a server system, etc. At least one step of the process 700 can be performed by a single computing system or distributed across multiple computing systems. At least one step of the process 700 can be performed by the timeseries analyzer 150.

The process 700 can be performed by the timeseries analyzer 150 responsive to the embedding manager 145 not mapping the tags or tag-sets to classes of the graph schema.

The embedding manager 145 may not be able to map the tags or tag-sets to classes of the graph schema because of an incorrect word ordering in the tag sets, spelling mistakes in point names, and incomplete mapping of point names to tags. For example, such an issue may cause an embedding similarity between a tag or tag-sets and a particular class.

In step 705, the process 700 can include sorting, by the building system 105, classes in decreasing order of similarity. The timeseries analyzer 150 can rank classes of the graph schema in decreasing order of probability or likelihood of being mapped to a specific point or tag. The timeseries analyzer 150 can retrieve the similarities between a tag associated with a point being analyzed in the process 700. The probabilities can be retrieved or received from the embedding manager 145. The probabilities can be the probabilities generated by the embedding manager 145 comparing embeddings of the tag to embeddings of the classes. The decreasing order of probabilities of the classes can be used by the timeseries analyzer 150 to generate an order to select and execute models. Each model can correspond to classifying the timeseries data 130 into one class. Each model can be linked to one particular class. The timeseries analyzer 150 can generate an order to execute the models. The order can be the ranking of classes. The order can be a sequence of models ordered based on models associated with a greatest similarity to lowest similarity. By ordering the models based on similarity between a tag and each class, the model with the highest probability of predicting the class can be executed first and a model with a lowest probability of predicting the class can be executed last.

In step 710, the process 700 can include retrieving, by the building system 105, specific class type pre-trained models one by one. The timeseries analyzer 150 can retrieve, from storage, a model repository, or a model store, models one by one. The pre-trained point type models can already be trained on temperature data, pressure data, setpoints or other types of timeseries data. Each model can be specific to a particular class of the graph schema. The model can be pre-trained, e.g., previously trained to classify timeseries data 130 to the particular class. The timeseries analyzer 150 can retrieve the model from the memory devices 120. The timeseries analyzer 150 can retrieve the models one at a time based on the order of models or order of classes generated at step 705. A first iteration of the process 700, the timeseries analyzer 150 can retrieve a first model in the order of models or a first model that classifies the timeseries data 130 to a class associated with a highest similarity to the tag. Upon a second iteration of the process 700, the timeseries analyzer 150 can retrieve a second model in the order of models or a second model that classifies the timeseries data 130 to a class associated with a next highest similarity to the tag. The iterations of the process 700 and the models can be applied one by one until a classification to the class of the graph schema for the point or tag is found. Sometimes more than one point type models are evaluated until point type classification is successful.

In step 715, the process 700 can include executing, by the building system 105, a classification pipeline. The timeseries analyzer 150 can execute the classification pipeline by applying the model retrieved at the step 710. The classification pipeline can include receiving timeseries data, performing preprocessing, extracting features, implementing classifiers, generating ensembles. The classification pipeline can include one or multiple steps of the process 600 described with reference to FIG. 6.

In step 720, the process 700 can include determining, by the building system 105, whether an ensemble probability is greater than a threshold. The result of executing the classification pipeline, by the timeseries analyzer 150, can be an ensemble probability that a tag or point is classified to a particular class associated that the model or models of the classification pipeline classify points or tags into. If the ensemble probability is less than the threshold, the process 700 can return to step 710 to retrieve a next specific class type pre-trained model to execute. The next selected model can be a next model in the order of models to execute. The next selected model can be associated with a next highest similarity between a tag and a particular class. If the ensemble probability is greater than the threshold, the process 700 can proceed to the step 725. In the step 725, the process 700 can include mapping, by the building system 105, the point to the class. The timeseries analyzer 150 can map the point to the class of the model executed at the step 715 that produces an ensemble probability greater than the threshold. The timeseries analyzer 150 can generate a tag mapping 195. The tag mapping 195 can include data that indicates a mapping between the tag associated with the point analyzed in the process 700 and the class.

Figure 8:
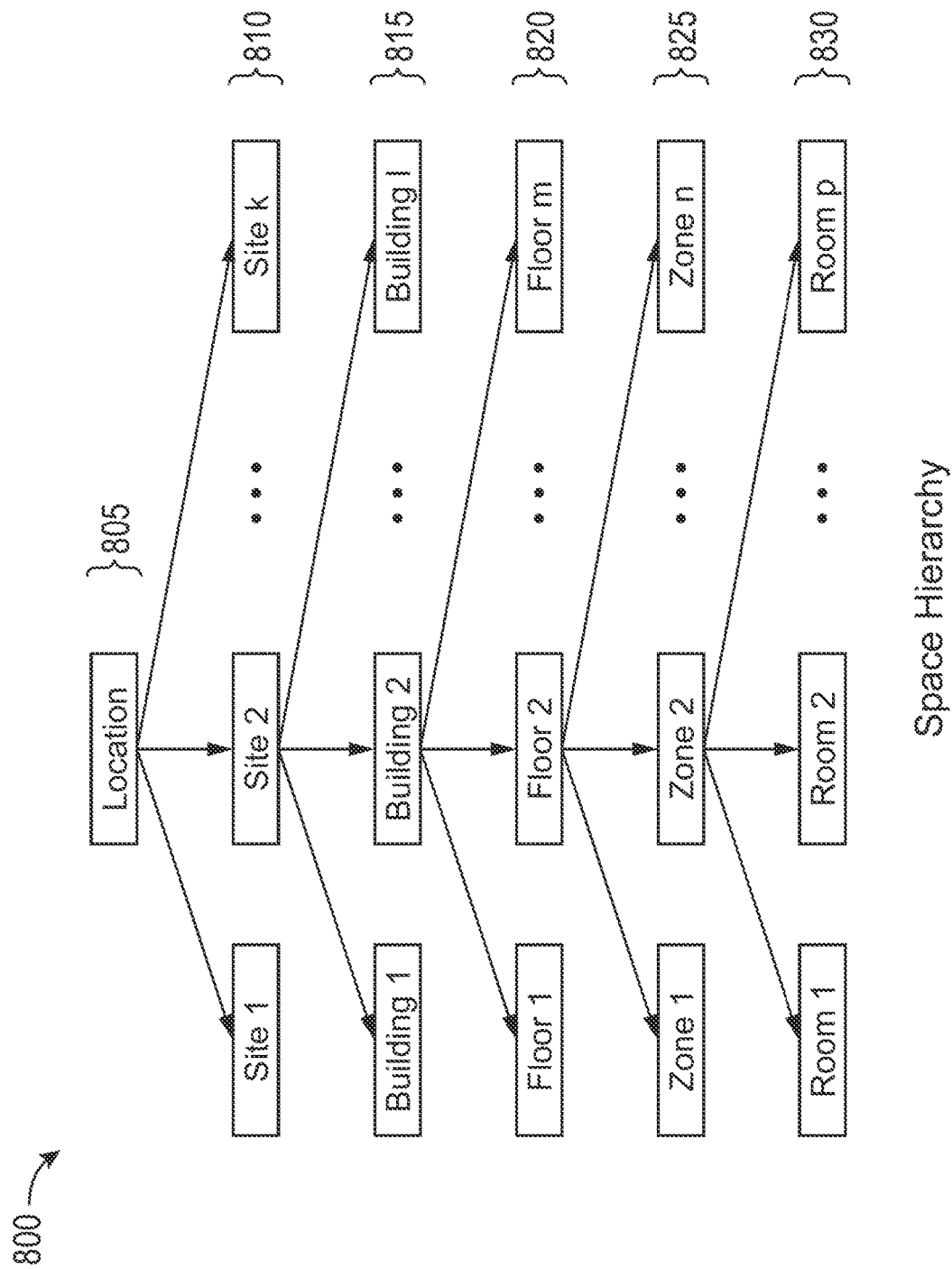
FIG. 8 is a schematic diagram of a space hierarchy of a building, according to an exemplary embodiment.

Referring now to FIG. 8, a schematic diagram of a space hierarchy 800 of a building is shown, according to an exemplary embodiment. The space hierarchy 800 can be a model. The space hierarchy 800 can representing a location 805 at a first level of the space hierarchy 800. The location can be a geographic area, a state, a country, etc. The space hierarchy 800 can include sites 810. Sites 810 can be different campuses, groups of buildings, or other small collection of buildings. The space hierarchy 800 can include buildings 815 at a lower level of the hierarchy. The buildings 815 can be buildings of particular sites and can be linked to the particular sites via the space hierarchy 800. The space hierarchy 800 can include floors 820. The floors 820 can be floors of particular buildings and can be linked to the particular buildings by the space hierarchy 800. The space hierarchy 800 can include zones 825. The zones 825 can be areas of particular floors, e.g., groups of rooms, hallways, conference rooms, spaces, etc. The zones 825 of the space hierarchy 800 can be zones of particular floors. The zones 825 can be linked by the space hierarchy 800 to specific floor. The space hierarchy 800 can include rooms 830. The rooms 830 can be rooms of particular zones 825 and can be linked to the particular zones 825 via the space hierarchy 800.

The space hierarchy 800 can be one type of assumption that the relationship identifier 155 takes in identifying spatial relationships 174 between tag mappings 195. For example, because the spaces of the space hierarchy 800 are in a hierarchical format, the relationship identifier 155 can perform hierarchical clustering to identify relationships 175 between the spaces.

Figure 9:
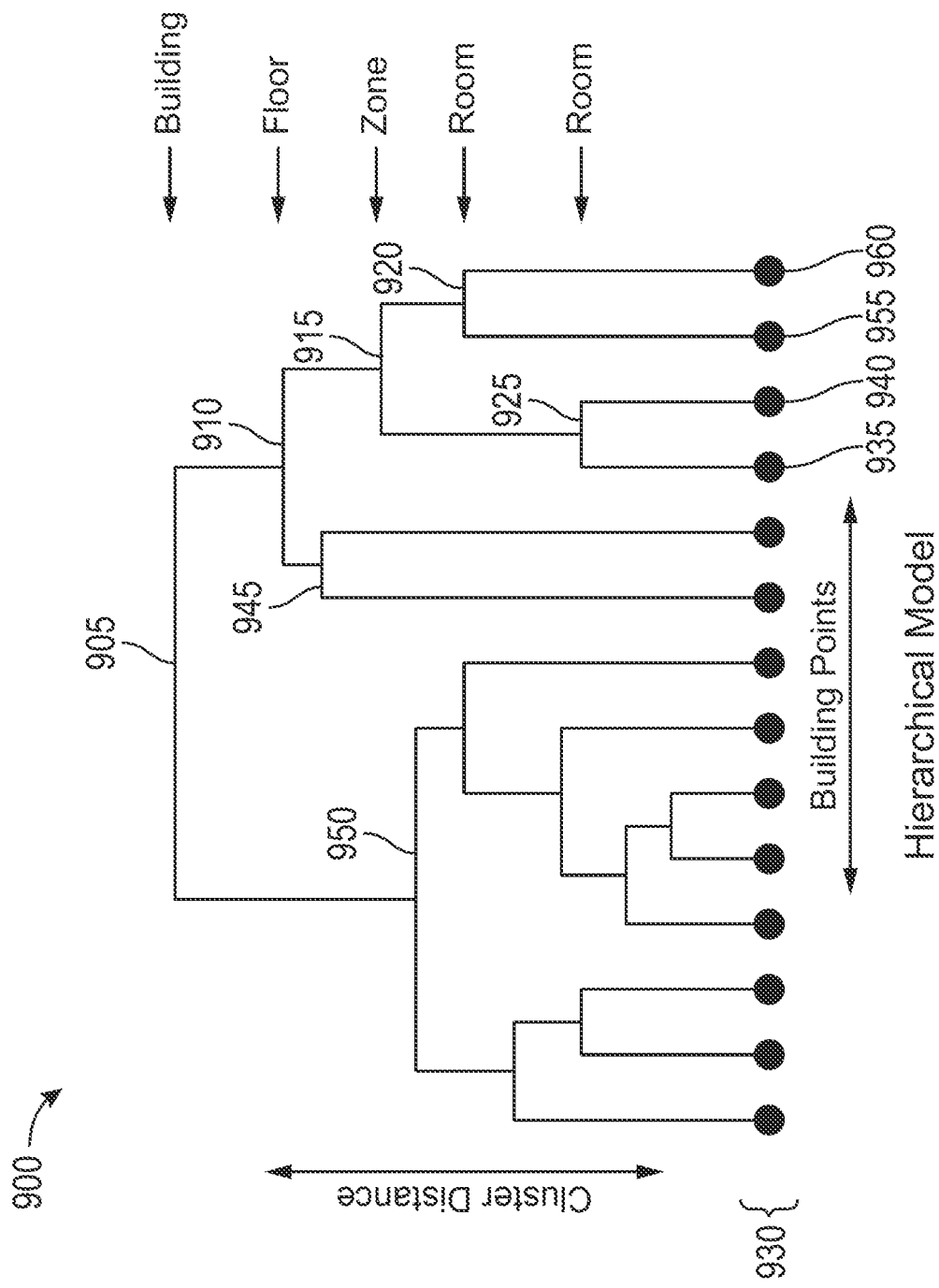
FIG. 9 is a schematic diagram of points clustered to identify spatial relationships, according to an exemplary embodiment.

Referring now to FIG. 9, is a hierarchical model 900 of points clustered to identify spatial relationships is shown, according to an exemplary embodiment. The cluster analyzer 160 can perform a hierarchical clustering to generate the hierarchical model 900. The cluster analyzer 160 can perform multiple iterations of clustering the points 930. The cluster analyzer 160 can match clusters together based on a cluster distance which is based on feature differences between the points. The features can be features included within the point data 125 and/or the timeseries data 130 such as point names, associated tags or tag sets, point text, descriptions of point types, units of measure for the point, etc.

At a first iteration of the clustering, the cluster analyzer 160 can treat each individual point 960 as a cluster at a first level of a hierarchy and match two points 930 together. For example, the cluster analyzer 160 can match the point 955 with the point 960 to form a new cluster 925 representing a room. The cluster analyzer 160 can match a point 955 with a point 960 to form a new cluster 920 representing a room. At each subsequent iteration, the cluster can be paired to form new clusters at a new higher level of the hierarchy model 900. For example, the clusters 925 and 920 can be paired to form a cluster 915. At another iteration, the cluster 945 and 915 can be paired to form a cluster 910. At a subsequent iteration, a cluster 950 and the cluster 910 can be paired. When the cluster 950 and 905 are paired, all of the points 930 are linked together and the highest level cluster has been formed. The cluster analyzer 160 can stop performing iterations once the highest level cluster is formed, i.e., once all points 930 are linked.

Based on the hierarchical model 900, the cluster analyzer 160 can identify various clusters to represent various classes of the graph schema. The cluster analyzer 160 can use the space hierarchy 800 to map each cluster to a class of the graph schema. For example, the cluster 905 can represent a building. The cluster 910 can represent a floor. The cluster 915 can represent a zone. The cluster 920 can represent a room. The cluster 925 can represent another room. In view of the hierarchical model 900, the cluster analyzer 160 can identify a relationship between each mapped tag representing the points 930 and the room, zone, floor, or building that the point is mapped to. For example, if point 960 has a point name "ZNT" that is mapped to the tag "zone temperature" which is mapped to a class of the graph schema representing the zone temperature, the cluster analyzer 160 can generate a relationship between an instance of the class of the graph schema representing the zone temperature and an instance of the graph schema representing the room. Similarly, the cluster analyzer 160 can generate relationships between the spaces identified based on the hierarchical model 900. For example, the cluster analyzer 160 can generate a relationship between the zone indicated by the cluster 915 and the room indicated by the cluster 920. The cluster analyzer 160 can generate a relationship between a floor indicated by the cluster 910 and the zone indicated by the cluster 915. The cluster analyzer 160 can generate a relationship between the building indicated by the cluster 905 and the floor indicate by the cluster 910.

Figure 10:
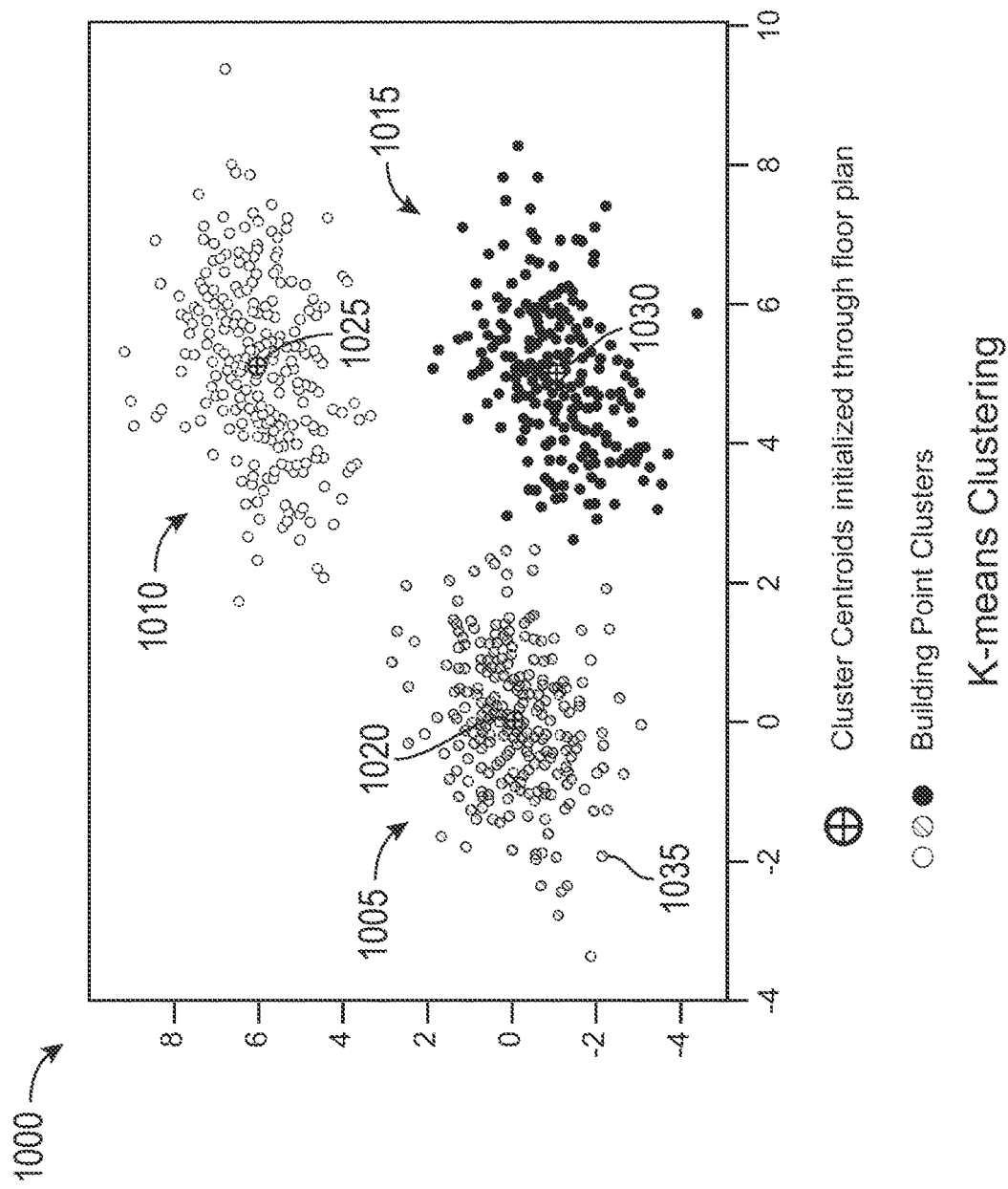
FIG. 10 is a schematic diagram of points clustered around cluster centroids informed based on building layout data of a building, according to an exemplary embodiment.

Referring now to FIG. 10, schematic diagram 1000 of points clustered around cluster centroids 1020-1030 informed based on building layout data of a building is shown, according to an exemplary embodiment. The building layout cluster analyzer 165 can instantiate centroids 1020-1030 to represent different rooms, zones, floors, buildings, sites, or locations indicated by the building layout data. The building layout cluster analyzer 165 can cluster the points based on features including point names, associated point tag sets, point text description fields such as point type, unit of measure, etc. The points can be clustered with centroids 1020-1030 that the points have the most spatial relationship to. The building layout cluster analyzer 165 can iteratively adjust the centroids 1020-1030 and reassign the points to the centroids 1020-1030 until the points no longer change from cluster to cluster. The final clusters can be saved. The building layout cluster analyzer 165 can be run multiple times and each final cluster saved and compared against each other. A cluster with the lowest variance can be saved as the final cluster. The resulting clusters, 1005, 1010, and 1030 can represent spaces. Each point can be assigned to one of the clusters 1005, 1010, and 1030. For example, a point 1035 can be assigned to the cluster 1005. The building layout cluster analyzer 165 can generate a relationship between an instance of a class that the point 1035 is mapped to and the space represented by the cluster 1005.

Figure 11:
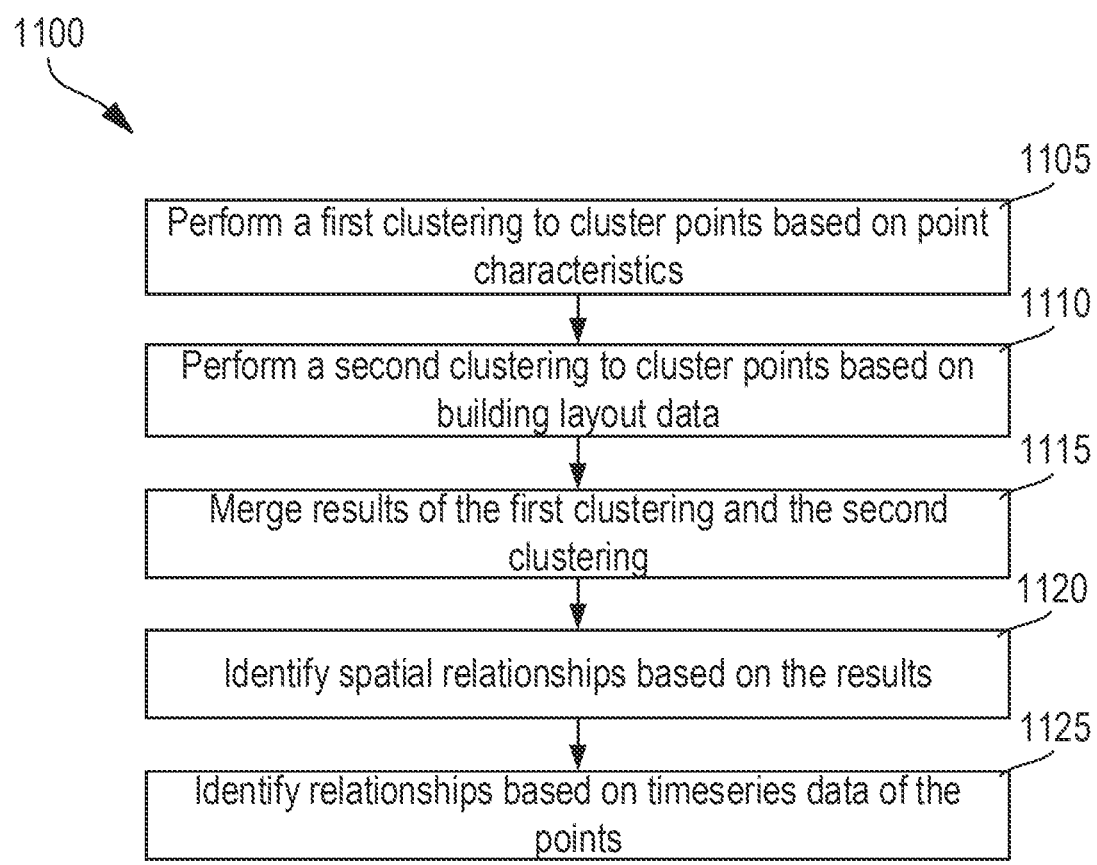
FIG. 11 is a flow diagram of a process of performing clustering to identify relationships in a graph schema, according to an exemplary embodiment.

Referring now to FIG. 11, a process 1100 of performing clustering to identify relationships in a graph schema is shown, according to an exemplary embodiment. The process 1100 can include a step 1105 of performing a first clustering to cluster points based on point characteristics. The process 1100 can include a step 1110 of performing a second clustering to cluster points based on building layout data. The process 1100 can include a step 1115 of merging results of the first clustering and the second clustering. The process 1100 can include a step 1120 of identifying spatial relationships based on the results. The process 1100 can include a step 1125 of identifying functional relationships based on timeseries data of the data points. At least one step of the process 1100 can be performed by the building system 105, a computing system, a computing platform, a cloud platform, a server system, etc. The steps of the process 1100 can be performed by a single computing system or distributed across multiple computing systems. At least one step of the process 1100 can be performed by the relationship identifier 155, the cluster analyzer 160, the building layout cluster analyzer 165, and the device pattern identifier 170.

In the step 1105, the process 1100 can include performing, by the building system 105, a first clustering to cluster points based on point characteristics. The cluster analyzer 160 can cluster points based on the point data 125 to cluster points together based on their levels of spatial similarity. For example, the cluster analyzer 160 can perform hierarchical clustering to cluster the points. The hierarchical clustering can iteratively pair clusters together, starting with each point being its own cluster, until all of the points are connected through the hierarchy. Each level of the hierarchy can be identified as its own space and the points clustered under those levels can be identified as being located as in those spaces. The hierarchical clustering can identify natural clusters of the points.

In the step 1110, the process 1100 can include performing, by the building system 105, a second clustering to cluster points based on building layout data. The building layout cluster analyzer 165 can perform clustering based on spatial layout data of a building or multiple buildings. For example, the building layout cluster analyzer 165 can identify centroids for a clustering process. The building layout cluster analyzer 165 can cluster points based on a distance between each point and the centroids. The building layout cluster analyzer 165 can iteratively adjust the centroids until the points remain within each cluster.

In the step 1115, the process 1100 can include merging, by the building system 105, results of the first clustering and the second clustering. The merging can include comparing, by the relationship identifier 155, the point clusters of the first clustering and the point clusters of the second clustering. For example, the relationship identifier 155 can identify whether points clustered to a particular space are the same or different between the first clustering and the second clustering. The relationship identifier 155 can determine that clusters of the first clustering and the second clustering that have corresponding points are describing the same space (e.g., the clusters intersect). Clusters that appear in one clustering but not the other clustering can be identified as distinct spaces. For example, if there are clusters with one or only a few points, an isolated cluster can be identified as its own space or alternatively ignored or removed.

The relationship identifier 155 can generate a confidence, for each point, based on whether the first clustering and the second clustering confirm the point being spatially related to a particular space or are in disagreement. If the first clustering and the second clustering both indicate that the point should be clustered to a particular space, the confidence may be high. If the first clustering and the second clustering assign the point to different spaces, the confidence may be lower. If the confidence of a point having a spatial relationship to a particular space is low, e.g., less than a particular level, the point can be surfaced to a user via a user device for manual classification.

In the step 1120, the process 1100 can include identifying, by the building system 105, spatial relationships 175 based on the results. For example, the relationship identifier 155 can identify the spatial relationships 175 between points or the tags that the points are mapped to and spaces. The spaces can be identified based on the clusters. The spaces can be identified as separate points. The relationship identifier 155 can identify, based on the result or based on the first clustering or the second clustering individually, the cluster that each point is related to and the space that each cluster represents. The relationship identifier 155 can generate a spatial relationship between each point, tag, or instance of a class in the graph schema representing the point or tag and the space.

In the step 1125, the process 1100 can include identifying, by the building system 105, relationships 175 based on timeseries data 130 of the points. The relationship identifier 155 can identify isolated clusters of the result, the first clustering, or the second clustering. The isolated clusters can include one or only a few points (e.g., less than a particular number of points). The relationship identifier 155 can search for points assigned to larger clusters that affect points in the isolated cluster. For example, the device pattern identifier 170 can identify, based on a particular timeseries pattern, that a first point and a second point are associated with data that is spatially related or functionally related. Based on the identified association, the device pattern identifier 170 can generate a spatial and/or functional relationship 175. The relationship identifier 155 can identify spatial and/or functional relationships 175 by analyzing the points with timeseries data 130.

For example, the relationship identifier 155 can identify that a light switch point is assigned to an isolated cluster. The relationship identifier 155 can identify that a motion sensor point is assigned to a large cluster representing a conference room. The device pattern identifier 170 can identify that, based on the timeseries data 130, there is an operational or behavioral pattern between the light switch point and the motion sensor point. For example, the light switch point turning a light on or off can be sensed by the motion sensor and a temporal operational/behavior pattern can be present in the timeseries data 130. The relationship identifier 155 can identify that, in view of the operational/behavioral pattern between the light switch point and the motion sensor point, that the light switch point and the motion sensor point should be related to the same space. The relationship identifier 155 can generate a relationship for the light switch point to the conference room that the motion sensor is located in. Furthermore, based on the operational/behavioral pattern, the relationship identifier 155 can generate a relationship 175 between the light switch point and the motion sensor point to indicate or a relationship 175 between the light switch point and a light in the conference room that the motion sensor point is located in.

Figure 12:
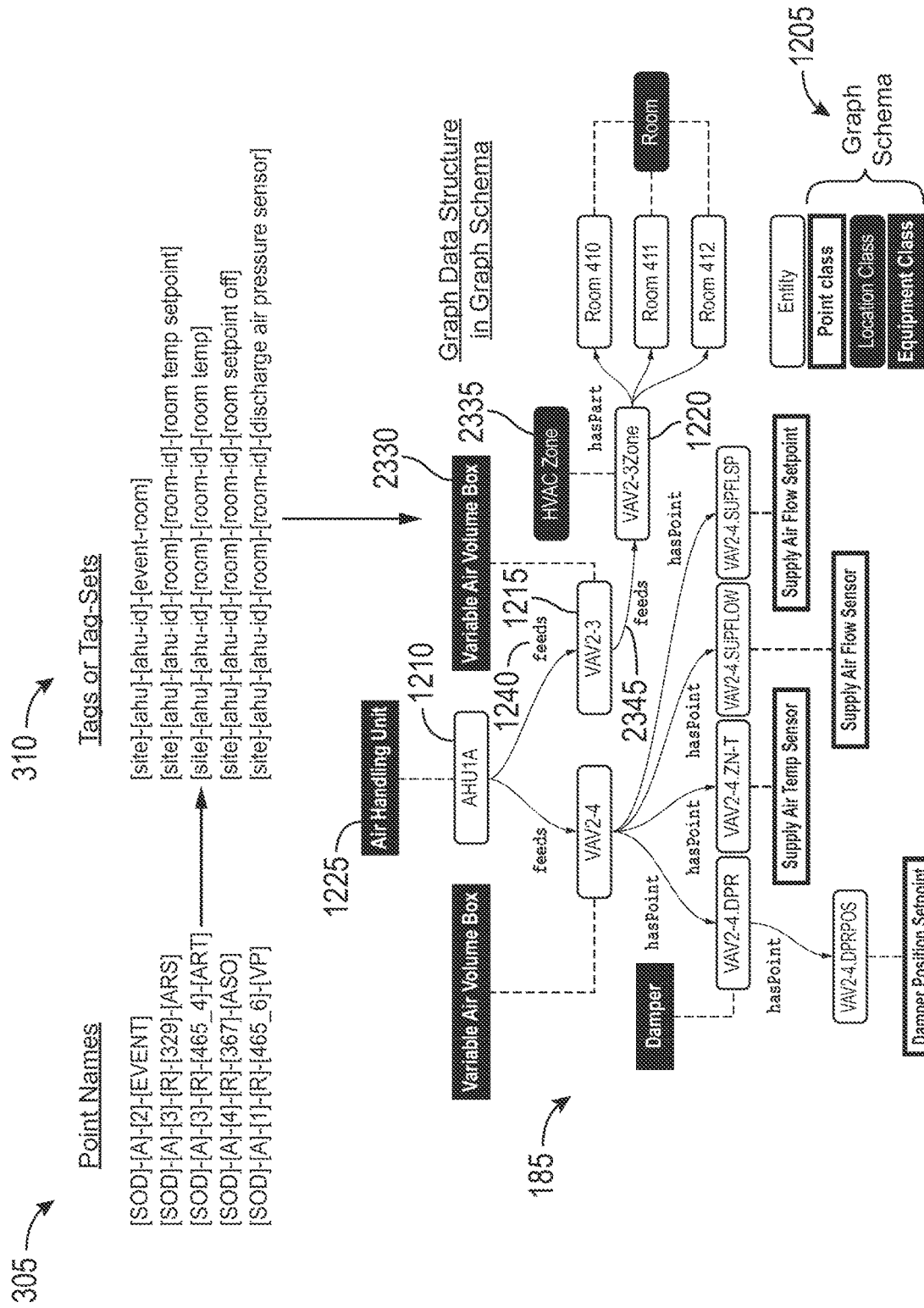
FIG. 12 a schematic diagram of points represented by point names mapped into tags or tag-sets and the tags or tag-sets mapped into a graph data structure of a graph schema, according to an exemplary embodiment.

FIG. 12 a schematic diagram of points represented by point names 305 mapped into tags or tag-sets 310, the tags or tag-sets 310 mapped into graph data structure 185 of a graph schema is shown, according to an exemplary embodiment. The graph data structure 185 can include nodes and edges. The nodes can represent entities, instances of classes of a graph schema 1205. For example, the nodes of the graph data structure 185 can include an "AHU1A" entity that is an instance of an air handling unit class 1225. The building system 105 can map a point representing the AHU1A into a tag or tag-set. The building system 105 can map the tag or tag-set to the air handling unit class 1225. The building system 105 can generate a node 1210 to represent an entity or instance of the air handling unit class 1225. For example, the nodes of the graph data structure 185 can include a "VAV2-3" entity that is an instance of an variable air volume box class 2330. The building system 105 can map a point representing the VAV2-3 into a tag or tag-set 310. The building system 105 can map the tag or tag-set 310 to the variable air volume box class 2330. The building system 105 can generate a node 1215 to represent an entity or instance of the variable air volume box class 2330. For example, the nodes of the graph data structure 185 can include a "VAV2-3Zone" entity that is an instance of an HVAC zone class 2335. The building system 105 can map a point representing the VAV2-3Zone into a tag or tag-set 310. The building system 105 can map the tag or tag-set 310 to the HVAC zone class 2335. The building system 105 can generate a node 1220 to represent an entity or instance of the HVAC zone class 2335.

The graph data structure 185 can include edges between the nodes. For example, the graph data structure 185 can include edges 2340 and an edge 2345. The device pattern identifier 170 can identify the relationship represented by the edge 2340 between the node 1210 and the node 1215. The edge 2340 can be identified based on the timeseries data 130. The device pattern identifier 170 can identify the edge 2340 by identifying an operational pattern or behavior between the AHU1A and the VAV2-3. For example, the timeseries data 130 can indicate that operations of the AHU affect conditions measured by the VAV2-3. For example, changing the speed of a fan of the AHU1A can affect the air pressure measured by the VAV2-3. This can indicate a functional relationship between the AHU1A and the VAV2-3, e.g., a control relationship. The device pattern identifier 170 can generate the "feeds" edge 2340 between the node 1210 and the 1215 based on the identified relationship.

The relationship identifier 155, e.g., the cluster analyzer 160 or the building layout cluster analyzer 165, can identify a spatial relationship between the VAV2-3 and the VAV2-3Zone. The relationship identifier 155 can perform clustering to identify that the VAV2-3 belongs to a cluster representing a particular HVAC zone, e.g., the VAV2-3Zone. Based on the identified relationship, the graph constructor 180 can generate an edge 2345 between the node 1215 and the node 1220.

Figure 13:
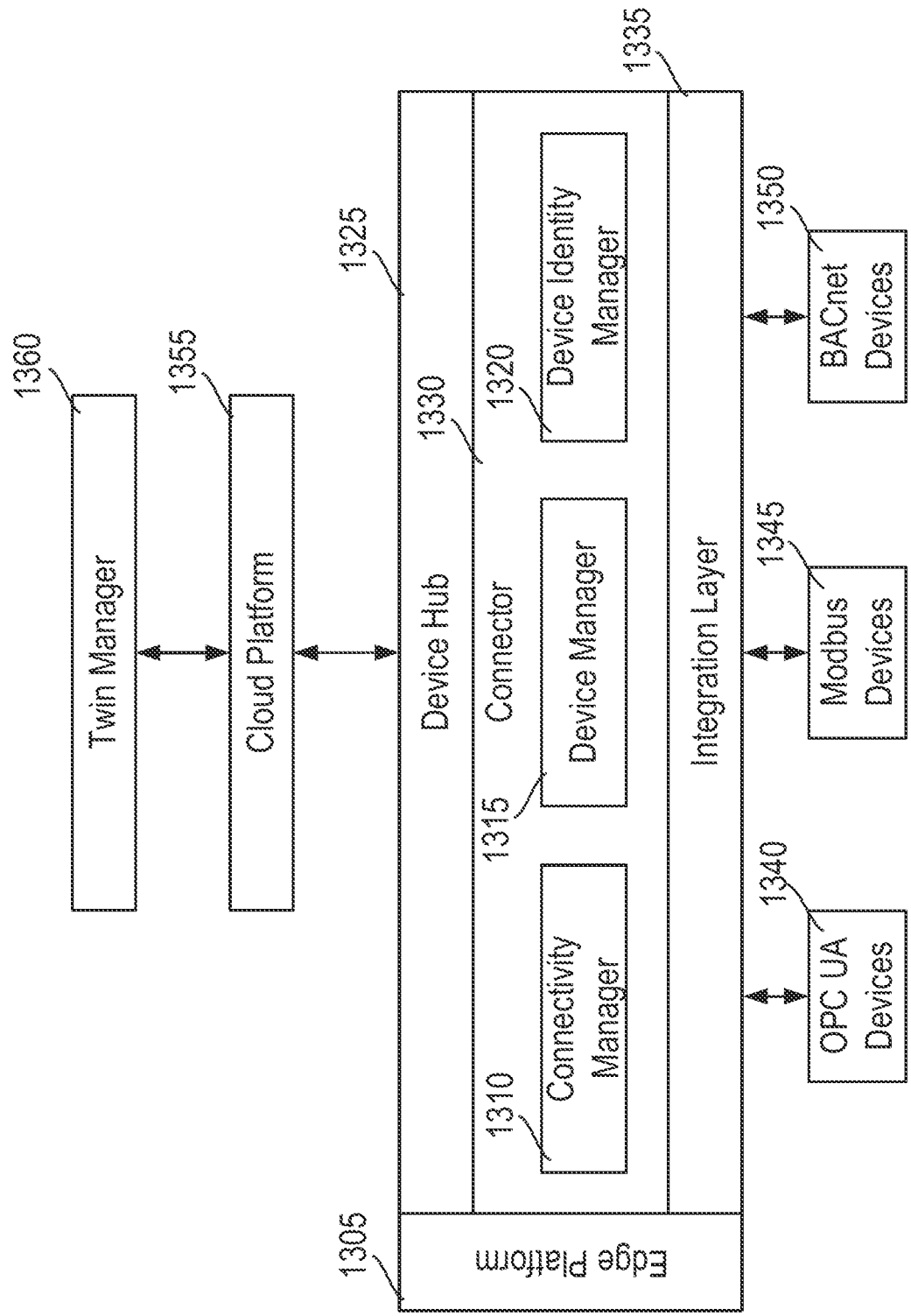
FIG. 13 is a block diagram of an edge platform including a connectivity manager, a device manager, and a device identity manager, according to an exemplary embodiment.

Referring now to FIG. 13, an edge platform 1305 is shown to include a connectivity manager 1310, a device manager 1315, and a device identity manager 1320, according to an exemplary embodiment. The edge platform 1305 shown in FIG. 13 can be a particular instance of the edge platform 1305 run on a computing device. For example, the edge platform 1305 could be instantiated one or multiple times on various computing devices of a building, a cloud, etc. Each instance of the edge platform 1305 can include the connectivity manager 1310, the device manager 1315, and/or the device identity manager 1320. These three components may serve as the core of the edge platform 1305. Examples of an edge platform are described in U.S. application Ser. No.

17/710,458 filed Mar. 31, 2022, the entirety of which is incorporated by reference herein.

The edge platform 1305 can include a device hub 1325, a connector 1330, and/or an integration layer 1335. The edge platform 1305 can facilitate communication between the devices 1340-1350 and a cloud platform 1355 and/or a twin manager 1360. The communication can be telemetry, commands, control data, etc. The cloud platform 1335 can be configured to facilitate communication and routing of messages between the applications, the twin manager 1360, the edge platform 1305, and/or any other system. The edge platform 1305 can be a gateway layer. The edge platform 1305 can be located within a building while the cloud platform 1355 can be located outside the building. The twin manager 1360 can be configured to manage and maintain a digital twin. The digital twin can be a digital representation of the physical environment, e.g., a building. Examples of a twin manager, a cloud platform, and an edge platform are described in U.S. patent application Ser. No. 17/134,661 filed Dec. 28, 2020, the entirety of which is incorporated by reference herein. The twin manager 1360 can be located outside the building. Both the twin manager 1360 and the cloud platform 1355 can be cloud based systems, server systems, computing devices, etc. that manage telemetry data that the edge platform 1305 receives from the devices 1340-1350 and communicates to the cloud platform 1355 and/or the twin manager 1360.

The devices 1340-1350 can be building devices that communicate with the edge platform 1305 via a variety of building protocols. For example, the protocol could be Open Platform Communications (OPC) Unified Architecture (UA), Modbus, BACnet, etc. The integration layer 1335 can integrate the various devices 1340-1350 through the respective communication protocols of each of the devices 1340-1350. The integration layer 1335 can dynamically include various integration components based on the needs of the instance of the edge platform 1305, for example, if a BACnet device is connected to the edge platform 1305, the edge platform 1305 may run a BACnet integration component. The connector 1330 may be the core service of the edge platform 1305. Every instance of the edge platform 1305 can include the connector 1330. The edge platform 1305 can be a light version of a gateway.

The connectivity manager 1310 can operate to connect the devices 1340-1350 with the cloud platform 1355 and/or the twin manager 1360. The connectivity manager 1310 can allow a device running the connectivity manager 1310 to connect with an ecosystem, the cloud platform 1355, another device, another device which in turn connects the device to the cloud, connects to a data center, a private on-premises cloud, etc. The connectivity manager 1310 can facilitate communication northbound (with higher level networks), southbound (with lower level networks), and/or east/west (e.g., with peer networks). The connectivity manager 1310 can implement communication via MQ Telemetry Transport (MQTT) and/or sparkplug. The operational abilities of the connectivity manager 1310 can be extended via a software development toolkit (SDK), and/or an API. The connectivity manager 1310 can handle offline network states with various networks.

The device manager 1315 can be configured to manage updates and/or upgrades for the device that the device manager 1315 is run on, the software for the edge platform 1305 itself, and/or devices connected to the edge platform 1305, e.g., the devices 1340-1350. The software updates could be new software components, e.g., services, new integrations, etc. The device manager 1315 can be used to manage software for edge platforms for a site, e.g., make updates or changes on a large scale across multiple devices. The device manager 1315 can implement an upgrade campaign where one or more certain device types and/or pieces of software are all updated together. The update depth may be of any order, e.g., a single update to a device, an update to a device and a lower level device that the device communication with, etc. The software updates can be delta updates, which are suitable for low-bandwidth devices. For example, instead of replacing an entire piece of software on the edge platform 1305, only the portions of the piece of software that need to be updated may be updated, thus reducing the amount of data that needs to be downloaded to the edge platform 1305 in order to complete the update.

The device identity manager 1320 can implement authorization and authentication for the edge platform 1305. For example, when the edge platform 1305 connects with the cloud platform 1355, the twin manager 1360, and/or the devices 1340-1350, the device identity manager 1320 can identify the edge platform 1305 to the various platforms, managers, and/or devices. Regardless of the device that the edge platform 1305 is implemented on, the device identity manager 1320 can handle identification and uniquely identify the edge platform 1305. The device identity manager 1320 can handle certification management, trust data, authentication, authorization, encryption keys, credentials, signatures, etc. Furthermore, the device identity manager 1320 may implement various security features for the edge platform 1305, e.g., antivirus software, firewalls, verified private networks (VPNs), etc. Furthermore, the device identity manager 1320 can manage commissioning and/or provisioning for the edge platform 1305.

Figure 14:
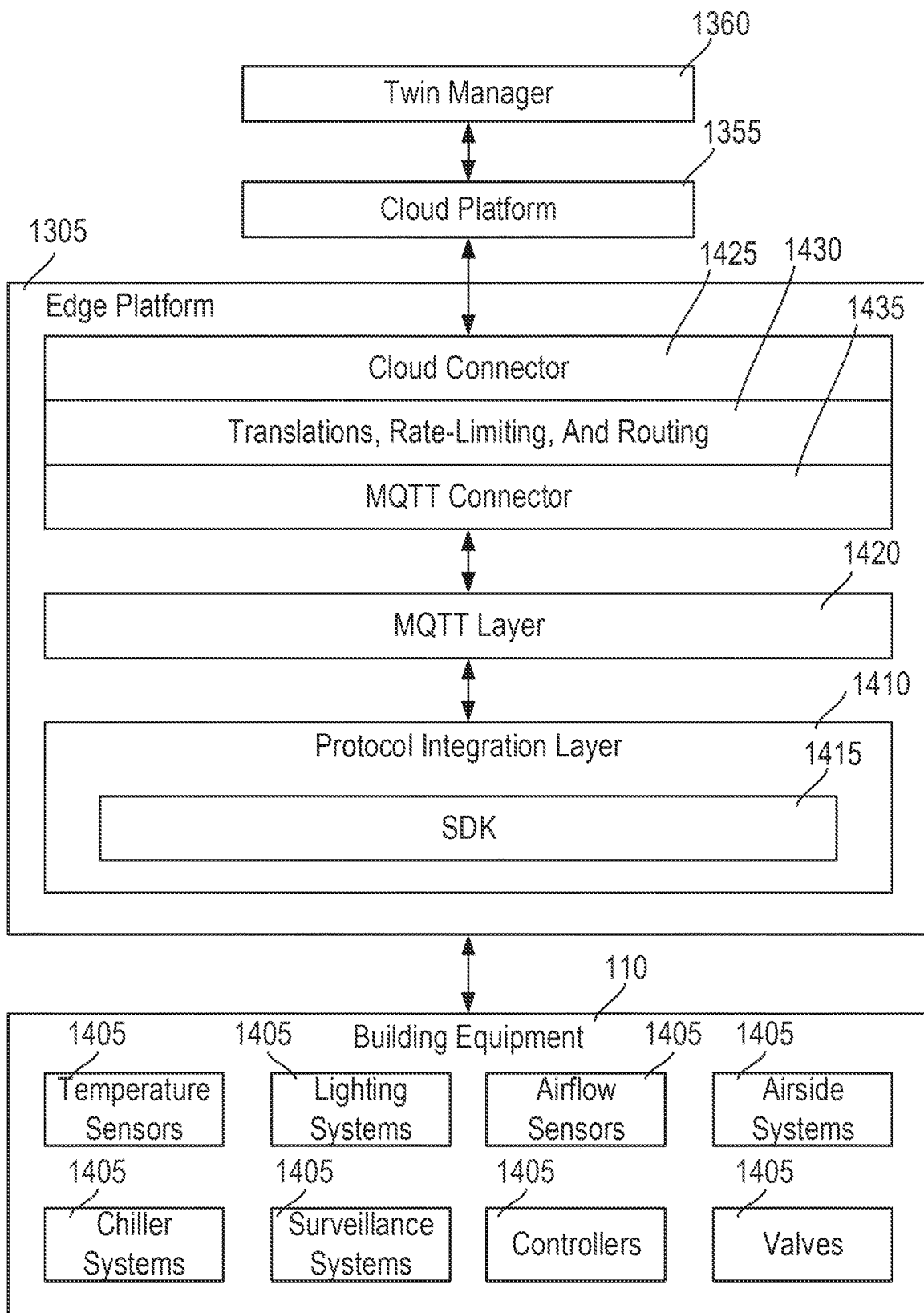
FIG. 14 is another block diagram of an edge platform including communication layers for facilitating communication between building equipment and a cloud platform and a twin manager, according to an exemplary embodiment.

Referring now to FIG. 14, another block diagram of the edge platform 1305 is shown in greater detail to include communication layers for facilitating communication between building equipment 110 and the cloud platform 1355 and/or the twin manager 1360, according to an exemplary embodiment. The building equipment 110 can include devices of various different building subsystems, e.g., HVAC subsystems, fire response subsystems, access control subsystems, surveillance subsystems, etc. The devices 1405 may include temperature sensors 1405, lighting systems 1405, airflow sensors 1405, airside systems 1405, chiller systems 1405, surveillance systems 1405, controllers 1405, valves 1405, etc.

The edge platform 1305 can include a protocol integration layer 1410 that facilities communication with the building equipment 110 via one or more protocols. The protocol integration layer 1410 can be dynamically updated with a new protocol integration responsive to detecting that a new device is connected to the edge platform 1305 and the new device requires the new protocol integration. The protocol integration layer 1410 can be customized through an SDK 1415.

The edge platform 1305 can handle MQTT communication through an MQTT layer 1420 and an MQTT connector 1435. The MQTT layer 1420 and/or the MQTT connector 1435 can handle MQTT based communication and/or any other publication/subscription based communication where devices can subscribe to topics and publish to topics. The MQTT connector 1435 can implement an MQTT broker configured to manage topics and facilitate publications to topics, subscriptions to topics, etc. to support communication between the building equipment 110 and/or with the cloud platform 1355.

The edge platform 1305 includes a translations, rate-limiting, and routing layer 1430. The layer 1430 can handle translating data from one format to another format, e.g., from a first format used by the building equipment 110 to a format that the cloud platform 1355 expects, or vice versa. The layer 1430 can further perform rate limiting to control the rate at which data is transmitted, requests are sent, requests are received, etc. The layer 1430 can further perform message routing. The cloud connector 1425 may connect the edge platform 1305, e.g., establish and/or communicate with one or more communication endpoints between the cloud platform 1355 and the cloud connector 1425.

Figure 15:
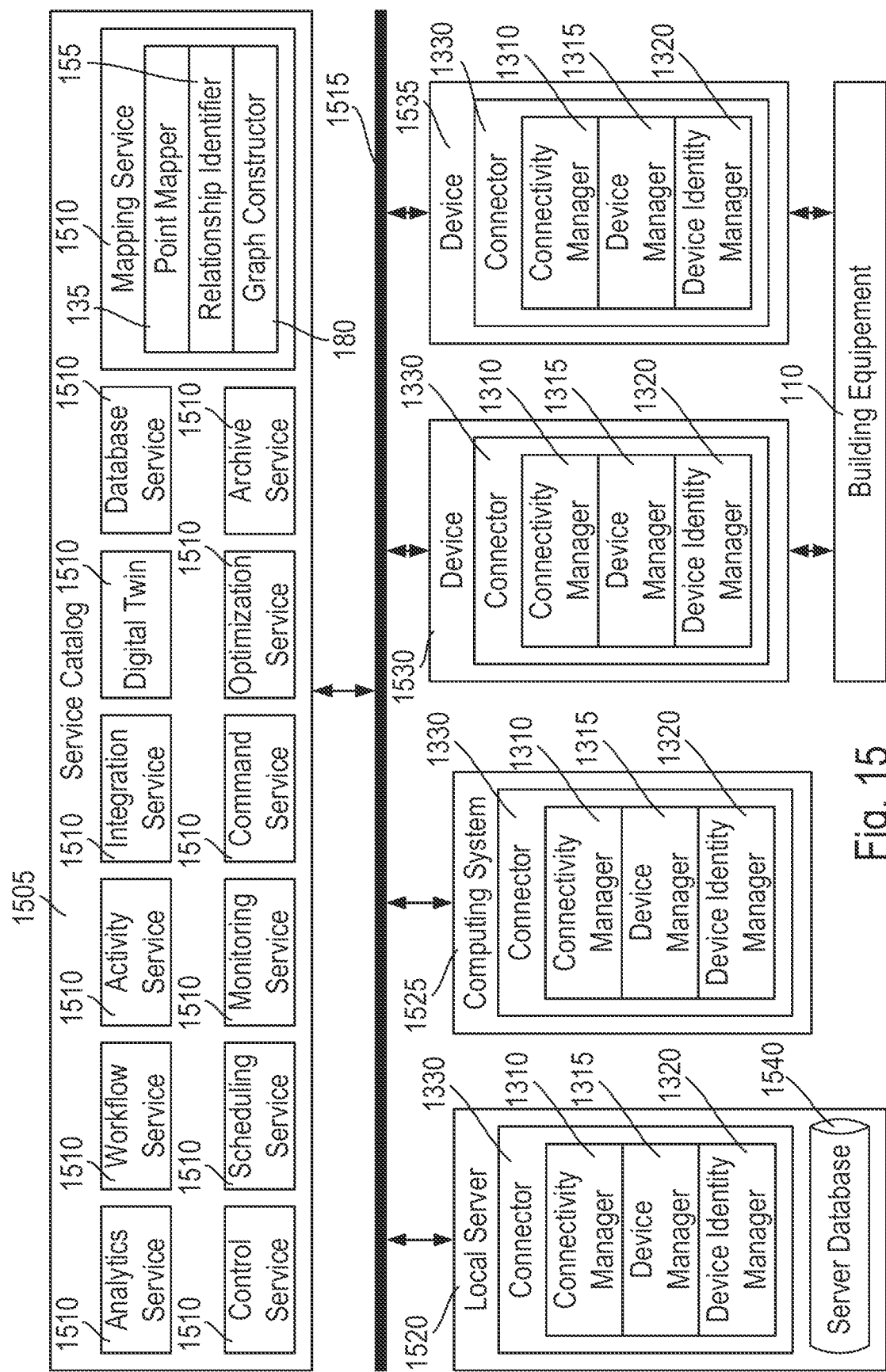
FIG. 15 is a block diagram of an edge platform shown distributed across building devices of a building, according to an exemplary embodiment.

Referring now to FIG. 15, a system where the edge platform 1305 is shown distributed across building devices of a building is shown, according to an exemplary embodiment. The local server 1520, the computing system 1525, the device 1530, and/or the device 1535 can all be located on-premises within a building. The various devices 1530 and/or 1535 can be gateway boxes. The gateway boxes may be the various gateways described in U.S. patent application Ser. No. 17/127,303 filed Dec. 18, 2020, the entirety of which is incorporated by reference herein. The computing system 1525 could be a desktop computer, a server system, a microcomputer, a mini personal computer (PC), a laptop computer, a dedicated computing resource in a building, etc. The local server 1520 may be an on-premises computer system that provides resources, data, services or other programs to computing devices of the building. The system of FIG. 15 includes a local server 1520 that can include a server database 1540 that stores data of the building.

The device 1530 and/or the device 1535 can implement gateway operations for connecting the devices of the building equipment 110 with the cloud platform 1355 and/or the twin manager 1360. The devices 1530 and/or 1535 can communicate with the building equipment 110, collect data from the building equipment 110, and communicate the data to the cloud platform 1355 and/or the twin manager 1360. The devices 1530 and/or the device 1535 can push commands from the cloud platform 1355 and/or the twin manager 1360 to the building equipment 110.

The systems and devices 1520-1535 can each run an instance of the edge platform 1305. The systems and devices 1520-1535 can run the connector 1330 which may include the connectivity manager 1310, the device manager 1315, and/or the device identity manager 1320. The device manager 1315 can control what services each of the systems and devices 1520-1535 run, e.g., what services from a service catalog 1505 each of the systems and devices 1520-1535 run.

The service catalog 1505 can be stored in the cloud platform 1355, within a local server (e.g., in the server database 1540 of the local server 1520), on the computing system 1525, on the device 1530, on the device 1535, etc. The various services of the service catalog 1505 can be run on the systems and devices 1520-1535. The services can further move around the systems and devices 1520-1535 based on the available computing resources, processing speeds, data availability, the locations of other services which produce data or perform operations required by the service, etc.

The service catalog 1505 can include an analytics service 1510 that generates analytics data based on building data of the building equipment 110, a workflow service 1510 that implements a workflow, and/or an activity service 1510 that performs an activity. The service catalog 1505 includes an integration service 1510 that integrates a device with a particular subsystem (e.g., a BACnet integration, a Modbus integration, etc.), a digital twin service 1510 that runs a digital twin, and/or a database service 1510 that implements a database for storing building data. The service catalog 1505 can include a control service 1510 for operating the building equipment 110, a scheduling service 1510 that handles scheduling of areas (e.g., desks, conference rooms, etc.) of a building, and/or a monitoring service 1510 that monitors a piece of equipment of the building equipment 110. The service catalog 1505 includes a command service 1510 that implements operational commands for the building equipment 110, an optimization service 1510 that runs an optimization to identify operational parameters for the building equipment 110, and/or achieve service 1510 that archives settings, configurations, etc. for the building equipment 110, etc.

The service catalog 1505 can include a mapping service 1510. The mapping service 1510 can include an instance of the point mapper 135, an instance of the relationship identifier 155, and/or an instance of the graph constructor 180. The mapping service 150 can be deployed to one of the systems or devices 1520-1535. For example, the mapping service 1510 could be deployed to the device 1530. The device 1530 can receive the point data 125 or the timeseries data 130 from the building equipment 110. The mapping service 150 can cause the instance of the point mapper 135, an instance of the relationship identifier 155, and/or an instance of the graph constructor 180 to execute on the point data 125 and/or the timeseries data 130. The device 1530 can perform all of the operations described with respect to FIGS. 1-12 by executing the mapping service 1510.

For example, the device 1530 can connect with one or multiple new pieces of building equipment 110. Responsive to connecting with the new piece of building equipment 110, the device 1530 can load the mapping service 1510 to be executed by the device 1530. For example, the device 1530 can load the mapping service 1510 from a storage device of the device 1530 into a memory device of the device 1530. The new piece of building equipment can be a piece of building equipment that is not described in the graph data structure 185. Responsive to connecting with the new piece of building equipment 110, the device 1530 can request and receive the mapping service 1510 from the service catalog 1505, from the local service 1520, from the computing system 1525, or from the device 1535. Responsive to connecting with the new piece of building equipment 110, the device 1530 can receive the point data 125 and the timeseries data 130 and provide the point data 125 and the timeseries data 130 to another system (e.g., the local server 1520, the computing system 1525, the device 1535) to execute the mapping service 1510.

The device 1530 can execute the mapping service 1510 and generate the graph data structure 185, or a portion of the graph data structure 185. At least a portion of the graph data structure 185 generated by the device 1530 can describe the new piece of building equipment 110, points of the new piece of building equipment 110, spatial relationships between the piece of building equipment 110 to various spaces of a building, relationships between the piece of building equipment 110 to other pieces of building equipment 110, etc. The device 1530 can communicate the generated graph data structure 185 (or at least a portion of the graph data structure 185) to the cloud platform 1355 and/or the twin manager 1360. The device 1530 can store the graph data structure 185 locally.

The device 1530 can use the graph data structure 185 to collect and communicate information to the cloud platform 1355 and/or the twin manager 1360. The information may be portions of the graph data structure 185 or information received from the new piece of building equipment 110. For example, while the device 1530 receives data events, data timeseries, telemetry, or other data elements, the device 1530 can communicate the data to the cloud platform 1355 and/or the twin manager 1360 based on the graph data structure 185. For example, the device 1530 can route the telemetry to the cloud platform 1355 and/or the twin manager 1360 based on the graph data structure 185. For example, messages communicated to the cloud platform 1355 and/or the twin manager 1360 can be tagged with information of the graph data structure 185 describing the class of the piece of building equipment, the node in the graph data structure 185 representing the piece of building equipment, related equipment to the piece of building equipment, a space that a measurement of the piece of building equipment 110 was taken in, etc.

The various systems 1520-1535 can realize technical advantages by implementing services of the service catalog 1505 locally and/or storing the service catalog 1505 locally. Because the services can be implemented locally, i.e., within a building, lower latency can be realized in making control decisions or deriving information since the communication time between the systems 1520-1535 and the cloud is not needed to run the services. Furthermore, because the systems 1520-1535 can run independently of the cloud (e.g., implement their services independently) even if a network 1515 fails or encounters an error that prevents communication between the cloud and the systems 1520-1535, the systems can continue operation without interruption. Furthermore, by balancing computation between the cloud and the systems 1520-1535, power usage can be balanced more effectively. Furthermore, the system of FIG. 15 has the ability to scale (e.g., grow or shrink) the functionality/services provided on edge devices based on capabilities of edge hardware onto which edge system is being implemented.

Figure 16:
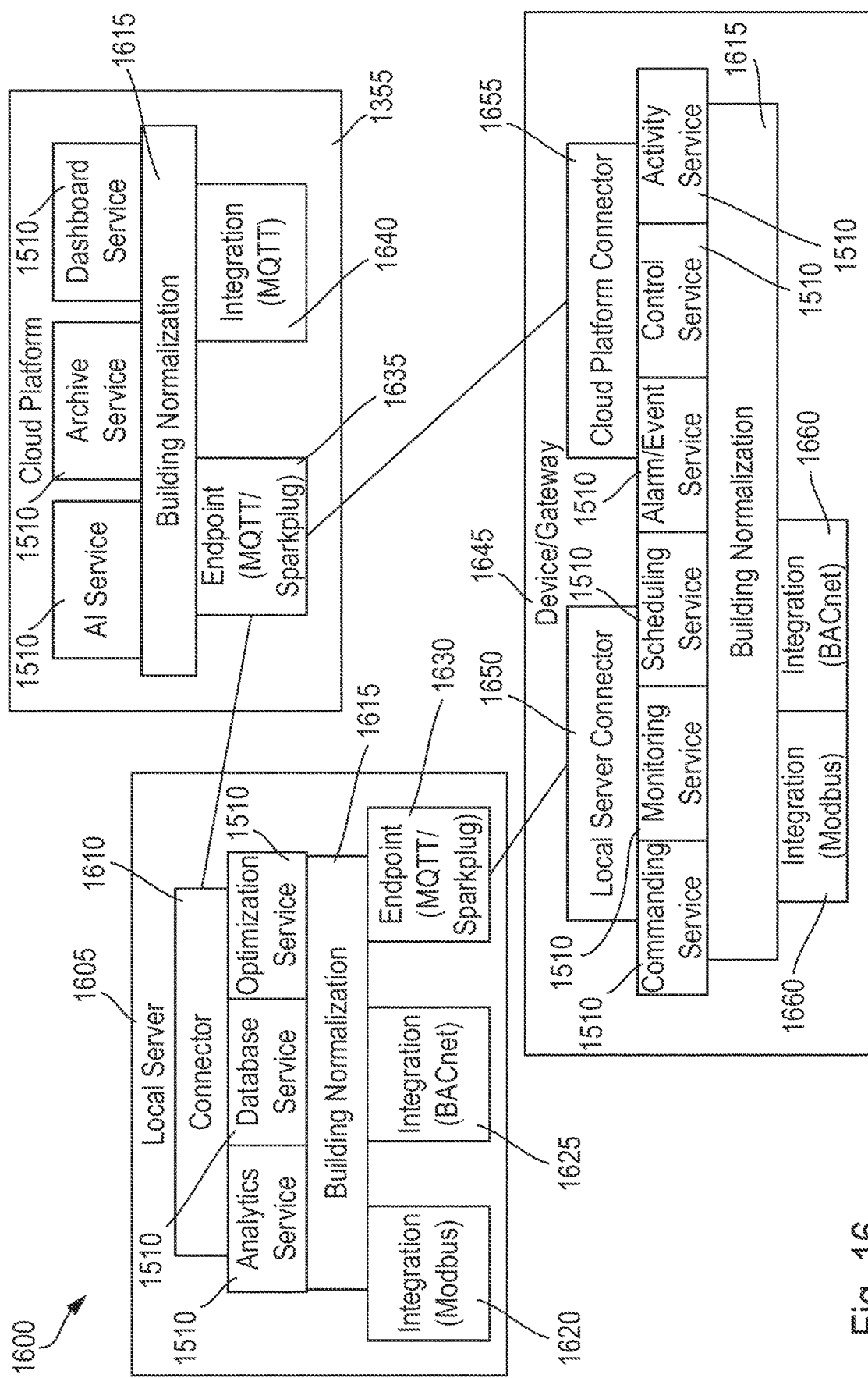
FIG. 16 is a block diagram of components of an edge platform, including a connector, a building normalization layer, services, and integrations distributed across various computing devices of a building, according to an exemplary embodiment.

Referring now to FIG. 16, a system 1600 where connectors, building normalization layers, services, and integrations are distributed across various computing devices of a building is shown, according to an exemplary embodiment. In the system 1600, the cloud platform 1355, a local server 1605, and a device/gateway 1645 run components of the edge platform 1305, e.g., connectors, building normalization layers, services, and integrations. The local server 1605 can be a server system located within a building. The device/gateway 1645 could be a building device located within the building. For example, the device/gateway 1645 could be a smart thermostat, a surveillance camera, an access control system, etc. The device gateway 720 can be a dedicated gateway box. The building device may be a physical building device, and may include a memory device (e.g., a flash memory, a RAM, a ROM, etc.). The memory of the physical building device can store one or more data samples, which may be any data related to the operation of the physical building device. For example, if the building device is a smart thermostat, the data samples can be timestamped, temperature readings.

The local server 1605 can include a connector 1610, services 1510, a building normalization layer 1615, and integrations 1620-1630. These components of the local server 1605 can be deployed to the local server 1605, e.g., from the cloud platform 1355. These components may further be dynamically moved to various other devices of the building. The connector 1610 may be the connector described with reference to FIG. 13 that includes the connectivity manager 1310, the device manager 1315, and/or the device identity manager 1320. The connector 1610 can connect the local server 1605 with the cloud platform 1355. For example, the connector 1610 may enable communication with an endpoint of the cloud platform 1355, e.g., the endpoint 1635 which could be an MQTT endpoint or a Sparkplug endpoint.

The building normalization layer 1615 can be a software component that runs the integrations 1620-1630 and/or the analytics 1510. The building normalization layer 1615 can be configured to allow for a variety of different integrations and/or analytics to be deployed to the local server 1605. The building normalization layer 1615 could allow for any service of the service catalog 1505 to run on the local server 1605. Furthermore, the building normalization layer 1615 can relocate, or allow for relocation, of services and/or integrations across the cloud platform 1355, the local server 1605, and/or the device/gateway 1645. The services 1510 are relocatable based on processing power of the local server 1605, based on communication bandwidth, available data, etc. The services can be moved from one device to another in the system 1600 such that the requirements for the service are met appropriately.

Furthermore, instances of the integrations 1620-1630 can be relocatable and/or deployable. The integrations 1620-1630 may be instantiated on devices of the system 1600 based on the requirements of the devices, e.g., whether the local server 1605 needs to communicate with a particular device (e.g., the Modbus integration 1620 could be deployed to the local server 1605 responsive to a detection that the local server 1605 needs to communicate with a Modbus device). The locations of the integrations can be limited by the physical protocols that each device is capable of implementing and/or security limitations of each device.

The deployment and/or movement of services and/or integrations can be done manually and/or in an automated manner. For example, when a building site is commissioned, a user could manually select, e.g., via a user interface on a user device (e.g., smartphone, tablet, laptop, desktop computer, etc.), the devices of the system 1600 where each service and/or integration should run. Instead of having a user select the locations, a system, e.g., the cloud platform 1355, could deploy services and/or integrations to the devices of the system 1600 automatically based on the ideal locations for each of multiple different services and/or integrations.

An orchestrator (e.g., run on instances of the building normalization layer 1615 or in the cloud platform 1355) or a service and/or integration itself could determine that a particular service and/or integration should move from one device to another device after deployment. As the devices of the system 1600 change, e.g., more or less services are run, hard drives can become filled with data, physical building devices are moved, installed, and/or uninstalled, the available data, bandwidth, computing resources, and/or memory resources may change. The services and/or integrations can be moved from a first device to a second more appropriate device responsive to a detection that the first device is not meeting the requirements of the service and/or integration.

As an example, an energy efficiency model service could be deployed to the system 1600. For example, a user may request that an energy efficiency model service run in their building. Alternatively, a system may identify that an energy efficiency model service would improve the performance of the building and automatically deploy the service. The energy efficiency model service may have requirements. For example, the energy efficiency model may have a high data throughput requirement, a requirement for access to weather data, a high requirement for data storage to store historical data needed to make inferences, etc. A rules engine with rules could define whether services get pushed around to other devices, whether model goes back to the cloud for more training, whether an upgrade is needed to implement an increase in points, etc.

As another example, a historian service may manage a log of historical building data collected for a building, e.g., store a record of historical temperature measurements of a building, store a record of building occupant counts, store a record of operational control decisions (e.g., setpoints, static pressure setpoints, fan speeds, etc.), etc. One or more other services may depend on the historian, for example, the one or more other services may consume historical data recorded by the historian. Other services can be relocated along with the historian service such that the other services can operate on the historian data. For example, an occupancy prediction service may need a historical log of occupancy record by the historian service to run. Instead of having the occupancy prediction service and the historian run on the same physical device, a particular integrations between the two devices that the historian service and the occupancy prediction service run on could be established such that occupancy data of the historian service can be provided from the historian service to the occupancy prediction service.

This portability of services and/or integrations removes dependencies between hardware and software. Allowing services and/or integrations to move from one device to another device can keep services running continuously even if the run on a variety of locations. This decouples software from hardware.

The building normalization layer 1615 can facilitate auto discovery of devices and/or perform auto configuration. The building normalization layer 1615 can include the mapping service 1510. The building normalization 1615 of the cloud platform 1355 performs the auto discovery. Responsive to detecting a new device connected to the local server 1605, e.g., a new device of the building equipment 110, the building normalization can identify points of the new device, e.g., identify measurement points, control points, etc. The building normalization layer 1615 performs a discovery process where strings, tags, or other metadata is analyzed to identify each point. The discovery can be the discovery process described with reference to FIGS. 1-12. A discovery process is discussed in U.S. patent application Ser. No. 16/885,959 filed May 28, 2020, U.S. patent application Ser. No. 16/885,968 filed May 28, 2020, U.S. patent application Ser. No. 16/722,439 filed Dec. 20, 2019 (now U.S. Pat. No. 10,831,163), and U.S. patent application Ser. No. 16/663,623 filed Oct. 25, 2019, which are incorporated by reference herein in their entireties.

The cloud platform 1355 can perform a site survey of all devices of a site or multiple sites. For example, the cloud platform 1355 could identify all devices installed in the system 1600. Furthermore, the cloud platform 1355 could perform discovery for any devices that are not recognized. The result of the discovery of a device could be a configuration for the device, for example, indications of points to collect data from and/or send commands to. The cloud platform 1355 can distribute a copy of the configuration for the device to all of the instances of the building normalization layer 1615. The copy of the configuration can be distributed to other buildings different from the building that the device was discovered at. In this regard, responsive to a similar device type being installed somewhere else, e.g., in the same building, in a different building, at a different campus, etc. the instance of the building normalization can select the copy of the device configuration and implement the device configuration for the device.

Similarly, if the instance of the building normalization detects a new device that is not recognized, the building normalization could perform a discovery process for the new device and distribute the configuration for the new device to other instances of the building normalization. In this regard, each building normalization instance can implement learning by discovering new devices and injecting device configurations into a device catalog stored and distributed across each building normalization instance.

The device catalog can store names of every data point of every device. The services that operate on the data points can consume the data points based on the indications of the data points in the device catalog. Furthermore, the integrations may collect data from data points and/or send actions to the data points based on the naming of the device catalog. The various building normalization and synchronize the device catalogs they store. For example, changes to one device catalog can be distributed to other building normalizations. If a point name was changed for a device, this change could be distributed across all building normalizations through the device catalog synchronization such that there are no disruptions to the services that consume the point.

The analytics service 1510 may be a service that generates one or more analytics based on building data received from a building device, e.g., directly from the building device or through a gateway that communicates with the building device, e.g., from the device/gateway 1645. The analytics service 1510 can be configured to generate an analytics data based on the building data such as a carbon emissions metric, an energy consumption metric, a comfort score, a health score, etc. The database service 1510 can operate to store building data, e.g., building data collected from the device/gateway 1645. The analytics service 1510 may operate against historical data stored in the database service 1510. The analytics service 1510 may have a requirement that the analytics service 1510 is implemented with access to a database service 1510 that stores historical data. In this regard, the analytics service 1510 can be deployed to, or relocated to a device including an instantiation of the database service 1510. The database service 1510 could be deployed to the local server 1605 responsive to determining that the analytics service 1510 requires the database service 1510 to run.

The optimization service 1510 can be a service that operates to implement an optimization of one or more variables based on one or more constraints. The optimization service 1510 could implement optimization for allocating loads, making control decisions, improving energy usage and/or occupant comfort etc. The optimization performed by the optimization service 1510 could be the optimization described in U.S. patent application Ser. No. 17/542,184 filed Dec. 3, 2021, which is incorporated by reference herein.

The Modbus integration 1620 can be a software component that enables the local server 1605 to collect building data for data points of building devices that operate with a Modbus protocol. Furthermore, the Modbus integration 1620 can enable the local server 1605 to communicate data, e.g., operating parameters, setpoints, load allocations, etc. to the building device. The communicated data may be control decisions determined by the optimization service 1510.

Similarly, the BACnet integration 1625 can enable the local server 1605 to communicate with one or more BACnet based devices, e.g., send data to, or receive data from, the BACnet based devices. The endpoint 1630 could be an endpoint for MQTT and/or Sparkplug. The element 1630 can be a software service including an endpoint and/or a layer for implementing MQTT and/or Sparkplug communication. In the system 1600, the endpoint 1630 can be used for communicating by the local server 1605 with the device/gateway 1645.

The cloud platform 1355 can include an artificial intelligence (AI) service 1510, an archive service 1510, and/or a dashboard service 1510. The AI service 1510 can run one or more artificial intelligence operations, e.g., inferring information, performing autonomous control of the building, etc. The archive service 1510 may archive building data received from the device/gateway 1645 (e.g., collected point data). The archive service 1510 may store control decisions made by another service, e.g., the AI service 1510, the optimization service 1510, etc. The dashboard service 1510 can be configured to provide a user interface to a user with analytic results, e.g., generated by the analytics service 1510, command interfaces, etc. The cloud platform 1355 is further shown to include the building normalization 1615, which may be an instance of the building normalization layer 1615.

The cloud platform 1355 further includes an endpoint 1635 for communicating with the local server 1605 and/or the device/gateway 1645. The cloud platform 1355 may include an integration 1640, e.g., an MQTT integration supporting MQTT based communication with MQTT devices.

The device/gateway 1645 can include a local server connector 1650 and a cloud platform connector 1655. The cloud platform connector 1655 can connect the device/gateway 1645 with the cloud platform 1355. The local server connector 1650 can connect the device/gateway 1645 with the local server 1605. The device/gateway 1645 includes a commanding service 1510 configured to implement commands for devices of the building equipment 110 (e.g., the device/gateway 1645 itself or another device connected to the device/gateway 1645). The monitoring service 1510 can be configured to monitor operation of the devices of the building equipment 110, the scheduling service 1510 can implement scheduling for a space or asset, the alarm/event service 1510 can generate alarms and/or events when specific rules are tripped based on the device data, the control service 1510 can implement a control algorithm and/or application for the devices of the building equipment 110, and/or the activity service 1510 can implement a particular activity for the devices of the building equipment 110.

The device/gateway 1645 further includes a building normalization 1615. The building normalization 1615 may be an instance of the building normalization layer 1615. The device/gateway 1645 may further include integrations 1660-1665. The integration 1660 may be a Modbus integration for communicating with a Modbus device. The integration 1665 may be a BACnet integration for communicating with BACnet devices.

The construction and arrangement of the systems and methods as shown in the various exemplary embodiments are illustrative only. Although only a few embodiments have been described in detail in this disclosure, many modifications are possible (e.g., variations in sizes, dimensions, structures, shapes and proportions of the various elements, values of parameters, mounting arrangements, use of materials, colors, orientations, etc.). For example, the position of elements may be reversed or otherwise varied and the nature or number of discrete elements or positions may be altered or varied. Accordingly, all such modifications are intended to be included within the scope of the present disclosure. The order or sequence of any process or method steps may be varied or re-sequenced according to alternative embodiments. Other substitutions, modifications, changes, and omissions may be made in the design, operating conditions and arrangement of the exemplary embodiments without departing from the scope of the present disclosure.

The present disclosure contemplates methods, systems and program products on any machine-readable media for accomplishing various operations. The embodiments of the present disclosure may be implemented using existing computer processors, or by a special purpose computer processor for an appropriate system, incorporated for this or another purpose, or by a hardwired system. Embodiments within the scope of the present disclosure include program products comprising machine-readable media for carrying or having machine-executable instructions or data structures stored thereon. Such machine-readable media can be any available media that can be accessed by a general purpose or special purpose computer or other machine with a processor. By way of example, such machine-readable media can comprise RAM, ROM, EPROM, EEPROM, CD-ROM or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. When information is transferred or provided over a network or another communications connection (either hardwired, wireless, or a combination of hardwired or wireless) to a machine, the machine properly views the connection as a machine-readable medium. Thus, any such connection is properly termed a machine-readable medium. Combinations of the above are also included within the scope of machine-readable media. Machine-executable instructions include, for example, instructions and data which cause a general purpose computer, special purpose computer, or special purpose processing machines to perform a certain function or group of functions.

Although the figures show a specific order of method steps, the order of the steps may differ from what is depicted. Also two or more steps may be performed concurrently or with partial concurrence. Such variation will depend on the software and hardware systems chosen and on designer choice. All such variations are within the scope of the disclosure. Likewise, software implementations could be accomplished with standard programming techniques with rule based logic and other logic to accomplish the various connection steps, processing steps, comparison steps and decision steps.

In various implementations, the steps and operations described herein may be performed on one processor or in a combination of two or more processors. For example, in some implementations, the various operations could be performed in a central server or set of central servers configured to receive data from one or more devices (e.g., edge computing devices/controllers) and perform the operations. In some implementations, the operations may be performed by one or more local controllers or computing devices (e.g., edge devices), such as controllers dedicated to and/or located within a particular building or portion of a building. In some implementations, the operations may be performed by a combination of one or more central or offsite computing devices/servers and one or more local controllers/computing devices. All such implementations are contemplated within the scope of the present disclosure. Further, unless otherwise indicated, when the present disclosure refers to one or more computer-readable storage media and/or one or more controllers, such computer-readable storage media and/or one or more controllers may be implemented as one or more central servers, one or more local controllers or computing devices (e.g., edge devices), any combination thereof, or any other combination of storage media and/or controllers regardless of the location of such devices.

What is claimed:

1. A system located in a building, the system comprising:
a processing circuit configured to:
receive a plurality of tags describing a plurality of points of a piece of building equipment, the piece of building equipment connected to the system;
generate an embedding of a tag of the plurality of tags;
generate a plurality of embeddings of a plurality of classes of a schema of a graph data structure;
generate a plurality of similarities between the embedding of the tag of the plurality of tags and the plurality of embeddings of the plurality of classes of the schema of the graph data structure;
select a class of the plurality of classes based on the plurality of similarities;
map the plurality of tags to the plurality of classes of the schema of the graph data structure, wherein the tag is mapped to the class responsive to the selection;
perform machine learning clustering to generate clusters of the plurality of points based on features of the plurality of points;
identify, based on the clusters, a plurality of relationships in the schema of the graph data structure between the plurality of tags mapped to the plurality of classes of the schema of the graph data structure; and
communicate data to a second system based at least in part on the plurality of tags mapped to the plurality of classes and the plurality of relationships.

2. The system of claim 1, wherein the processing circuit is configured to:
construct the graph data structure in the schema based on the plurality of tags mapped to the plurality of classes and the plurality of relationships in the schema of the graph data structure; and
communicate at least a portion of the graph data structure to the second system.

3. The system of claim 1, wherein the processing circuit is configured to:
communicate indications of the plurality of classes that the plurality of tags are mapped to and indications of the plurality of relationships to the second system.

4. The system of claim 1, wherein the processing circuit is configured to:
receive telemetry data from the piece of building equipment; and
transmit the telemetry data to the system based at least in part on the plurality of tags mapped to the plurality of classes and the plurality of relationships.

5. The system of claim 1, wherein the processing circuit is configured to:
receive one or more software components from the system, the one or more software components configured to cause the system to operate as a gateway for the piece of building equipment and cause the system to:
receive and execute a service, the service configured to:
map the plurality of tags to the plurality of classes; and
identify, based on the clusters, the plurality of relationships;
receive telemetry data from the piece of building equipment; and
communicate the telemetry data to the system based at least in part on the plurality of tags mapped to the plurality of classes and the plurality of relationships.

6. The system of claim 1, wherein the processing circuit is configured to:
receive a building layout of the building;
identify a plurality of spaces of the building based on the building layout;
perform the machine learning clustering by:
setting a plurality of centroids based on the plurality of spaces;
clustering the plurality of points based on the plurality of centroids; and
identifying a plurality of spatial relationships of the plurality of relationships in the schema of the graph data structure based on the clustering of the plurality of points.

7. The system of claim 1, wherein the processing circuit is configured to:
receive timeseries data for the plurality of points;
analyze the timeseries data to identify a behavior between a first point of the plurality of points and a second point of the plurality of points; and
identify a functional relationship of the plurality of relationships between a first tag representing the first point and a second tag representing the second point responsive to identifying the behavior between the first point and the second point.

8. The system of claim 1, wherein the processing circuit is configured to:
perform a first clustering to cluster the plurality of points based on characteristics of the plurality of points;
perform a second clustering to cluster the plurality of points based on at least one building layout of at least one building;
merge a result of the first clustering and the second clustering; and
identify the plurality of relationships of the schema of the graph data structure based on the result.

9. The system of claim 1, wherein the processing circuit is configured to:
generate an embedding vector of the tag of the plurality of tags;
generate a plurality of embedding vectors of the plurality of classes of the schema of the graph data structure;
generate a plurality of similarity levels based on angles formed between the embedding vector of the tag and the plurality of embedding vectors of the plurality of classes of the schema of the graph data structure;
select the class of the plurality of classes based on the plurality of similarity levels; and
map the tag to the class responsive to the selection of the class.

10. The system of claim 1, wherein the processing circuit is configured to:
receive an indication that similarities between the embedding of the tag of the plurality of tags and embeddings of the plurality of classes of the schema of the graph data structure are less than a threshold;
receive timeseries data for a point represented by the tag of the plurality of tags; and
determine an order to process the timeseries data with a first model and a second model, the first model outputting a first probability of the point being mapped to a first class of the plurality of classes; and the second model outputting a second probability of the point being mapped to a second class of the plurality of classes, the order indicating to process the timeseries data with the first model and then the second model responsive to an identification of a first similarity between the embedding of the tag of the plurality of tags and a first embedding of the first class being greater than the embedding of the tag of the plurality of tags and a second embedding of the second class; and process the timeseries data with the first model and then the second model.

11. The system of claim 1, wherein the processing circuit is configured to:

receive point data describing the plurality of points;

execute a plurality of models to map the plurality of points to the plurality of tags;

map the plurality of tags to the plurality of classes of the schema of the graph data structure; and identify the plurality of relationships responsive to mapping the plurality of points to the plurality of tags.

12. The system of claim 1, wherein the processing circuit is configured to construct the graph data structure by:

generating, based on mappings between the plurality of tags and the plurality of classes, a plurality of nodes for the graph data structure, wherein:

a first node of the plurality of nodes is generated in a first class of the plurality of classes to represent a first tag of the plurality of tags mapped to the first class; and a second node of the plurality of nodes is generated in a second class of the plurality of classes to represent a second tag of the plurality of tags mapped to the second class; and generating an edge between the first node and the second node to represent a relationship of the plurality of relationships.

13. A method, comprising:

receiving, by one or more processing circuits of a system located in a building, a plurality of tags describing a plurality of points of a piece of building equipment, the piece of building equipment connected to the system;

generating, by the one or more processing circuits, an embedding of a tag of the plurality of tags;

generating, by the one or more processing circuits, a plurality of embeddings of a plurality of classes of a schema of a graph data structure;

generating, by the one or more processing circuits, a plurality of similarities between the embedding of the tag of the plurality of tags and the plurality of embeddings of the plurality of classes of the schema of the graph data structure;

selecting, by the one or more processing circuits, a class of the plurality of classes based on the plurality of similarities;

mapping, by the one or more processing circuits, the plurality of tags to the plurality of classes of the schema of the graph data structure, wherein the tag is mapped to the class responsive to the selection;

performing, by the one or more processing circuits, machine learning clustering to generate clusters of the plurality of points based on features of the plurality of points;

identifying, by the one or more processing circuits, based on the clusters, a plurality of relationships in the schema of the graph data structure between the plurality of tags mapped to the plurality of classes of the schema of the graph data structure; and communicating, by the one or more processing circuits, data to a second system based at least in part on the plurality of tags mapped to the plurality of classes and the plurality of relationships.

14. The method of claim 13, comprising:

constructing, by the one or more processing circuits, the graph data structure in the schema based on the plurality of tags mapped to the plurality of classes and the plurality of relationships in the schema of the graph data structure; and communicating, by the one or more processing circuits, at least a portion of the graph data structure to the second system.

15. The method of claim 13, comprising:

communicating, by the one or more processing circuits, indications of the plurality of classes that the plurality of tags are mapped to and indications of the plurality of relationships to the second system.

16. The method of claim 13, comprising:

receiving, by the one or more processing circuits, telemetry data from the piece of building equipment; and transmitting, by the one or more processing circuits, the telemetry data to the second system based at least in part on the plurality of tags mapped to the plurality of classes and the plurality of relationships.

17. The method of claim 13, comprising:

receiving, by the one or more processing circuits, one or more software components from the system, the one or more software components configured to cause the system to operate as a gateway for the piece of building equipment and cause the system to:

receive and execute a service, the service configured to:
map the plurality of tags to the plurality of classes; and
identify, based on the clusters, the plurality of relationships;

receiving, by the one or more processing circuits, telemetry data from the piece of building equipment; and communicating, by the one or more processing circuits, the telemetry data to the system based at least in part on the plurality of tags mapped to the plurality of classes and the plurality of relationships.

18. The method of claim 13, comprising:

receiving, by the one or more processing circuits, an indication that similarities between the embedding of the tag of the plurality of tags and embeddings of the plurality of classes of the schema of the graph data structure are less than a threshold;

receiving, by the one or more processing circuits, timeseries data for a point represented by the tag of the plurality of tags; and determining, by the one or more processing circuits, an order to process the timeseries data with a first model and a second model, the first model outputting a first probability of the point being mapped to a first class of the plurality of classes; and the second model outputting a second probability of the point being mapped to a second class of the plurality of classes, the order indicating to process the timeseries data with the first model and then the second model responsive to an identification of a first similarity between the embedding of the tag of the plurality of tags and a first embedding of the first class being greater than the embedding of the tag of the plurality of tags and a second embedding of the second class; and processing, by the one or more processing circuits, the timeseries data with the first model and then the second model.

19. A gateway of a building, the gateway comprising:

a processing circuit configured to:
   receive a plurality of tags describing a plurality of points of a piece of building equipment, the piece of building equipment connected to the gateway;
   generate an embedding of a tag of the plurality of tags;
   generate a plurality of embeddings of a plurality of classes of a schema of a graph data structure;
   generate a plurality of similarities between the embedding of the tag of the plurality of tags and the plurality of embeddings of the plurality of classes of the schema of the graph data structure;
   select a class of the plurality of classes based on the plurality of similarities;
   map the plurality of tags to the plurality of classes of the schema of the graph data structure, wherein the tag is mapped to the class responsive to the selection;
   perform machine learning clustering to generate clusters of the plurality of points based on features of the plurality of points;
   identify, based on the clusters, a plurality of relationships in the schema of the graph data structure between the plurality of tags mapped to the plurality of classes of the schema of the graph data structure; and
   communicate data to a system based at least in part on the plurality of tags mapped to the plurality of classes and the plurality of relationships.

20. The gateway of claim 19, wherein the processing circuit is configured to:
   construct the graph data structure in the schema based on the plurality of tags mapped to the plurality of classes and the plurality of relationships in the schema of the graph data structure; and
   communicate at least a portion of the graph data structure to the second system.

\* \* \* \* \*